United States Patent
Yamada et al.

(10) Patent No.: US 8,952,357 B2
(45) Date of Patent: Feb. 10, 2015

(54) CYTOCHROME C552 COLOR IMAGING ELEMENT AND METHOD OF MANUFACTURING THE SAME, CYTOCHROME C552 PHOTOSENSOR AND METHOD OF MANUFACTURING THE SAME, CYTOCHROME C552 PHOTOELECTRIC TRANSDUCER AND METHOD OF MANUFACTURING THE SAME, AND CYTOCHROME C552 ELECTRONIC DEVICE

(75) Inventors: Seiji Yamada, Kanagawa (JP); Yuichi Tokita, Kanagawa (JP); Yoshio Goto, Kanagawa (JP); Wei Luo, Kanagawa (JP); Daisuke Yamaguchi, Kanagawa (JP); Daisuke Ito, Kanagawa (JP); Jusuke Shimura, Kanagawa (JP)

(73) Assignee: Sony Corporation, Tokyo (JP)

(*) Notice: Subject to any disclaimer, the term of this patent is extended or adjusted under 35 U.S.C. 154(b) by 568 days.

(21) Appl. No.: 13/148,548

(22) PCT Filed: Feb. 8, 2010

(86) PCT No.: PCT/JP2010/051817
§ 371 (c)(1),
(2), (4) Date: Aug. 9, 2011

(87) PCT Pub. No.: WO2010/095532
PCT Pub. Date: Aug. 26, 2010

(65) Prior Publication Data
US 2012/0012823 A1 Jan. 19, 2012

(30) Foreign Application Priority Data
Feb. 17, 2009 (JP) ................. 2009-033890

(51) Int. Cl.
*H01L 29/08* (2006.01)
*H01L 51/00* (2006.01)
(Continued)

(52) U.S. Cl.
CPC ............. *H01L 51/0093* (2013.01); *B82Y 10/00* (2013.01); *G01J 1/58* (2013.01);
(Continued)

(58) Field of Classification Search
USPC ............. 530/401; 428/478, 459; 438/1; 257/E51.026, 40
See application file for complete search history.

(56) References Cited

U.S. PATENT DOCUMENTS 5,670,827 A * 9/1997 Sakuma et al. ............. 257/741
5,707,845 A * 1/1998 Ueyama et al. ............ 435/189
(Continued)

FOREIGN PATENT DOCUMENTS

EP 1821324 A2 8/2007
JP HEI 03-237769 10/1991
(Continued)

OTHER PUBLICATIONS

Bernad et al., "Kinetics of the electron transfer reaction of Cytochrome c552 absorbed on biomimetic electrode studied by time-resolved surface-enhanced resonance Raman spectroscopy and electrochemistry", European Biophysics Journal, Jun. 2007, pp. 1039-1048, vol. 36, No. 8.

(Continued)

*Primary Examiner* — Caleb Henry
(74) *Attorney, Agent, or Firm* — K&L Gates LLP

(57) ABSTRACT

A color imaging element, a photosensor and a photoelectric transducer which use a protein and are capable of being stably used for a long time, and methods of manufacturing them are provided. A zinc-substituted cytochrome c552 is immobilized on a gold electrode with a self-assembled monolayer in between to form a blue-light photoelectric transducer. Alternatively, a cytochrome c552 is immobilized on a gold electrode with a self-assembled monolayer in between, and a fluorescent protein absorbing blue light is bonded to the cytochrome c552, thereby forming a blue-light photoelectric transducer. These photoelectric transducers each are used as a color imaging element or a blue-light photoelectric transducer of a photosensor.

7 Claims, 48 Drawing Sheets

(51) Int. Cl.
*B82Y 10/00* (2011.01)
*G01J 1/58* (2006.01)
*H01L 27/30* (2006.01)
*H01L 51/42* (2006.01)

(52) U.S. Cl.
CPC ....... *H01L 51/0012* (2013.01); *H01L 51/0098* (2013.01); *H01L 27/307* (2013.01); *H01L 51/0051* (2013.01); *H01L 51/0083* (2013.01); *H01L 51/0092* (2013.01); *H01L 51/42* (2013.01)
USPC .......................................................... 257/40

(56) References Cited

U.S. PATENT DOCUMENTS

| | | | |
|---|---|---|---|
| 6,212,093 B1* | 4/2001 | Lindsey | 365/151 |
| 6,272,038 B1* | 8/2001 | Clausen et al. | 365/151 |
| 6,324,091 B1* | 11/2001 | Gryko et al. | 365/151 |
| 6,400,489 B1* | 6/2002 | Suzuki et al. | 359/241 |
| 6,706,962 B2* | 3/2004 | Nelles et al. | 136/263 |
| 6,914,276 B2* | 7/2005 | Oda et al. | 257/212 |
| 6,998,285 B2* | 2/2006 | Ramm et al. | 438/48 |
| 7,042,755 B1* | 5/2006 | Bocian et al. | 365/151 |
| 7,196,364 B2* | 3/2007 | Oda | 257/212 |
| 7,282,636 B2* | 10/2007 | Funaoka et al. | 136/263 |
| 7,312,507 B2* | 12/2007 | Tomita | 257/436 |
| 7,332,782 B2* | 2/2008 | Tomita | 257/431 |
| 7,332,785 B2* | 2/2008 | Tomita | 257/436 |
| 7,422,922 B2* | 9/2008 | Morooka et al. | 438/63 |
| 7,517,144 B2* | 4/2009 | Miteva et al. | 374/121 |
| 7,629,606 B2* | 12/2009 | Matsui | 257/40 |
| 7,633,045 B2* | 12/2009 | Endoh et al. | 250/216 |
| 7,750,343 B2* | 7/2010 | Choi et al. | 257/40 |
| 7,820,471 B2* | 10/2010 | Ishibashi et al. | 438/63 |
| 7,880,082 B2* | 2/2011 | Morooka et al. | 136/263 |
| 7,884,281 B2* | 2/2011 | Enomoto et al. | 136/263 |
| 7,884,357 B2* | 2/2011 | Myung-Seok et al. | 257/40 |
| 7,929,200 B2* | 4/2011 | Miteva et al. | 359/326 |
| 8,018,426 B2* | 9/2011 | Ishibashi et al. | 345/102 |
| 8,035,185 B2* | 10/2011 | Suzuki et al. | 257/453 |
| 8,148,795 B2* | 4/2012 | Morooka et al. | 257/433 |
| 8,149,356 B2* | 4/2012 | Ogasawara et al. | 349/104 |
| 8,168,781 B2* | 5/2012 | Kitamura et al. | 540/145 |
| 8,178,872 B2* | 5/2012 | Tokita et al. | 257/40 |
| 8,253,885 B2* | 8/2012 | Maeda et al. | 349/64 |
| 8,492,057 B2* | 7/2013 | Takakuwa et al. | 430/7 |
| 8,512,875 B2* | 8/2013 | Kawamura et al. | 428/690 |
| 8,541,086 B2* | 9/2013 | Oyamada et al. | 428/64.1 |
| 8,546,684 B2* | 10/2013 | Nojima et al. | 136/256 |
| 8,563,854 B2* | 10/2013 | Imoto et al. | 136/263 |
| 2001/0007649 A1* | 7/2001 | Inagaki | 423/352 |
| 2004/0094818 A1* | 5/2004 | Oda et al. | 257/458 |
| 2005/0016578 A1* | 1/2005 | Enomoto et al. | 136/243 |
| 2005/0218467 A1* | 10/2005 | Tomita | 257/431 |
| 2006/0048812 A1* | 3/2006 | Tomita | 136/258 |
| 2006/0051617 A1* | 3/2006 | Ishibashi et al. | 428/690 |
| 2006/0112988 A1* | 6/2006 | Morooka | 136/256 |
| 2006/0185717 A1* | 8/2006 | Ishibashi et al. | 136/252 |
| 2006/0197170 A1* | 9/2006 | Tomita | 257/432 |
| 2007/0071064 A1* | 3/2007 | Miteva et al. | 374/121 |
| 2007/0175510 A1* | 8/2007 | Morooka et al. | 136/263 |
| 2007/0284761 A1* | 12/2007 | Morooka et al. | 257/792 |
| 2008/0000525 A1* | 1/2008 | Shimura et al. | 136/256 |
| 2008/0012010 A1* | 1/2008 | Myung-Seok et al. | 257/40 |
| 2008/0083452 A1* | 4/2008 | Morooka et al. | 136/252 |
| 2008/0108832 A1* | 5/2008 | Yabunouchi et al. | 549/59 |
| 2008/0160432 A1* | 7/2008 | Byon et al. | 430/7 |
| 2008/0265149 A1* | 10/2008 | Endoh et al. | 250/237 R |
| 2008/0268354 A1* | 10/2008 | Suzuki | 430/7 |
| 2009/0007961 A1* | 1/2009 | Morooka | 136/256 |
| 2009/0014070 A1* | 1/2009 | Blyth et al. | 136/263 |
| 2009/0053626 A1* | 2/2009 | Takakuwa et al. | 430/7 |
| 2009/0078315 A1* | 3/2009 | Suzuki et al. | 136/256 |
| 2009/0217979 A1* | 9/2009 | Yoneya et al. | 136/258 |
| 2009/0290211 A1* | 11/2009 | Miteva et al. | 359/326 |
| 2010/0008394 A1* | 1/2010 | Miteva et al. | 374/1 |
| 2010/0101648 A1* | 4/2010 | Morooka et al. | 136/261 |
| 2010/0108135 A1* | 5/2010 | Morooka et al. | 136/256 |
| 2010/0116340 A1* | 5/2010 | Yoneya et al. | 136/261 |
| 2010/0239965 A1* | 9/2010 | Takakuwa et al. | 430/7 |
| 2010/0264404 A1* | 10/2010 | Myung-Seok et al. | 257/40 |
| 2010/0264409 A1* | 10/2010 | Tokita et al. | 257/40 |
| 2010/0269892 A1* | 10/2010 | Yoneya et al. | 136/252 |
| 2010/0275979 A1* | 11/2010 | Maruyama | 136/252 |
| 2011/0130550 A1* | 6/2011 | Hayashi et al. | 530/401 |
| 2011/0243849 A1* | 10/2011 | Marletta et al. | 424/9.1 |
| 2012/0012823 A1* | 1/2012 | Yamada et al. | 257/40 |
| 2012/0141831 A1* | 6/2012 | Luo et al. | 428/704 |

FOREIGN PATENT DOCUMENTS

| | | |
|---|---|---|
| JP | HEI 03-252530 | 11/1991 |
| JP | HEI 05-075096 | 3/1993 |
| JP | HEI 06-291303 | 10/1994 |
| JP | 2007-220445 | 8/2007 |
| JP | 2009-021501 | 1/2009 |
| JP | 2010-145216 | 7/2010 |

OTHER PUBLICATIONS

European Search Report issued Dec. 21, 2012 for corresponding European Appln. No. 10743659.4.

Choi et al., "Molecular-scale biophotodiode consisting of a green fluorescent proteinlcytochrome c self-assembled heterolayer", Applied Physics Letters, Mar. 22, 2004, pp. 2187-2189, vol. 84, No. 12.

Fee et al., "Integrity of Thermus thermophilus cytochrome C552 synthesized by *Escherichia coli* cells expressing the host-specific cytochrome c maturation genes, ccmABCDEFGH: Biochemical, spectral, and structural characterization of the recombinant protein", Protein Science, 2000, pp. 2074-2084.

Nakajima et al., "Novel Light-Illumination Scanning Tunneling Microscopy Equipped with Optical Fiber Probe", Jpn. J. Appl. Phys., 2003, pp. 4861-4865, vol. 42.

Vanderkool et al., "Metallocytochromes c: Characterization of Electronic Absorption and Emission Spectra of Sn4+ and Zn2+ Cytochromes c", Eur. J. Biochem., 1976, pp. 381-387.

Japanese Office Action issued Oct. 8, 2013 for corresponding Japanese Appln. No. 2009-033890.

* cited by examiner

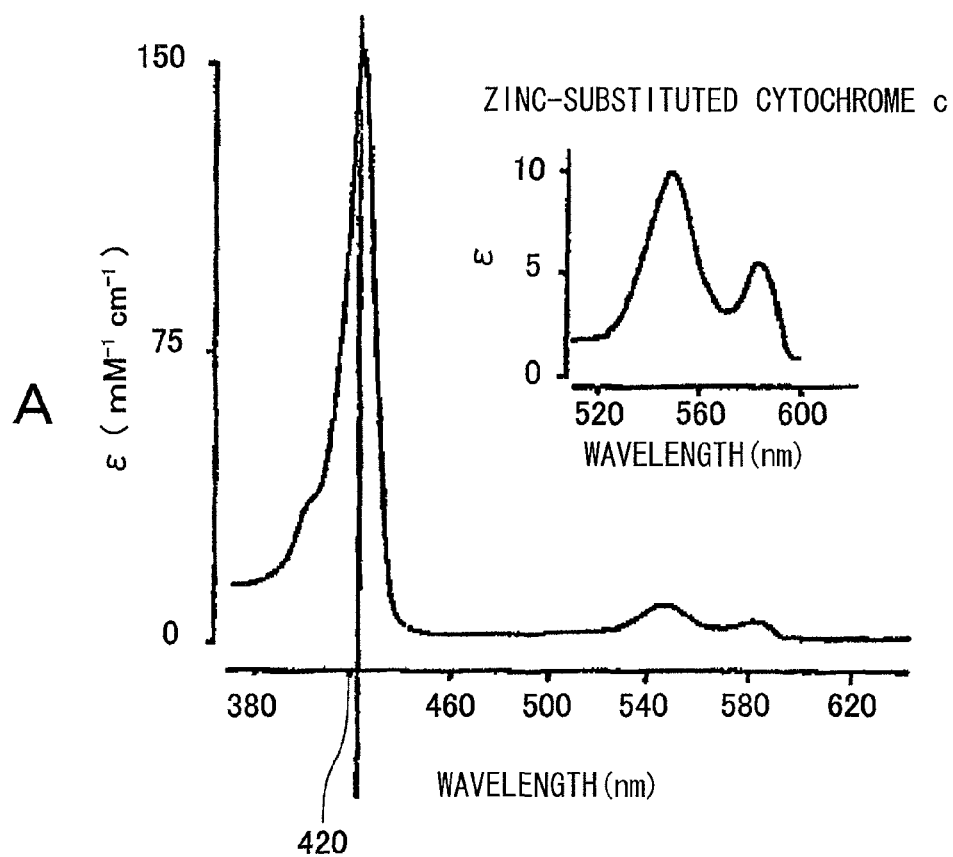
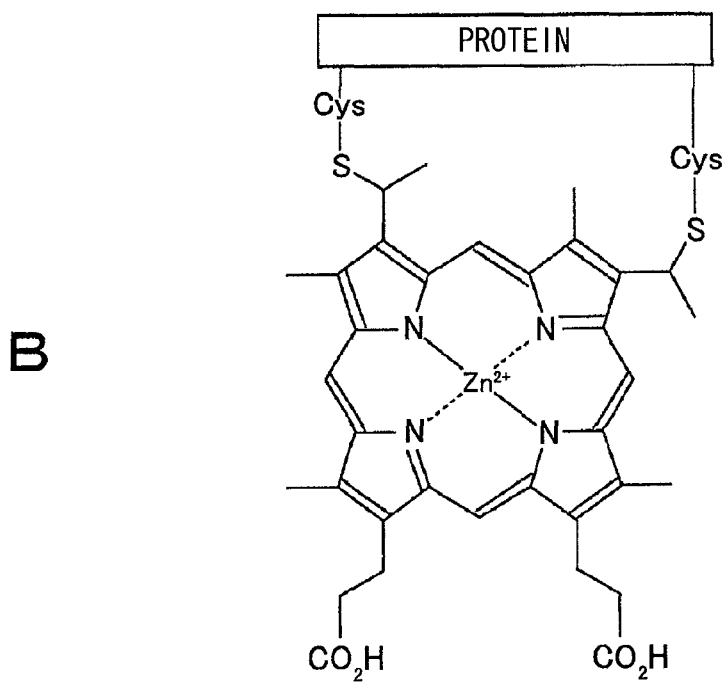
FIG. 14

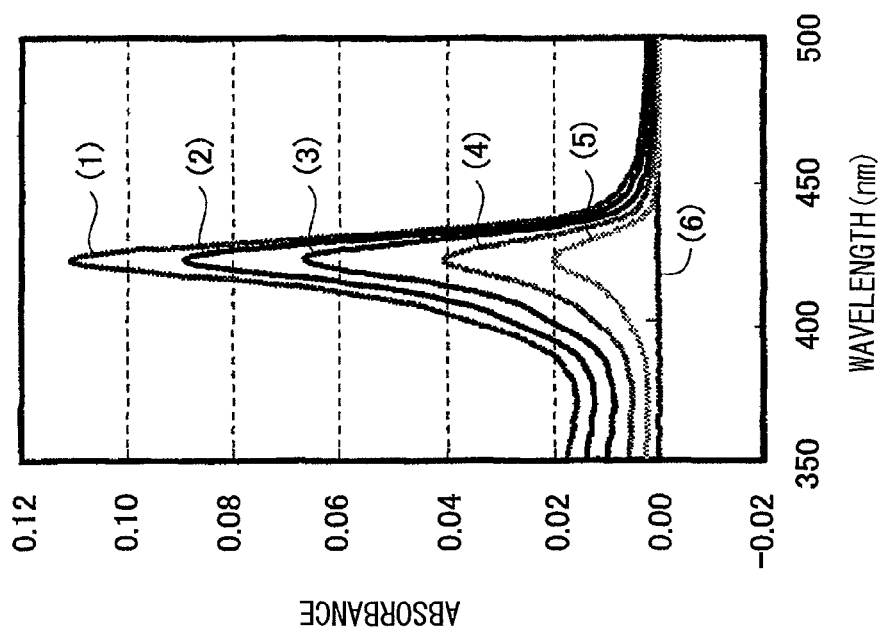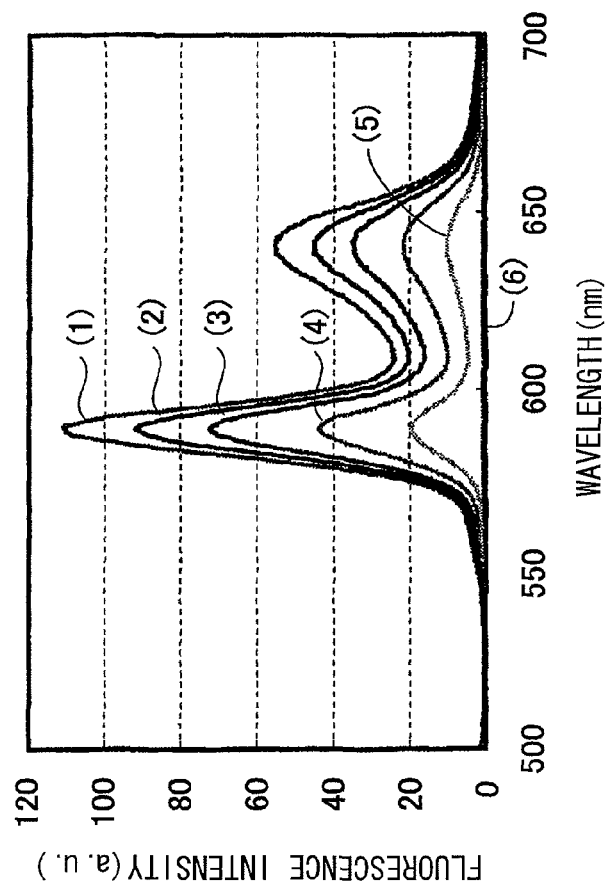
FIG. 15

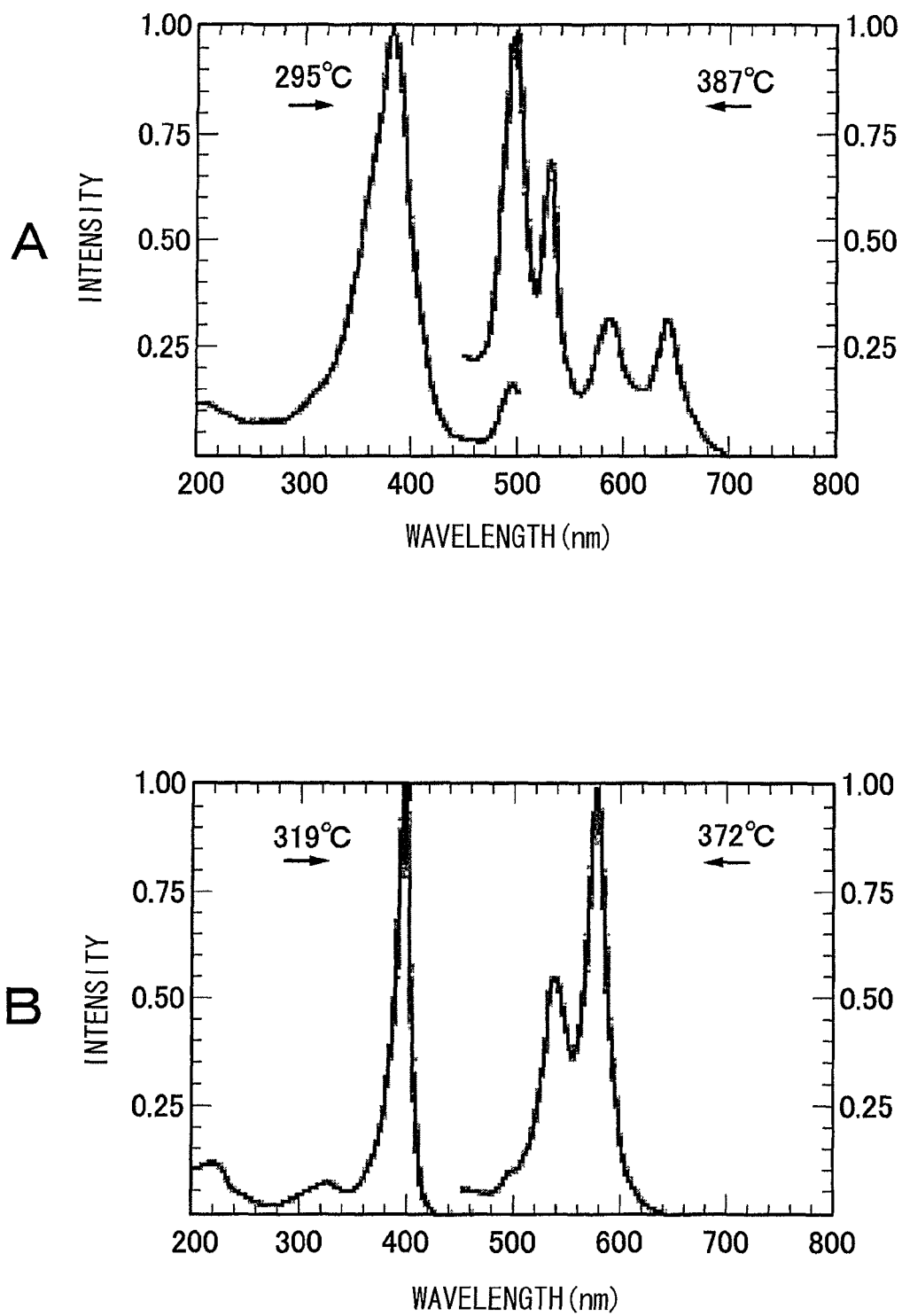
F I G. 45

CYTOCHROME C552 COLOR IMAGING ELEMENT AND METHOD OF MANUFACTURING THE SAME, CYTOCHROME C552 PHOTOSENSOR AND METHOD OF MANUFACTURING THE SAME, CYTOCHROME C552 PHOTOELECTRIC TRANSDUCER AND METHOD OF MANUFACTURING THE SAME, AND CYTOCHROME C552 ELECTRONIC DEVICE

CROSS REFERENCE TO RELATED APPLICATIONS

The present application is a National Stage of International Application No. PCT/JP2010/051817 filed on Feb. 8, 2010, which claims priority to Japanese Patent Application No. 2009-033890, filed in the Japanese Patent Office on Feb. 17, 2009, the entire contents of which are being incorporated herein by reference.

BACKGROUND

The present invention relates to a color imaging element, a photosensor and a photoelectric transducer using a protein, and methods of manufacturing the same, and an electronic device using the above-described color imaging element, photosensor or photoelectric transducer.

Proteins are promising functional elements as an alternative to semiconductor elements. While miniaturization of semiconductor elements is limited to a size of several tens of nanometers, proteins with an extremely small size of 1 nm to 10 nm exert a sophisticated function.

In related art, as a photoelectric transducer using a protein, there is proposed a photoelectric transducer using a protein-immobilized electrode formed by immobilizing a zinc-substituted cytochrome c (a horse-heart cytochrome c having zinc substituted for iron as a central metal of a heme) on a gold electrode, and it is reported that a photocurrent is obtained by the protein-immobilized electrode (refer to PTL 1).

Moreover, there are proposed color picture light-sensitive elements including light-sensitive units having a photoelectric conversion function and being formed by supporting an alignment film of a photosensitive chromoprotein such as bacteriorhodopsin on an electrode, and including a plurality of combinations of light-sensitive units of photosensitive chromoproteins with different photosensitive wavelengths (refer to PTLs 2 and 3).

CITATION LIST

Patent Literature

[PTL 1] Japanese Unexamined Patent Application Publication No. 2007-220445
[PTL 2] Japanese Unexamined Patent Application Publication No. H3-237769
[PTL 3] Japanese Unexamined Patent Application Publication No. H3-252530
[NPTL 1] Fee, J. A. and 13 others, Protein Sci. 9, 2074 (2000)
[NPTL 2] Vanderkooi, J. M. and 2 others, Eur. J. Biochem. 64, 381-387 (1976)
[NPTL 3] [Searched on Jul. 15, 2008] the Internet (URL: http://www.wako-chem.co.jp/siyaku/info/gene/article/EvrogenSeries.htm)
[NPTL 4] [Searched on Jul. 15, 2008] the Internet (URL: http://clontech.takara-bio.co.jp/product/families/gfp/lc_table2.shtml)
[NPTL 5] [Searched on Jul. 15, 2008] the Internet (URL: http://clontech.takara-bio.co.jp/product/catalog/200708_12.shtml)
[NPTL 6] Choi, J.-M. and Fujihira M. Appl. Phys. Lett. 84, 2187-2189 (2004)
[NPTL 7] Robert K. and 2 others, Isolation and modification of natural porphyrins, in "The Porphyrins, vol. I" (Dolphin D. ed.), pp. 289-334, Academic press, New York, 1978.
[NPTL 8] Fuhrhop J. H., Irreversible reactions on the porphyrin periphery (excluding oxidations reductions, and photochemical reactions), in "The Porphyrins, vol. II" (Dolphin D ed.) pp. 131-156, Academic Press, New York, 1978.
[NPTL 9] McDonagh A. F., Bile pigments: bilatrienes and 5,15-biladienes, in "The Porphyrins, vol. VI" (Dolphin D ed.) pp. 294-472, Academic Press, New York, 1979.
[NPTL 10] Jackson A H., Azaporphyrins, in "The Porphyrins, vol. I" (Dolphin D ed.), pp. 365-387, Academic Press, New York, 1978.
[NPTL 11] Gouterman M., Optical spectra and electronic structure of porphyrins and related rings, in "The Porphyrinis, vol. III" (Dolphin D ed.), pp. 1-156, Academic Press, New York, 1978.
[NPTL 12] Gouterman M., Optical spectra and electronic structure of porphyrins and related rings, in "The Porphyrinis, vol. III" (Dolphin D ed.), pp. 11-30, Academic Press, New York, 1978.
[NPTL 13] Sano S., Reconstitution of hemoproteins, in"The Porphyrins, vol. VII" (Dolphin D. ed.), pp. 391-396, Academic Press, New York, 1979.

SUMMARY

However, as the proteins used in the photoelectric transducer and the color picture light-sensitive elements proposed in PTLs 1 to 3 are unstable in vitro, there is an issue that the photoelectric transducer and the color picture light-sensitive elements lack long stability. When the photoelectric transducer and the color picture light-sensitive elements are allowed to achieve long stability, they are extremely useful; however, as far as the inventors and others of the present invention are aware, there have been no reports describing such a photoelectric transducer or color picture light-sensitive element.

Therefore, an object to be achieved by the present invention is to provide a color imaging element which uses a protein and is capable of being stably used for a long time, and a method of manufacturing the same.

Another object to be achieved by the invention is to provide a photosensor which uses a protein and is capable of being stably used for a long time, and a method of manufacturing the same.

Still another object to be achieved by the invention is to provide a photoelectric transducer which uses a protein and is capable of being stably used for a long time, and a method of manufacturing the same.

A further object to be achieved by the invention is to provide an electronic device using the above-described superior color imaging element, photosensor or photoelectric transducer.

The above-described objects and other objects will become apparent from the description of the present specification and the accompanying drawings.

To achieve the above-described objects, the present invention provides a color imaging element including: a blue-light photoelectric transducer using a zinc-substituted cytochrome c552, a derivative thereof or a variant thereof.

Moreover, the present invention provides a method of manufacturing a color imaging element including: a step of immobilizing a zinc-substituted cytochrome c552, a derivative thereof or a variant thereof on an electrode.

Further, the present invention provides a photosensor including a blue-light photoelectric transducer using a zinc-substituted cytochrome c552, a derivative thereof or a variant thereof.

Moreover, the present invention provides a method of manufacturing a photosensor including: a step of immobilizing a zinc-substituted cytochrome c552, a derivative thereof or a variant thereof on an electrode.

Moreover, the present invention provides a blue-light photoelectric transducer using a zinc-substituted cytochrome c552, a derivative thereof or a variant thereof.

Further, the present invention provides a method of manufacturing a blue-light photoelectric transducer including: a step of immobilizing a zinc-substituted cytochrome c552, a derivative thereof or a variant thereof on an electrode.

Moreover, the present invention provides a red-light or green-light photoelectric transducer using a cytochrome c552 modified zinc-porphyrin.

Further, the present invention provides a method of manufacturing a red-light or green-light photoelectric transducer including: a step of immobilizing a cytochrome c552 modified zinc-porphyrin on an electrode.

In the above-described respective inventions, as a material of an electrode on which the zinc-substituted cytochrome c552, the derivative thereof or the variant thereof, or the cytochrome c552 modified zinc-porphyrin is immobilized, a gold electrode is most preferably used; however, any other material may be used. More specifically, as an inorganic material, for example, in addition to a metal such as platinum or silver, a metal oxide such as ITO (indium-tin oxide), FTO (fluorine-doped tin oxide) or Nesa glass ($SnO_2$) may be used. Moreover, as an organic material, for example, various conductive polymers and a charge-transfer complex (for example, TTF-TCNQ or the like) containing a tetrathiafulvalene derivative (such as TTF, TMTSF, or BEDT-TTF) may be used. As the conductive polymer, for example, polythiophene, polypyrrole, polyacetylene, polydiacetylene, polyparaphenylene, polyparaphenylene sulfide or the like may be used.

Moreover, the present invention provides a color imaging element including a red-light, green-light or blue-light photoelectric transducer, the red-light, green-light or blue-light photoelectric transducer using:

a gold electrode;

a cytochrome c552, a derivative thereof or a variant thereof immobilized on the gold electrode; and a fluorescent protein bonded to the cytochrome c552, the derivative thereof or the variant thereof and absorbing red light, green light or blue light.

Further, the present invention provides a method of manufacturing a color imaging element including:

a step of immobilizing a cytochrome c552, a derivative thereof or a variant thereof on a gold electrode; and a step of bonding a fluorescent protein absorbing red light, green light or blue light to the cytochrome c552, the derivative thereof or the variant thereof.

Moreover, the present invention provides a photosensor including:

a gold electrode;

a cytochrome c552, a derivative thereof or a variant thereof immobilized on the gold electrode; and a fluorescent protein bonded to the cytochrome c552, the derivative thereof or the variant thereof.

Further, the present invention provides a method of manufacturing a photosensor including:

a step of immobilizing a cytochrome c552, a derivative thereof or a variant thereof on a gold electrode; and a step of bonding a fluorescent protein to the cytochrome c552, the derivative thereof or the variant thereof.

Moreover, the present invention provides a photoelectric transducer including:

a gold electrode;

a cytochrome c552, a derivative thereof or a variant thereof immobilized on the gold electrode; and a fluorescent protein bonded to the cytochrome c552, the derivative thereof or the variant thereof.

Further, the present invention provides a method of manufacturing a photoelectric transducer including:

a step of immobilizing a cytochrome c552, a derivative thereof or a variant thereof on a gold electrode; and a step of bonding a fluorescent protein to the cytochrome c552, the derivative thereof or the variant thereof.

In the above-described photosensor and the above-described photoelectric transducer formed by immobilizing a cytochrome c552, a derivative thereof or a variant thereof on a gold electrode and bonding a fluorescent protein thereto and a methods of manufacturing them, as the fluorescent protein, a fluorescent protein with a necessary absorption wavelength is used. In particular, in the case where the photosensor is a color photosensor, as the fluorescent protein, a fluorescent protein absorbing red light, a fluorescent protein absorbing green light and a fluorescent protein absorbing blue light are used. Likewise, in a red-light, green-light or blue-light photoelectric transducer, a fluorescent protein absorbing red light, green light or blue light is used.

In the above-described respective inventions, preferably, a zinc-substituted cytochrome c552, a derivative thereof or a variant thereof, or a cytochrome c552 modified zinc-porphyrin, or a cytochrome c552, a derivative thereof or a variant thereof is immobilized with a hydrophobic portion thereof facing the electrode or the gold electrode. Typically, the cytochrome c552, the derivative thereof or the variant thereof, or the cytochrome c552 modified zinc-porphyrin, or the cytochrome c552, the derivative thereof or the variant thereof is bonded to the electrode or the gold electrode with a self-assembled monolayer in between. In this case, a derivative of the zinc-substituted cytochrome c552 is a zinc-substituted cytochrome c552 having a chemically modified amino acid residue or porphyrin in a skeleton thereof. A variant of the zinc-substituted cytochrome c552 is a zinc-substituted cytochrome c552 having a part of an amino acid residue in a skeleton thereof substituted by another amide acid residue. Likewise, a derivative of the cytochrome c552 is a cytochrome c552 having a chemically modified amino acid residue or heme in a skeleton thereof, and a variant of the cytochrome c552 is a cytochrome c552 having a part of an amino acid residue in a skeleton thereof by another amino acid residue.

In the above-described respective inventions, the photoelectric transducer includes a counter electrode in addition to the electrode or the gold electrode on which a zinc-substituted cytochrome c552, a derivative thereof or a variant thereof, or a cytochrome c552 modified zinc-porphyrin, or a cytochrome c552, a derivative thereof or a variant thereof is immobilized. The counter electrode is arranged to face the electrode or the gold electrode with a space in between.

Moreover, the present invention provides a photoelectric transducer using a metal-substituted cytochrome c552, a derivative thereof or a variant thereof.

Further, the present invention provides a method of manufacturing a photoelectric transducer including:

a step of immobilizing a metal-substituted cytochrome c552, a derivative thereof or a variant thereof on an electrode.

In these inventions using a metal-substituted cytochrome c552, a derivative thereof or a variant thereof, matters described relative to the above-described respective inventions are established unless it departs from the nature thereof. A metal of the metal-substituted cytochrome c552 is selected as necessary to obtain a target photoelectric conversion wavelength.

In the invention configured as described above, a zinc-substituted cytochrome c552, a derivative thereof or a variant thereof, or a cytochrome c552 modified zinc-porphyrin, or a cytochrome c552, a derivative thereof or a variant thereof, or a metal-substituted cytochrome c552, a derivative thereof or a variant thereof has higher thermal stability than a zinc-substituted cytochrome c, bacteriorhodopsin or the like. In addition, a photoelectric transducer absorbing red light, green light or blue light is allowed to be obtained by a zinc-substituted cytochrome c552, a derivative thereof or a variant thereof, or a cytochrome c552 modified zinc-porphyrin. Moreover, a photoelectric transducer absorbing light with a desired wavelength is allowed to be obtained by a metal-substituted cytochrome c552, a derivative thereof or a variant thereof.

According to the invention, the zinc-substituted cytochrome c552, the cytochrome c552 modified zinc-porphyrin, the cytochrome c552, the metal-substituted cytochrome c552 or the like has high thermal stability; therefore, a color imaging element, a photosensor and a photoelectric transducer which use a protein and are capable of being stably used for a long time are achievable. Then, a superior electronic device is achievable with use of such a superior color imaging element, photosensor or photoelectric transducer.

Additional features and advantages of the present invention are described herein, and will be apparent from the following Detailed Description and the Figures.

BRIEF DESCRIPTION OF THE FIGURES

FIG. 14 is a schematic diagram illustrating an absorption spectrum of a zinc-substituted cytochrome c and a structure of a zinc-porphyrin as a chromophore of the zinc-substituted cytochrome c.

FIG. 15 is a schematic diagram illustrating measurement results of absorption spectra and fluorescence spectra of a zinc-substituted cytochrome c552.

FIG. 45 is a schematic diagram illustrating absorption spectra of freebase octaethylporphyrin and vanadyl octaethylporphyrin.

DETAILED DESCRIPTION

Best modes for carrying out the invention (hereinafter referred to as "embodiments") will be described below referring to the accompanying drawings. It is to be noted that descriptions will be given in the following order.
1. First Embodiment (Blue-light photoelectric transducer)
2. Second Embodiment (Blue-light photoelectric transducer)
3. Third Embodiment (green-light or red-light photoelectric transducer)
4. Fourth Embodiment (Green-light or red-light photoelectric transducer)
5. Fifth Embodiment (Color imaging element)
6. Sixth Embodiment (Photosensor)
7. Seventh Embodiment (Photosensor)
8. Eighth Embodiment (Color CCD imaging element)
9. Ninth Embodiment (Inverter circuit)
10. Tenth Embodiment (photosensor)

1. First Embodiment

Blue-Light Photoelectric Transducer

A cytochrome c552 derived from a thermophile, Thermus thermophilus serves as an electron carrier in vivo as in the case of a horse-heart cytochrome c. Although active centers of the cytochrome c552 and the horse-heart cytochrome c similarly contain a heme (an iron-protoporphyrin IX complex), the cytochrome c552 has extremely high thermal stability by an amino acid around the active center thereof which is different from that in the horse-heart cytochrome c (refer to NPTL 1). For example, whereas a typical protein and the horse-heart cytochrome c have a denaturation midpoint of 50° C. to 60° C. and a denaturation midpoint of 85° C., respectively, the cytochrome c552 has a higher denaturation midpoint of not less than 100° C., because the denaturation temperature of the cytochrome c552 is not measurable in a typical aqueous solution (of which the upper temperature limit is 100° C.). In addition, it is reported that the cytochrome c552 has a denaturation midpoint of 60° C. to 70° C. in the presence of 4.2 M guanidine hydrochloride (a denaturant).

A zinc-substituted cytochrome c552 formed by substituting zinc for iron as the central metal of the heme of a cytochrome c552 has as high thermal stability as the cytochrome c552, and is a fluorescent protein absorbing blue light. Therefore, in the first embodiment, the zinc-substituted cytochrome c552 is used for a blue-light photoelectric transducer.

Figure 1:
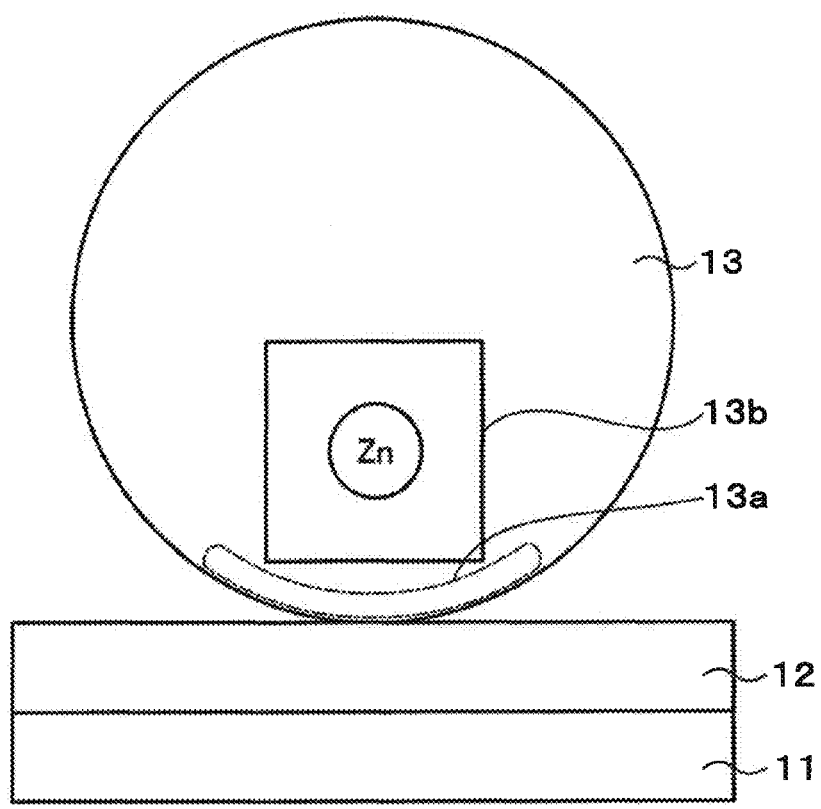
FIG. 1 is a schematic diagram illustrating a blue-light photoelectric transducer according to a first embodiment of the invention.

FIG. 1 illustrates the blue-light photoelectric transducer according to the first embodiment, and in particular, a protein-immobilized electrode.

As illustrated in FIG. 1, in the blue-light photoelectric transducer, a zinc-substituted cytochrome c552 13 is immobilized on a gold electrode 11 with a self-assembled monolayer (SAM) 12 in between. In this case, the cytochrome c552 13 is immobilized with a hydrophobic portion 13a thereof facing the gold electrode 11. Zinc (Zn) as a central metal is coordinated to a porphyrin 13b inside the zinc-substituted cytochrome c552 13.

Figure 2:
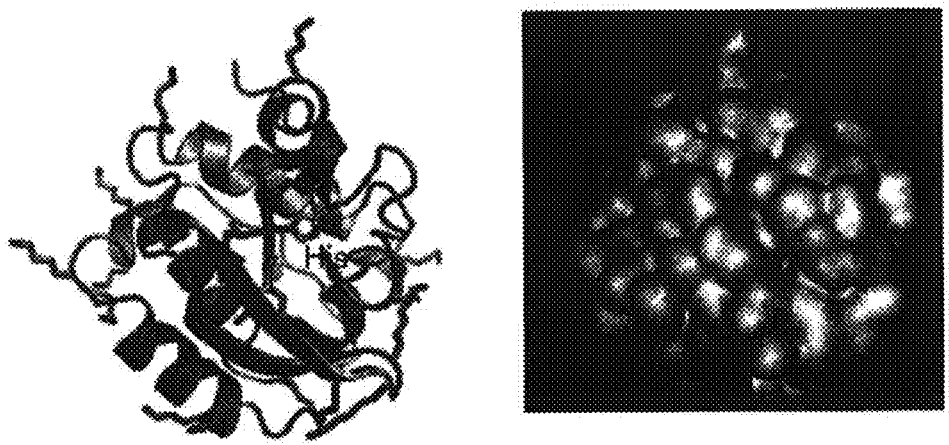
FIG. 2 is a schematic diagram illustrating a structure of a zinc-substituted cytochrome c552 used in the blue-light photoelectric transducer according to the first embodiment of the invention.
Figure 3:
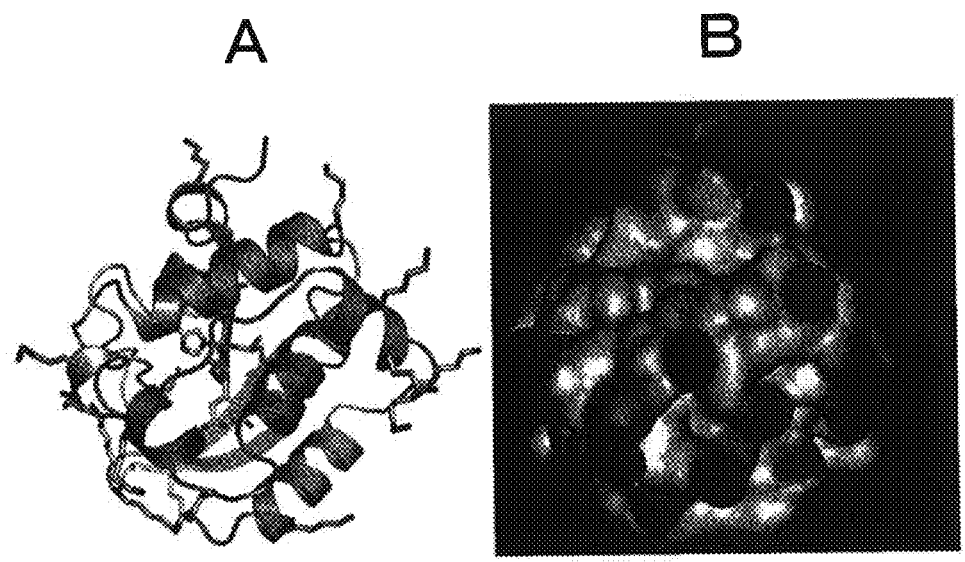
FIG. 3 is a schematic diagram illustrating the structure of the zinc-substituted cytochrome c552 used in the blue-light photoelectric transducer according to the first embodiment of the invention.

FIG. 2A schematically illustrates a structure of a zinc-substituted cytochrome c552. FIG. 2A illustrates a porphyrin, axial ligands thereof, i.e., histidine (His) and methionine (Met), and a lysine residue (a positively charged amino acid) of the zinc-substituted cytochrome c552 represented by stick models. FIG. 2A is a front view of the porphyrin, where a direction in which the axial ligand, histidine (His) is located on a right side is regarded as front. FIG. 2B illustrates a surface charge distribution diagram of the zinc-substituted cytochrome c552 illustrated in FIG. 2A. FIG. 3A illustrates a diagram of the zinc-substituted cytochrome c552 viewed from a back side of the porphyrin. FIG. 3B illustrates a surface charge distribution diagram of the zinc-substituted cytochrome c552 illustrated in FIG. 3A.

Figure 4:
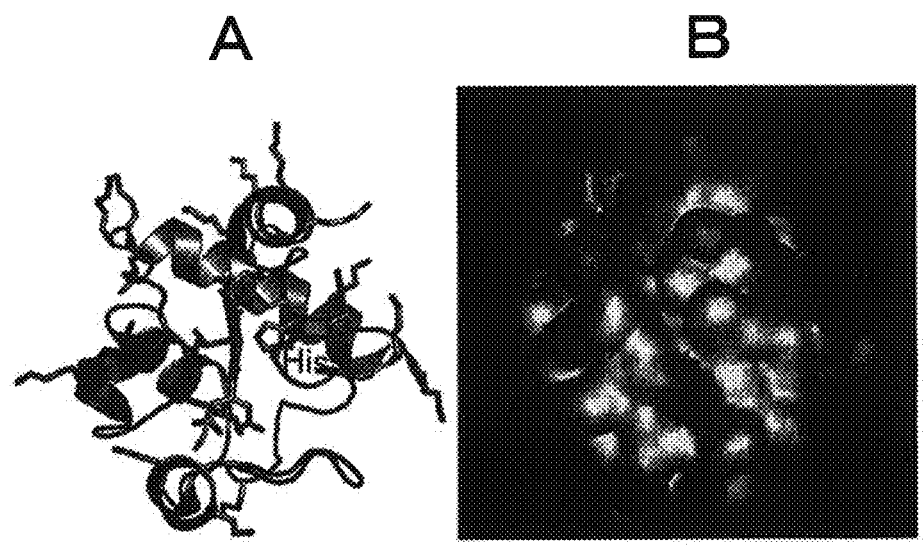
FIG. 4 is a schematic diagram illustrating a structure of a horse-heart cytochrome c.
Figure 5:
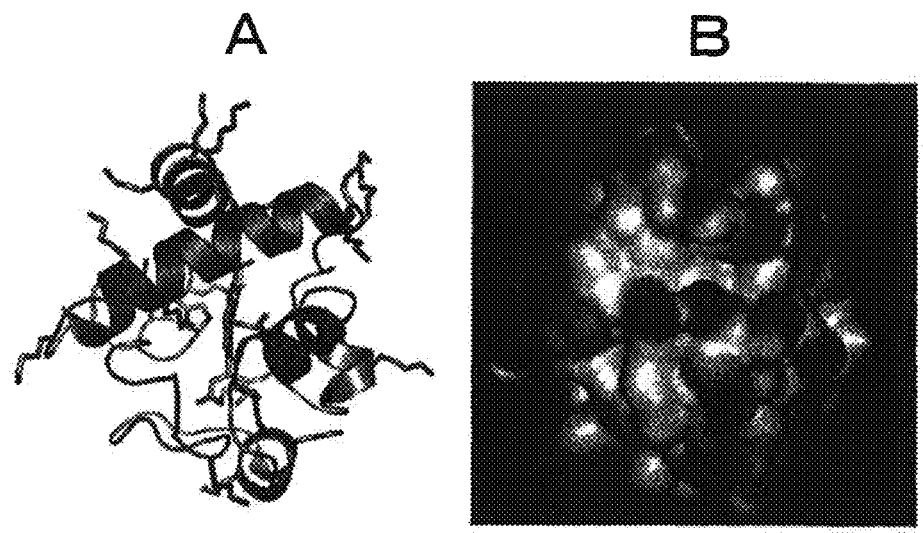
FIG. 5 is a schematic diagram illustrating the structure of the horse-heart cytochrome c.

For comparison, FIG. 4A illustrates a diagram of a horse-heart cytochrome c viewed from a front side of the heme thereof, FIG. 4B illustrates a surface charge distribution diagram of the horse-heart cytochrome c illustrated in FIG. 4A, FIG. 5A illustrates a diagram of the horse-heart cytochrome c viewed from a back side of the heme thereof, and FIG. 5B illustrates a surface charge distribution diagram of the horse-heart cytochrome c illustrated in FIG. 5A.

While, as illustrated in FIGS. 4B and 5B, the horse-heart cytochrome c has positive charges dispersed over an entire molecule thereof, as illustrated in FIGS. 2B and 3B, the zinc-substituted cytochrome c552 has positive charges concentrated on the back side of the porphyrin. Moreover, the front side of the porphyrin of the zinc-substituted cytochrome c552 13 is occupied by hydrophobic residues and neutral polar residues. The hydrophobic portion 13a of the zinc-substituted cytochrome c552 13 refers to a front portion of the porphyrin.

Figure 6:
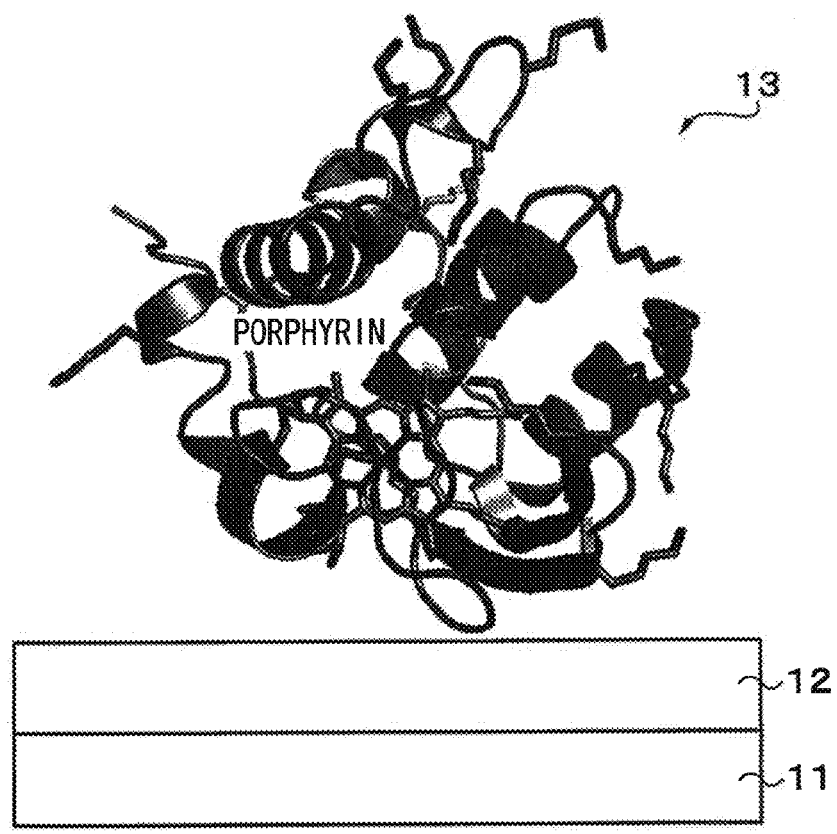
FIG. 6 is a schematic diagram specifically illustrating the structure of the zinc-substituted cytochrome c552 used in the blue-light photoelectric transducer according to the first embodiment of the invention.

FIG. 6 schematically illustrates the zinc-substituted cytochrome c552 13 immobilized on the gold electrode 11 with the self-assembled monolayer 12 in between. In FIG. 6, the axial ligand, histidine is located on a front side of the zinc-substituted cytochrome c552 13, and a lysine residue is represented by a stick model.

Figure 7:
FIG. 7 is a schematic diagram specifically illustrating the structure of the zinc-substituted cytochrome c552 used in the blue-light photoelectric transducer according to the first embodiment of the invention.

FIG. 7 illustrates a diagram of the zinc-substituted cytochrome c552 13 immobilized on the gold electrode 11 with the self-assembled monolayer 12 in between viewed from the gold electrode 11 side, where the axial ligand, histidine is located on a right side (in front of the porphyrin). In FIG. 7, an amino acid side chain is represented by a stick model.

The self-assembled monolayer 12 is configured of three portions. A first portion is a bonding functional group (for example, a thiol group (—SH) or the like) reacting with an atom on a surface of the gold electrode 11 on which the self-assembled monolayer 12 is to be immobilized. A second portion is typically an alkyl chain, and a two-dimensional ordered structure of the self-assembled monolayer 12 is determined mainly by a Van der Waals' force between the alkyl chains. Therefore, typically, in the case where the alkyl chain has a certain number or more of carbon atoms, a stable, highly dense and highly oriented film is formed. A third portion is an end group, and when the end group is a functional group with functionality, a solid surface is allowed to be functionalized.

The self-assembled monolayer 12 is formed with use of, for example, a hydrophobic thiol and a hydrophilic thiol, and the proportions of the hydrophobic thiol and the hydrophilic thiol determine ease of bonding between the zinc-substituted cytochrome c552 13 and the gold electrode 11. Examples of a hydrophilic group of the hydrophilic thiol include —OH, —$NH_2$, $SO_3^-$, $OSO_3^-$, $COO^-$, $NH_4^+$ and the like The hydrophobic thiol and the hydrophilic thiol are selected as necessary.

As a preferable example of a combination of the hydrophobic thiol and the hydrophilic thiol, the hydrophobic thiol is $HS(CH_2)_nCH_3$ (n=5, 8 or 10), and the hydrophilic thiol is $HS(CH_2)_nCH_2OH$ (n=5, 8 or 10). More specifically, for example, the hydrophobic thiol is 1-undecane thiol ($HS(CH_2)_{10}CH_3$) and the hydrophilic thiol is 1-hydroxy-11-undecane thiol ($HS(CH_2)_{10}CH_2OH$). As another example of the combination of the hydrophobic thiol and the hydrophilic thiol, the hydrophobic thiol is $HS(CH_2)_mCH_3$, and the hydrophilic thiol is $HS(CH_2)_nCH_2OH$ (where m<n, m is, for example, 5 or more, and n is, for example, 10 or less). More specifically, for example, the hydrophobic thiol is $HS(CH_2)_9CH_3$, and the hydrophilic thiol is $HS(CH_2)_{10}CH_2OH$.

Figure 8:
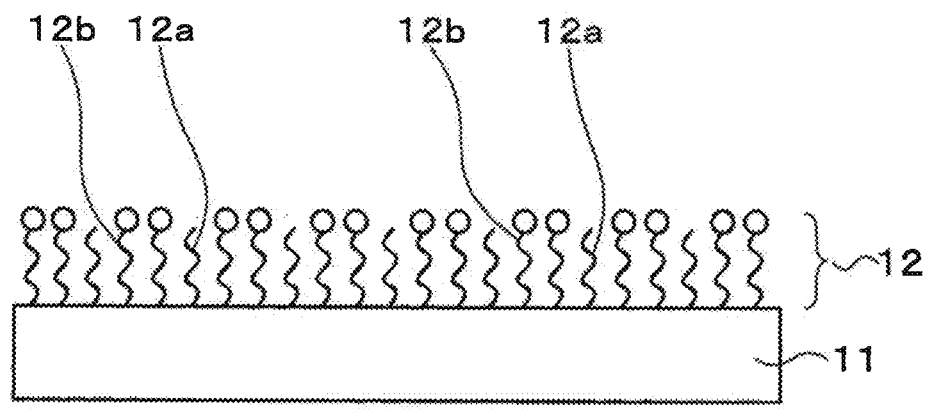
FIG. 8 is a schematic diagram illustrating a structure of a self-assembled monolayer used in the blue-light photoelectric transducer according to the first embodiment of the invention.

FIG. 8 schematically illustrates a structure of the self-assembled monolayer 12 formed with use of the hydrophobic thiol and the hydrophilic thiol. As illustrated in FIG. 8, thiol groups (—SH) of a hydrophobic thiol 12a and a hydrophilic thiol 12b are bonded to a surface of the gold electrode 11. Moreover, a hydrophobic group of the hydrophobic thiol 12a and a hydrophilic group (indicated by a circle in FIG. 8) of the hydrophilic thiol 12b are bonded to the hydrophobic portion 13a (refer to FIG. 1) of the zinc-substituted cytochrome c552 13.

Although one molecule of the zinc-substituted cytochrome c552 13 is illustrated in FIG. 1, the number of molecules of the zinc-substituted cytochrome c552 13 immobilized on the gold electrode 11 is determined as necessary, and typically, a plurality of molecules of the zinc-substituted cytochrome c552 13 are immobilized as a self-assembled monolayer. Moreover, although the gold electrode 11 illustrated in FIG. 1 has a flat surface shape, the gold electrode 11 may have any surface shape, for example, any one of a surface with recesses, a surface with projections, a surface with recesses and projections or the like, and the zinc-substituted cytochrome c552 13 is allowed to be easily immobilized on any surface shape.

The photoelectric transducer includes a counter electrode in addition to a zinc-substituted-cytochrome-c552-immobilized electrode formed by immobilizing the zinc-substituted cytochrome c552 13 on the gold electrode 11 with the self-assembled monolayer 12 in between. The counter electrode is arranged to face the zinc-substituted-cytochrome-c552-immobilized electrode with a space in between. As a material of the counter electrode, for example, an inorganic material typified by a metal such as gold, platinum or silver, or a metal oxide or glass such as ITO (indium-tin oxide), FTO (fluorine-doped tin oxide) or Nesa glass ($SnO_2$ glass) is allowed to be used. As the material of the counter electrode, a conductive polymer (such as polythiophene, polypyrrole, polyacetylene, polydiacetylene, polyparaphenylene or polyparaphenylene sulfide) or a charge-transfer complex (for example, TTF-TCNQ) containing a tetrathiafulvalene derivative (such as TTF, TMTSF or BEDT-TTF) is also allowed to be used. The counter electrode is preferably transparent at least to blue light, thereby allowing the entire or almost entire zinc-substituted cytochrome c552 13 immobilized on the gold electrode 11 to be irradiated with light. For example, the counter electrode is made of a conductive material transparent to blue light which is used for photoexcitation of the zinc-substituted cytochrome c552 13, for example, TIO, FTO, Nesa glass or the like.

This photoelectric transducer is allowed to operate either in a solution (an electrolytic solution or a buffer solution) or in a dry environment unless the photoelectric transducer impairs a photoelectric conversion function and an electron transfer function of the zinc-substituted cytochrome c552 13. In the case where the photoelectric transducer operates in the electrolytic solution or the buffer solution, typically, the counter electrode is arranged to face the zinc-substituted-cytochrome-c552-immobilized electrode with a space in between, and the zinc-substituted-cytochrome-c552-immobilized electrode and the counter electrode are immersed in the electrolytic solution or the buffer solution. As an electrolyte (or a redox species) of the electrolytic solution, an electrolyte causing an oxidation reaction in the zinc-substituted-cytochrome-c552-immobilized electrode and an reduction reaction in the counter electrode, or an electrolyte causing a reduction reaction in the zinc-substituted-cytochrome-c552-immobilized electrode and an oxidation reaction in the counter electrode is used. More specifically, as the electrolyte (or the redox species), for example, $K_4[Fe(CN)_6]$ or $[Co(NH_3)_6]Cl_3$ is used. In the case where the photoelectric transducer operates in a dry environment, typically, for example, a solid electrolyte not absorbing the zinc-substituted cytochrome c552, more specifically, for example, a wet solid electrolyte such as agar or polyacrylamide gel is sandwiched between the zinc-substituted-cytochrome-c552-immobilized electrode and the counter electrode, and a sealing wall is preferably provided around the solid electrolyte to prevent the solid electrolyte from drying. In these cases, when light is received by a light-sensitive section made of the zinc-substituted cytochrome c552 13, a photocurrent is allowed to be obtained with polarity based on a difference between natural electrode potentials of the zinc-substituted-cytochrome-c552-immobilized electrode and the counter electrode.

[Usage of Photoelectric Transducer]

Figure 9:
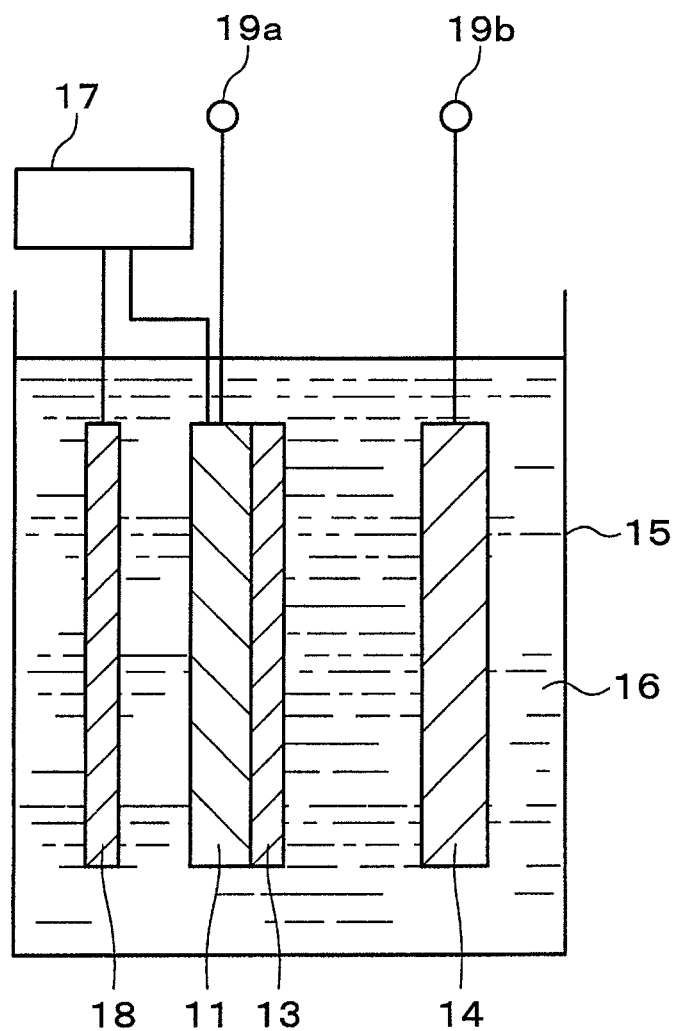
FIG. 9 is a schematic diagram illustrating a first example of usage of the blue-light photoelectric transducer according to the first embodiment of the invention.

FIG. 9 illustrates a first example of usage of the photoelectric transducer.

As illustrated in FIG. 9, in the first example, the zinc-substituted-cytochrome-c552-immobilized electrode formed by immobilizing the zinc-substituted cytochrome c552 13 on the gold electrode 11 with the self-assembled monolayer 12 (not illustrated) in between and a counter electrode 14 are arranged to face each other. The zinc-substituted-cytochrome-c552-immobilized electrode and the counter electrode 14 are immersed in an electrolytic solution 16 contained in a container 15. As the electrolytic solution 16, an electrolytic solution not impairing functions of the zinc-substituted cytochrome c552 13 is used. Moreover, as an electrolyte (or a redox species) of the electrolytic solution 16, an electrolyte causing an oxidation reaction in the zinc-substituted-cytochrome-c552-immobilized electrode and a reduction reaction in the counter electrode 14, or an electrolyte causing a reduction reaction in the zinc-substituted-cytochrome-c552-immobilized electrode and an oxidation reaction in the counter electrode 14 is used.

To perform photoelectric conversion in the photoelectric transducer, while a bias voltage is applied to the zinc-substituted-cytochrome-c552-immobilized electrode with respect to a reference electrode 18 by a bias supply 17, the zinc-substituted cytochrome c552 13 of the zinc-substituted-cytochrome-c552-immobilized electrode is irradiated with light. This light is blue light or light having a blue-light component which is capable of inducing photoexcitation of the zinc-substituted cytochrome c552 13. In this case, when at least one of the bias voltage applied to the zinc-substituted-cytochrome-c552-immobilized electrode, the intensity of the light to be applied, and the wavelength of the light to be applied is adjusted, the magnitude and/or polarity of a photocurrent flowing through the transducer is allowed to be changed. The photocurrent is extracted from terminals 19a and 19b to outside.

Figure 10:
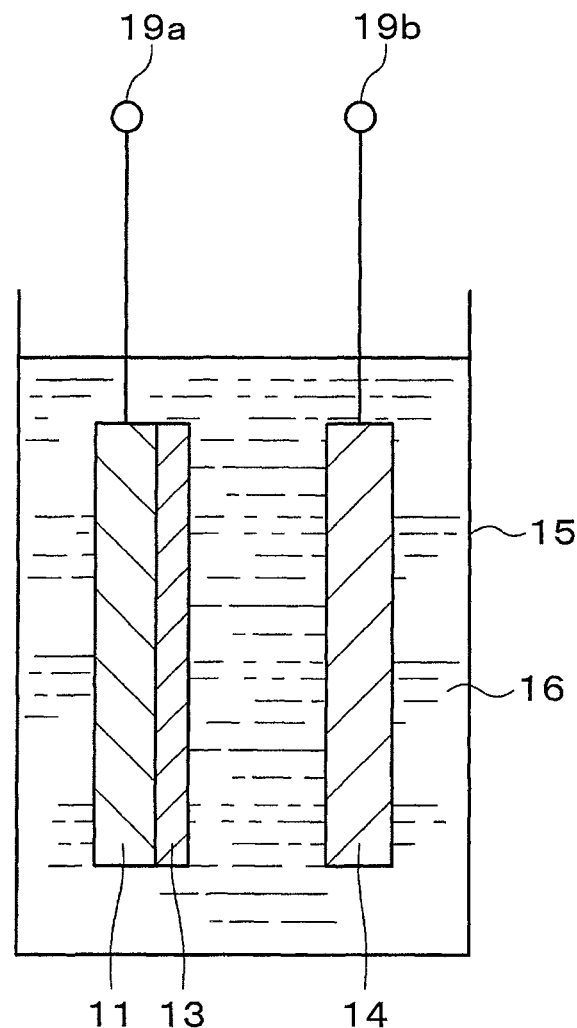
FIG. 10 is a schematic diagram illustrating a second example of usage of the blue-light photoelectric transducer according to the first embodiment of the invention.

FIG. 10 illustrates a second example of usage of the photoelectric transducer.

As illustrated in FIG. 10, in the second example, unlike the first example, instead of generating a bias voltage by the bias supply 17, a difference between the natural electrode potentials of the zinc-substituted-cytochrome-c552-immobilized electrode and the counter electrode 14 is used as a bias voltage. In this case, it is not necessary to use the reference electrode 18. Therefore, this photoelectric transducer is a two-electrode system using the zinc-substituted-cytochrome-c552-immobilized electrode and the counter electrode 14. In other points, the second example is similar to the first example.

Figure 11:
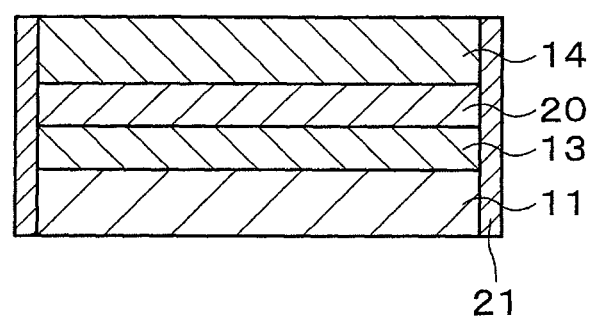
FIG. 11 is a schematic diagram illustrating a third example of usage of the blue-light photoelectric transducer according to the first embodiment of the invention.

FIG. 11 illustrates a third example of usage of the photoelectric transducer. Whereas the photoelectric transducers of the first and second examples operate in a solution, the photoelectric transducer of this example is allowed to operate in a dry environment.

As illustrated in FIG. 11, in this photoelectric transducer, a solid electrolyte 20 is sandwiched between the zinc-substituted-cytochrome-c552-immobilized electrode and the counter electrode 14. Moreover, a sealing wall 20 is provided around the solid electrolyte 20 to prevent the solid electrolyte 20 from drying. As the solid electrolyte 20, a solid electrolyte not impairing the functions of the zinc-substituted cytochrome c552 13 is used, and more specifically, agar, polyacrylamide gel or the like which does not absorb proteins is used. To perform photoelectric conversion in this photoelectric transducer, the zinc-substituted cytochrome c552 13 of the zinc-substituted-cytochrome-c552-immobilized electrode is irradiated with light with use of a difference between the natural electrode potentials of the zinc-substituted-cytochrome-c552-immobilized electrode and the counter electrode 14 as a bias voltage. This light is blue light or light having a blue-light component which is capable of inducing photoexcitation of the zinc-substituted cytochrome c552 13. In this case, when at least one of the difference between the natural electrode potentials of the zinc-substituted-cytochrome-c552-immobilized electrode and the counter electrode 14, the intensity of the light to be applied, and the wavelength of the light to be applied is adjusted, the magnitude and/or polarity of a photocurrent flowing through the transducer is allowed to be changed. In other points, the third example is similar to the first example.

[Method of Manufacturing Photoelectric Transducer]

An example of a method of manufacturing the blue-light photoelectric transducer will be described below.

First, the gold electrode 11 is immersed in a solution (a solvent is, for example, ethanol) containing the above-described hydrophobic thiol and the above-described hydrophilic thiol in predetermined proportions to form the self-assembled monolayer 12 on a surface of the gold electrode 11 as illustrated in FIG. 1.

Next, the gold electrode 11 with the self-assembled monolayer 12 formed thereon in such a manner is immersed in a solution containing the cytochrome c552 13, a buffer solution, and optionally a salt such as potassium chloride (KCl). As a result, the zinc-substituted cytochrome c552 13 is adsorbed and immobilized on the self-assembled monolayer 12 with the hydrophobic portion 13a thereof facing the gold electrode 11. Thus, the zinc-substituted-cytochrome-c552-immobilized electrode is formed.

Next, the photoelectric transducer illustrated in, for example, FIG. 9, 10 or 11 is manufactured with use of the zinc-substituted-cytochrome-c552-immobilized electrode and the counter electrode 14.

[Operation of Photoelectric Transducer]

When blue light or light having a blue-light component enters the zinc-substituted cytochrome c552 13 of the photoelectric transducer, the zinc-substituted cytochrome c552 13 generates electrons by photoexcitation, and the electrons travel to the gold electrode 11 through the self-assembled monolayer 12 by electron transfer. Then, a photocurrent is extracted from the gold electrode 11 and the counter electrode 14 to outside.

Example 1 a. Method of Synthesizing Zinc-Substituted Cytochrome c552

As a starting material, a recombinant cytochrome c552 (containing iron as a central metal thereof) prepared by cultivating, crushing, and purifying *Escherichia coli* containing a vector which includes a cytochrome c552 gene of a thermophile, Thermus thermophilus is used. Freeze-dried powder of the cytochrome c552, 50 to 100 mg is mixed with 6 mL of 70% hydrofluoric acid/pyridine and is incubated at room temperature for 10 minutes to remove the central metal, i.e., iron from the cytochrome c552. Next, 9 mL of a 50-mM ammonium acetate buffer solution (pH 5.0) is added to the resultant mixture, and after the reaction is completed, the resultant mixture is subjected to gel filtration column chromatography (column volume: 150 mL; resin: Sephadex G-50; developing solvent: 50 mM sodium acetate buffer solution; pH 5.0) to obtain metal-free cytochrome c552 (MFc552) without the central metal.

A Mfc552 solution obtained in such a manner is condensed as much as possible and is mixed with glacial acetic acid to have a pH of 2.5 (±0.05). Anhydrous zinc acetate powder, 30 mg is added to this solution, and the solution is incubated at 50° C. for 2 to 3 hours under protection from light. The incubation is continued while the absorption spectrum is measured every 30 minutes until a ratio between absorption intensity at a wavelength of 280 nm corresponding to protein and absorption intensity at a wavelength of 420 nm corresponding to a zinc-porphyrin becomes constant.

The following procedures are all performed under protection from light. After a saturated sodium monohydrogen diphosphate solution is added to the solution to allow the solution to have a neutral pH (6.0<), the solution is incubated at 70° C. for 5 to 10 minutes. A resultant precipitate and a resultant concentrated liquid are dissolved in a small amount of 7.2 M guanidine hydrochloride. A resultant solution is gradually dropped into a ten-fold volume of 10 mM sodium phosphate buffer solution (pH 7.0). After the concentration and an exchange of the buffer solution to the 10 mM sodium phosphate buffer solution (pH 7.0) are performed, a monomer fraction is recovered by cation exchange column chromatography (elution with a linear concentration gradient of 10 to 150 mM sodium phosphate buffer (pH 7.0)). Thus, a zinc-substituted cytochrome c552 (Znc552) is synthesized.

b. Properties of Zinc-Substituted Cytochrome c552

Figure 12:
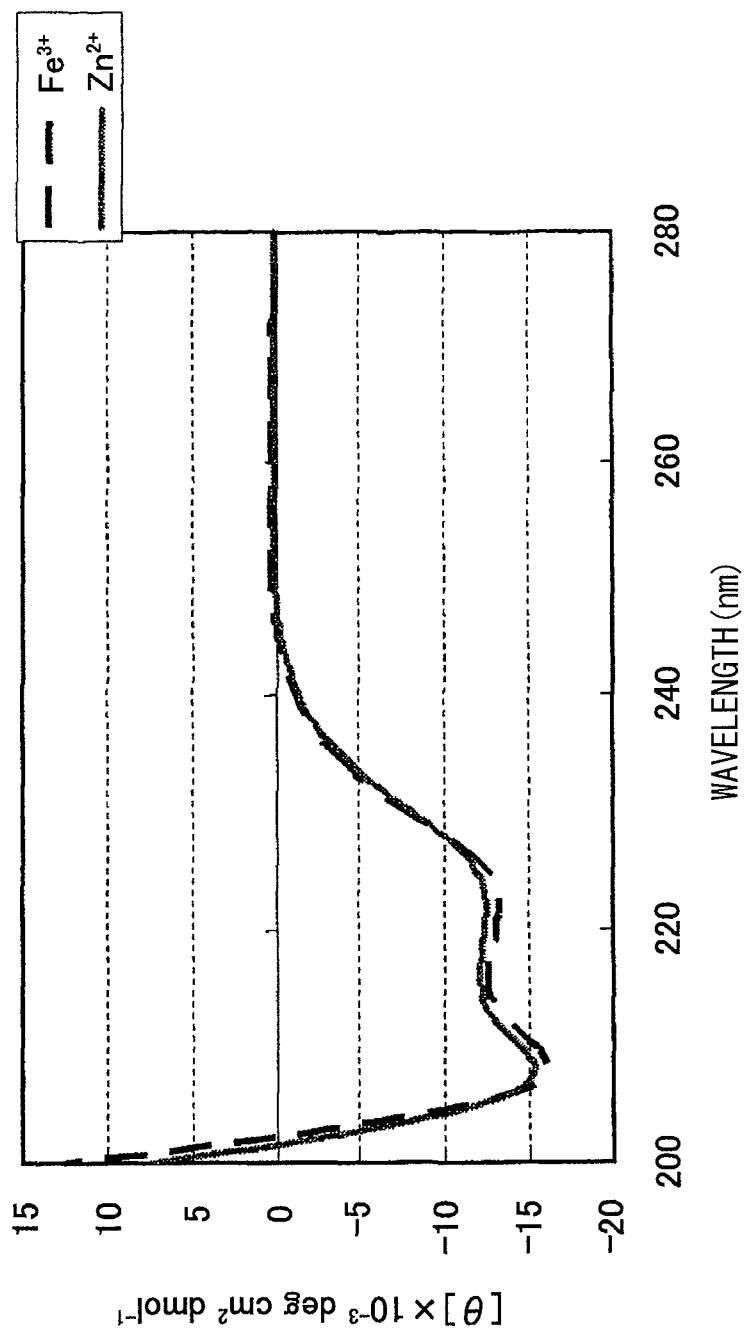
FIG. 12 is a schematic diagram illustrating a measurement result of a circular dichroic spectrum of a zinc-substituted cytochrome c552.

It was confirmed from a circular dichroic spectrum that the zinc-substituted cytochrome c552 synthesized in the above-described manner had the same protein folding pattern as native (iron-type) cytochrome c552 (refer to FIG. 12). However, the circular dichroic spectrum was measured with use of a sensitivity of 100 mdeg, a wavelength scan rate of 100 nm/min, a response time of 2 seconds, a bandwidth of 2.0 nm, integrate: 5, and a 10 mM sodium phosphate buffer solution (pH 7.0).

Figure 13:
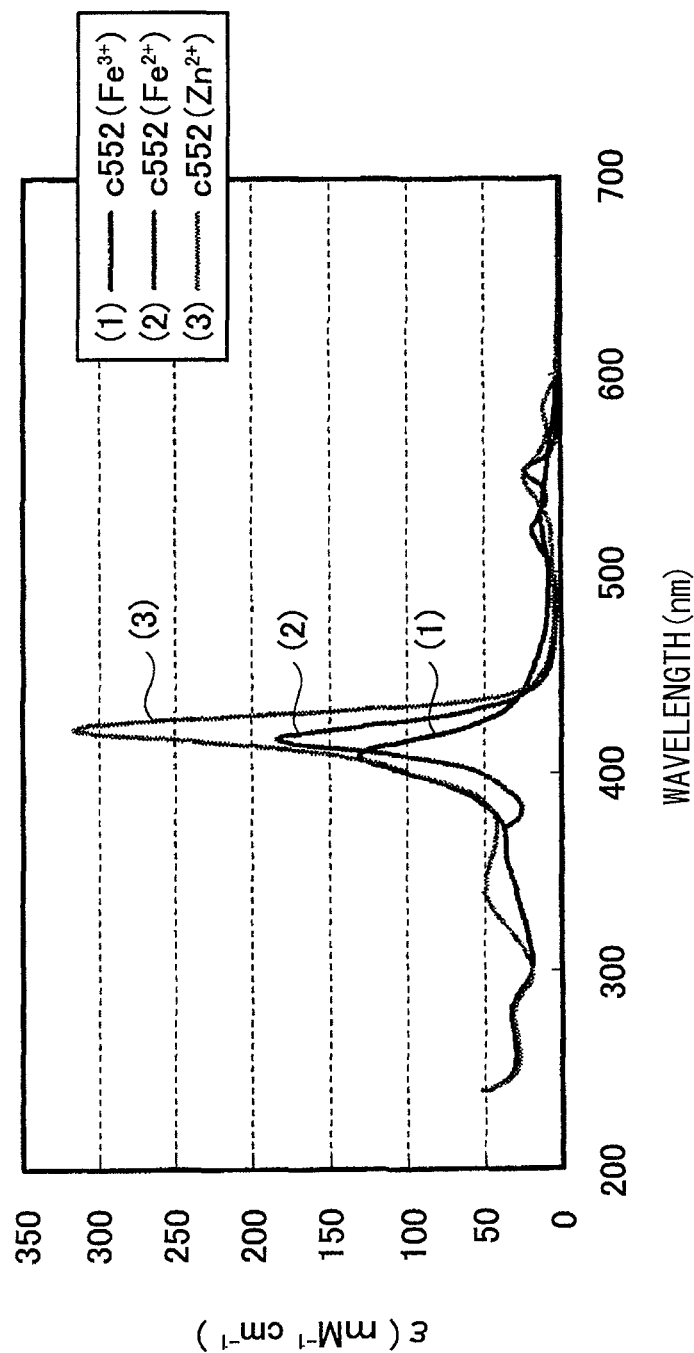
FIG. 13 is a schematic diagram illustrating measurement results of absorption spectra of various kinds of cytochromes c552.

FIG. 13 illustrates results of measurement of absorption spectra of a zinc-substituted cytochrome c552 and a cytochrome c552. For comparison, FIG. 14A illustrates results of measurement of an absorption spectrum of a zinc-substituted cytochrome c (Znhhc), that is, a horse-heart cytochrome c having zinc substituted for iron as a central metal of a heme (refer to NPTL 2). FIG. 14B illustrates a structure of a zinc-porphyrin as a chromophore of the zinc-substituted cytochrome c (Znhhc). As illustrated in FIG. 14B, zinc is coordinated to a center of a protoporphyrin IX, and a vinyl group of a porphyrin and a cysteine residue of a cytochrome protein form a thioether bond.

As is clear from FIGS. 13 and 14A, the absorption spectrum of the zinc-substituted cytochrome c552 has absorption maximums at wavelengths of 422 nm, 549 nm and 583 nm, and has substantially the same shape as that of the zinc-substituted cytochrome c (Znhhc) synthesized from a horse-heart cytochrome c. The absorption coefficients $\epsilon$ of the zinc-substituted cytochrome c552 at respective absorption maximums are higher than those of the zinc-substituted cytochrome c (refer to Table 1).

TABLE 1

Absorption maximum (nm) of cytochrome c522/Millimolar absorption coefficient $\epsilon$ (mM$^{-1}$cm$^{-1}$)

| | Protein | Soret | β | α |
|---|---|---|---|---|
| Znc552 | 280/31.7 | 422/316 | 549/23.4 | 583/11.3 |
| Fe$^{3+}$c552 | 280/33.6 | 409/131 | | 531/13.3 |
| Fe$^{2+}$c552 | | 417/184 | 522/19.3 | 552/23.7 |
| Znhhc* | | 423/243 | 549/15.5 | 585/7.9 |

*Vanderkooi, JM. and 2 others, Eur. J. Biochem. 64, 381 (1976).

FIG. 15A illustrates absorption spectra of the zinc-substituted cytochrome c552, and FIG. 15B illustrates fluorescence spectra of the zinc-substituted cytochrome c552 excited by light with a wavelength of 424 nm. In FIGS. 15A and 15B, the same numerals given to curves correspond to absorption/fluorescence spectra in the same concentrations. As illustrated in FIG. 15B, the fluorescence spectra of the zinc-substituted cytochrome c552 have maximum wavelengths at 590 nm and 641 nm, and are similar to those of the zinc-substituted cytochrome c.

Figure 16:
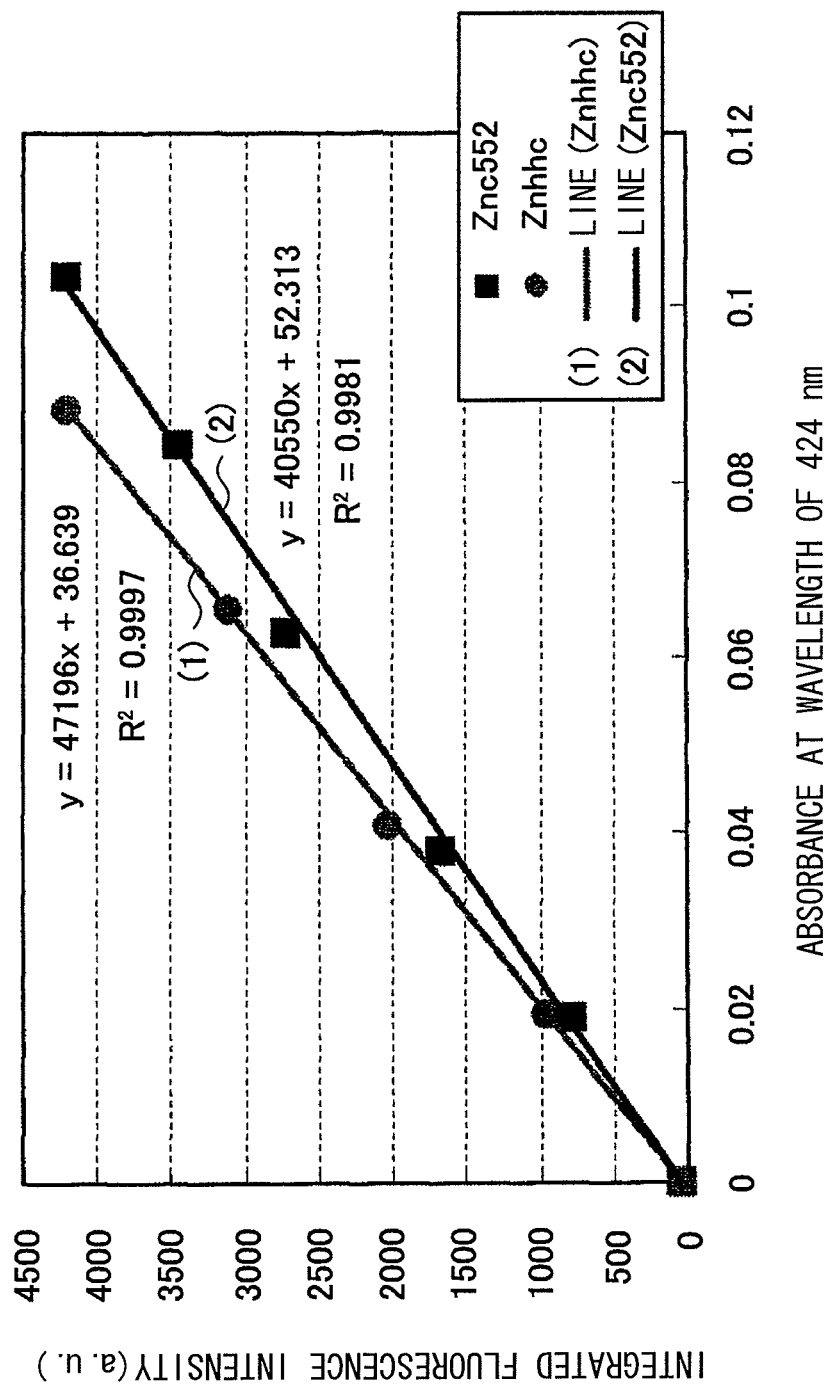
FIG. 16 is a schematic diagram illustrating measurement results of quantum yields of a zinc-substituted cytochrome c552 and a zinc-substituted cytochrome c.

FIG. 16 illustrates a graph obtained by measuring absorption/fluorescence spectra in different concentrations of the zinc-substituted cytochrome c552 and plotting integrated fluorescence intensities at a wavelength of 568 to 668 nm with respect to absorbance at a wavelength of 424 nm. The same procedure is also performed in the case of the zinc-substituted cytochrome c. A relative quantum yield is determined from a gradient of an obtained line. As a result, it is clear that in the case where the gradient of a line for the zinc-substituted cytochrome c corresponds to a relative quantum yield $\phi$ of 1, the relative quantum yield $\phi$ of the zinc-substituted cytochrome c552 is 0.86, which is substantially the same as that of the zinc-substituted cytochrome c.

Figure 17:
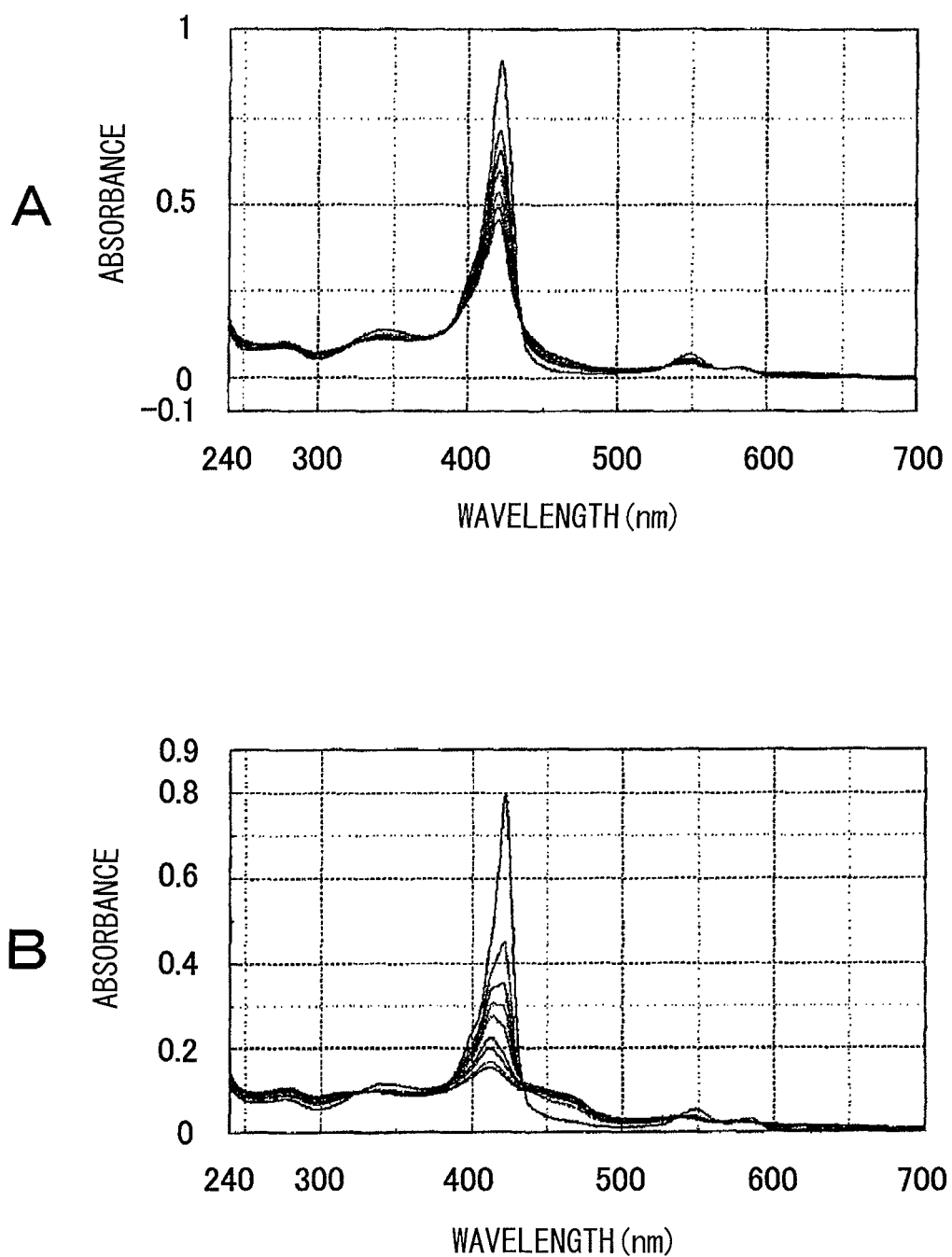
FIG. 17 is a schematic diagram for describing photolysis of the zinc-substituted cytochrome c552 and the zinc-substituted cytochrome c.

It is known that the zinc-substituted cytochrome c is rapidly decomposed by irradiation with light. Accordingly, the photolysis rates of samples of the zinc-substituted cytochrome c552 and the zinc-substituted cytochrome c were determined by irradiation with blue light with a most susceptible absorption maximum wavelength of 420 nm by which the samples were most affected. Approximately 3 µM protein solution, 1 mL was put into a quartz spectrophotometer cuvette and was irradiated with blue light with a wavelength of 420 nm (1630 µW) while the absorption spectrum was measured every 30 minutes. FIGS. 17A and B illustrate results of measurement of absorption spectra of the zinc-substituted cytochrome c552 and the zinc-substituted cytochrome c, respectively. As is clear from FIGS. 17A and B, while the absorption spectrum of the zinc-substituted cytochrome c was greatly changed, the absorption spectrum of the zinc-substituted cytochrome c552 was slightly changed; therefore, the zinc-substituted cytochrome c552 is stable to irradiation with light.

Figure 18:
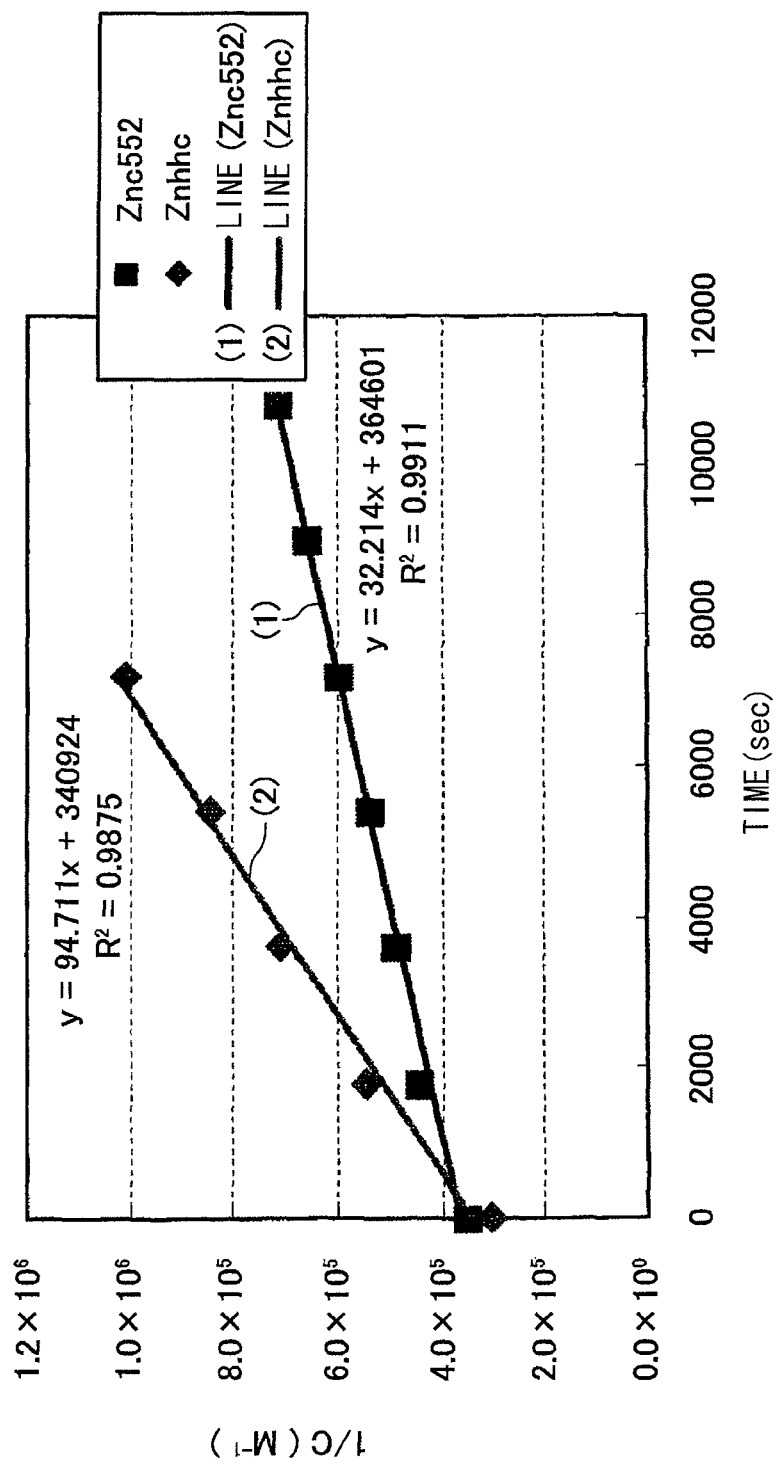
FIG. 18 is a schematic diagram illustrating an example of fitting of second-order reaction equations of photolysis reactions of a zinc-substituted cytochrome c552 and a zinc-substituted cytochrome c.

A concentration (C) was calculated from the absorbance at a wavelength of 422 nm with use of the millimolar absorption coefficient (refer to Table 1), and the inverse 1/C of the concentration C was plotted with respect to time. The results are illustrated in FIG. 18. According to FIG. 18, a photolysis rate constant k determined from the gradient of an obtained line was 33 ($\pm$1.5) M−1 s−1, which is one third of that of the zinc-substituted cytochrome c (k=96$\pm$7.1 M−1 s−1). This result means that the photolysis of the zinc-substituted cytochrome c552 by irradiation with light is three times as slow as that of the zinc-substituted cytochrome c, that is, the zinc-substituted cytochrome c552 is three times as stable as the zinc-substituted cytochrome c. This photolysis reaction is a secondary reaction between the zinc-substituted cytochrome c552 or the zinc-substituted cytochrome c and oxygen.

Figure 19:
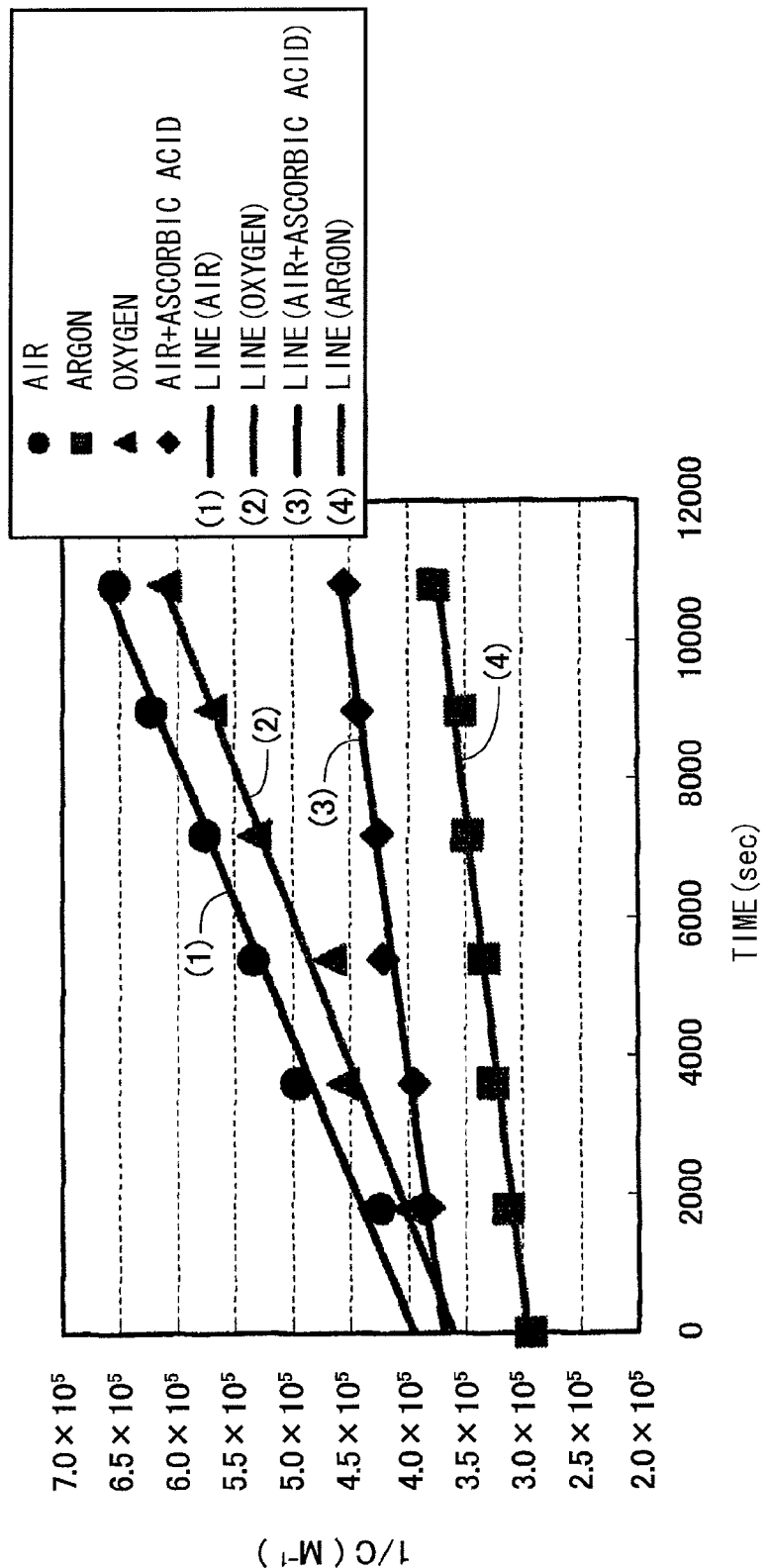
FIG. 19 is a schematic diagram for describing an effect of inhibiting a photolysis reaction of a zinc-substituted cytochrome c552 by removing oxygen and a radial.

FIG. 19 illustrates results of measurement of the photolysis rate of the zinc-substituted cytochrome c552 under irradiation with light in air, argon, oxygen and a mixed gas formed by adding ascorbic acid to air. Specifically, irradiation with light in argon was carried out by hermetically sealing a cuvette and supplying pure argon to the cuvette for 15 minutes to remove oxygen. Moreover, irradiation with light in oxygen was carried out by hermetically sealing the cuvette and supplying pure oxygen to the cuvette for 15 minutes. Further, irradiation with light in ascorbic acid in an air atmosphere was carried out by opening the cuvette and adding 10 mM ascorbic acid (pH 7.0) as a radical-trapping agent. According to FIG. 19, a photolysis rate constant k for irradiation with light in an oxygen-free atmosphere was 7.1 M−1 s−1, and a photodecomposition rate constant k for irradiation with light in a radical-free atmosphere was 8.1 M−1 s−1, and the gradients of lines were gentler than that for irradiation with light in air or oxygen. In other words, it is clear that the photolysis reaction of the zinc-substituted cytochrome c552 is allowed to be suppressed by using an oxygen-free (argon-substituted) atmosphere or by adding ascorbic acid.

As described above, the zinc-substituted cytochrome c552 is a superior fluorescent protein for blue-light photoelectric transducer having the same optical properties (photon absorption and light emission) as the zinc-substituted cytochrome c and also having high chemical and physical stability.

c. Photocurrent of Zinc-Substituted-Cytochrome-c552-Immobilized Electrode

An example of the blue-light photoelectric transducer using the zinc-substituted-cytochrome-c552-immobilized electrode formed by immobilizing a zinc-substituted cytochrome c552 on the gold electrode will be described below.

The zinc-substituted-cytochrome-c552-immobilized electrode was formed in the following manner.

A 0.1 mM ethanol solution was prepared by mixing 1-undecanethiol (HS(CH$_2$)$_{10}$CH$_3$) as a hydrophobic thiol and 1-hydroxy-11-undecanethiol (HS(CH$_2$)$_{10}$CH$_2$OH) as a hydrophilic thiol at a ratio of 25:75. A clean gold drop electrode was immersed in this solution, and was left standing at room temperature for one day. Thus, a self-assembled monolayer was formed on a surface of the gold drop electrode.

After this electrode was rinsed with ultrapure water, the electrode was immersed in a 50 µM zinc-substituted cytochrome c552 solution (c10 mM tris-hydrochloric acid buffer solution (pH 7.6), 50 mM KCl), and was incubated at room temperature for 30 minutes or over. Thus, the zinc-substituted-cytochrome-c552-immobilized electrode in which a zinc-substituted cytochrome c552 was immobilized on the surface of the gold drop electrode with the self-assembled monolayer in between was formed.

Figure 20:
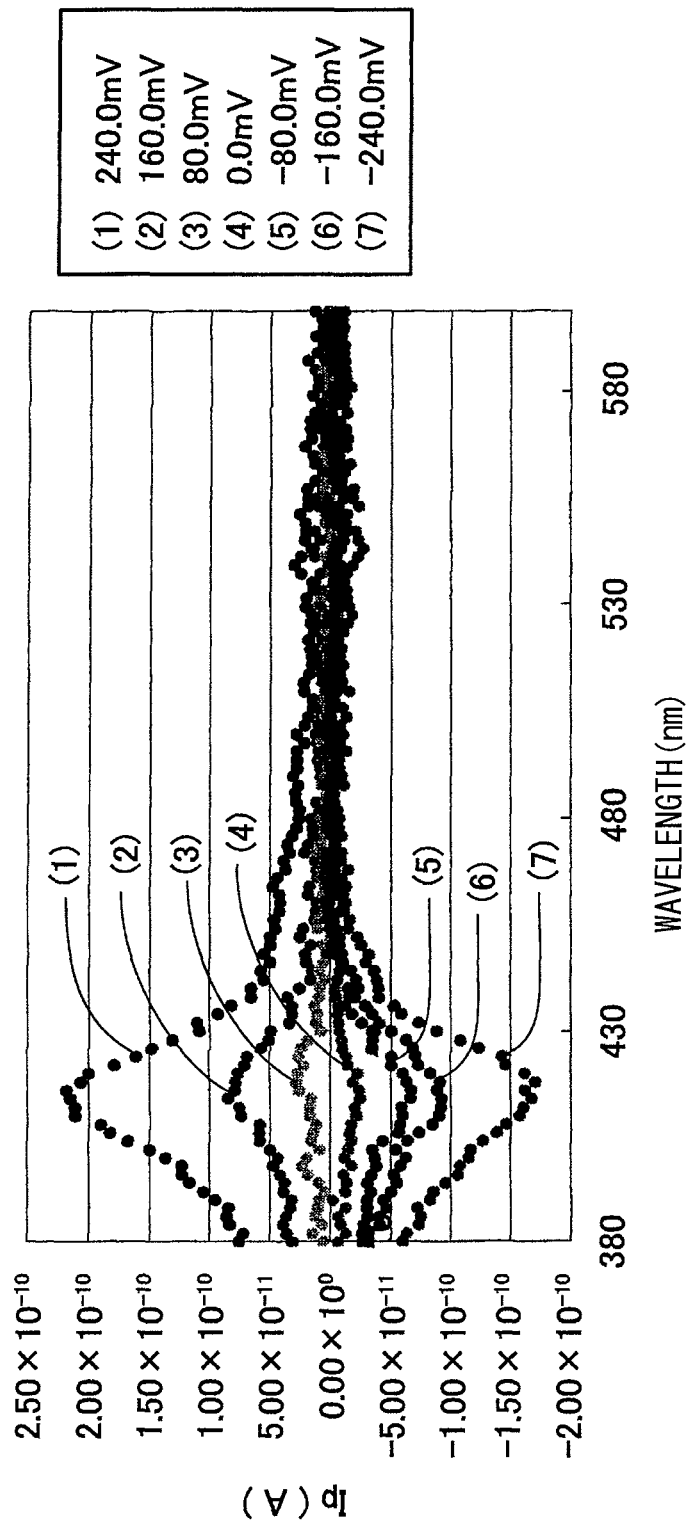
FIG. 20 is a schematic diagram illustrating measurement results of photocurrent action spectra of a zinc-substituted-cytochrome-c552-immobilized gold drop electrode.

An optical experimental system capable of uniformly irradiating an entire surface of the zinc-substituted-cytochrome-c552-immobilized electrode formed in such a manner with monochromatic light was arranged. Then, the zinc-substituted-cytochrome-c552-immobilized electrode as a working electrode, a silver-silver chloride electrode as a reference electrode and a platinum wire as a counter electrode were connected to a potentiostat and were immersed in a 10 mM phosphoric acid buffer aqueous solution (pH 7.0) containing 0.25 mM potassium ferrocyanide. A xenon lamp (150 W) was used as a light source In a state where a bias voltage was applied to the zinc-substituted-cytochrome-c552-immobilized electrode formed in such a manner with respect to the silver-silver chloride electrode as the reference electrode, the zinc-substituted-cytochrome-c552-immobilized electrode was irradiated with light while scanning the wavelength in 1-nm increments to measure a generated photocurrent. The bias voltage was set to 240.0 mV, 160.0 mV, 80.0 mV, 0.0 mV, −80.0 mV, −160.0 mV, and −240.0 mV. FIG. 20 illustrates obtained photocurrent action spectra. In FIG. 20, a horizontal axis indicates wavelength, and a vertical axis indicates current Ip. As is clear from FIG. 20, the largest photocurrent is obtained around a wavelength of 420 nm. Therefore, the zinc-substituted cytochrome c552 is considered as a fluorescent protein for blue-light photoelectric transducer. Moreover, as is clear from FIG. 20, the polarity (flow direction) of the photocurrent is controllable by adjusting the bias voltage applied to the zinc-substituted-cytochrome-c552-immobilized electrode. This is a noteworthy characteristic of the zinc-substituted-cytochrome-c552-immobilized electrode, compared to a zinc-substituted-cytochrome-c-immobilized electrode which obtains a photocurrent only in a positive direction despite adjustment of the bias voltage. In other words, the zinc-substituted-cytochrome-c552-immobilized electrode may be a photoconductor in the true sense.

As described above, according to the first embodiment, the cytochrome c552 13 having high stability is immobilized on the chemically stable gold electrode 11 with the self-assembled monolayer 12 in between to allow the hydrophobic portion 13a to face the gold electrode 11. Therefore, the cytochrome c552 13 is immobilized on the gold electrode 11 while maintaining its electron transfer properties, and a novel blue-light photoelectric transducer capable of being stably used for a long time is achievable.

This photoelectric transducer is allowed to be used in, for example, an imaging element or a photosensor, and optionally in combination with a photocurrent amplifier circuit. The photosensor is allowed to be used for various applications including detection of optical signals, and is also applicable to, for example, artificial retinas. The photoelectric transducer is allowed to be used as a solar cell.

This photoelectric transducer is allowed to be used in various apparatuses and devices using photoelectric conversion, more specifically, for example, an electronic device having a light-sensitive section. The electronic device of this kind is basically not limited and may be either portable or stationary, and specific examples of the electronic device include digital cameras, camcorders (videotape recorders) and the like.

2. Second Embodiment

Blue-Light Photoelectric Transducer

Figure 21:
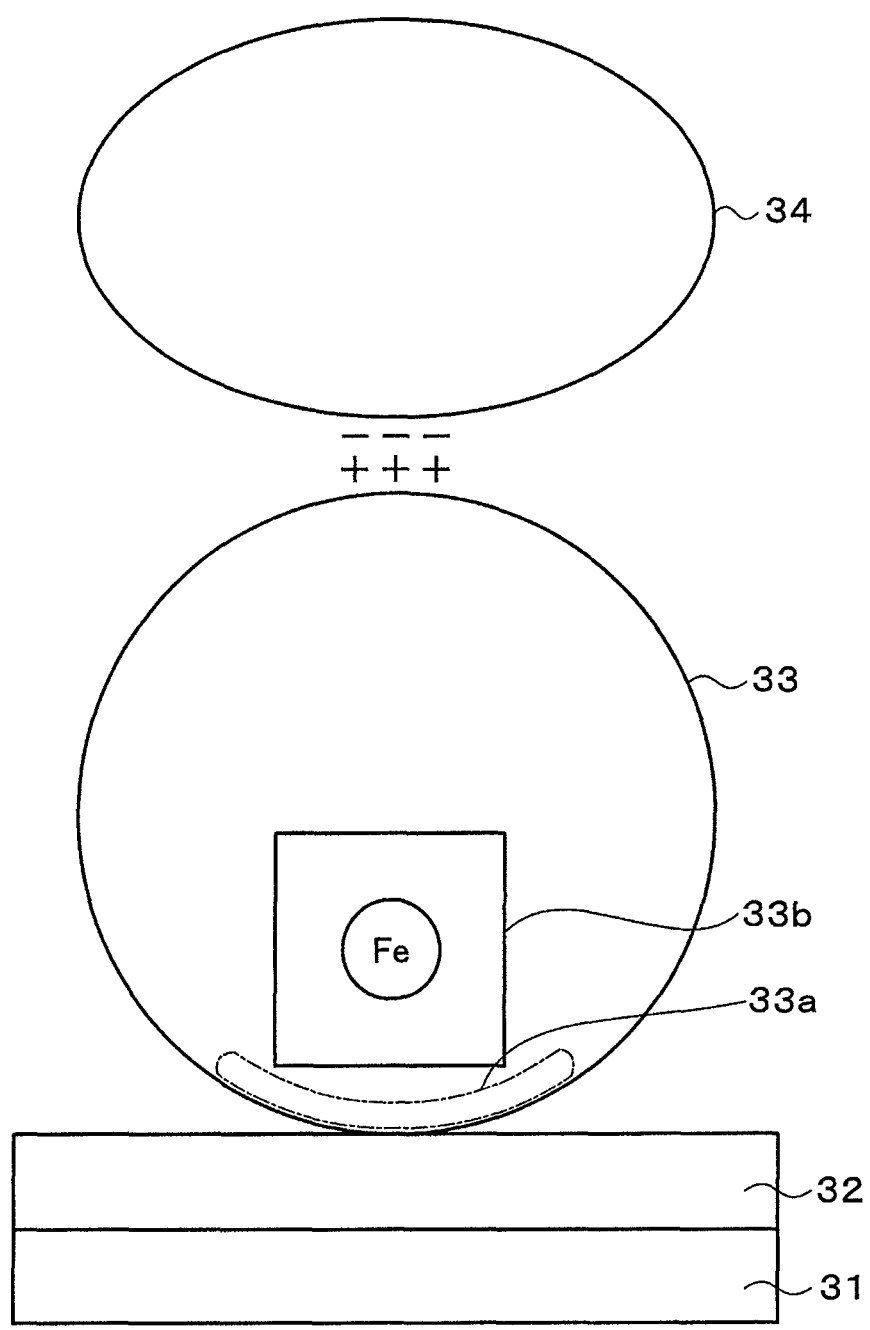
FIG. 21 is a schematic diagram illustrating a blue-light photoelectric transducer according to a second embodiment of the invention.

FIG. 21 illustrates a blue-light photoelectric transducer according to a second embodiment, specifically illustrates a protein-immobilized electrode.

As illustrated in FIG. 21, in this blue-light photoelectric transducer, a cytochrome c552 33 is immobilized on a gold substrate 31 with a self-assembled monolayer 32 in between. In this case, the cytochrome c552 33 is immobilized with a hydrophobic portion 33a thereof facing the gold substrate 31. Iron (Fe) as a central metal is coordinated to a heme 33b inside the cytochrome c552 33. The structure, a surface charge distribution diagram and the like of the cytochrome c552 33 are similar to those in the zinc-substituted cytochrome c552 13 used in the first embodiment.

A fluorescent protein 34 absorbing blue light is electrostatically bonded to the cytochrome c552 33. In this case, a part on a side opposite to a side facing the gold substrate 31 of the cytochrome c552 33 is positively charged; therefore, this part is electrostatically bonded to a negatively charged part of the fluorescent protein 34. As the fluorescent protein 34 absorbing blue light, for example, a zinc-substituted cytochrome c (a horse-heart cytochrome c having zinc substituted for iron as a central metal of a heme) and various kinds of commercially available fluorescent proteins (for example, refer to NPTLs 3 to 5) are allowed to be used, and the fluorescent protein 34 is selected from them as necessary.

The self-assembled monolayer 32 is similar to that in the first embodiment.

When externally incident blue light or light having a blue-light component enters the fluorescent protein 34 absorbing blue light in the photoelectric transducer, electrons of the fluorescent protein 34 are excited by the incident light. The excited electrons are transferred to the cytochrome c552 33 to be extracted as a photocurrent from the gold substrate 31 to outside. Thus, photoelectric conversion is carried out.

In other point, the second embodiment is similar to the first embodiment.

[Method of Manufacturing Photoelectric Transducer]

An example of a method of manufacturing this photoelectric transducer will be described below.

First, as in the case of the first embodiment, the cytochrome c552 33 is absorbed and immobilized with the hydrophobic portion 33a thereof facing the gold electrode 31.

Next, for example, the fluorescent protein 34 absorbing blue light is electrostatically bonded to the cytochrome c552 33 by the same method as a known method of electrostatically bonding a horse-heart cytochrome c to a green fluorescent protein in related art (refer to NPTL 6).

Next, the photoelectric transducer with a configuration similar to that illustrated in, for example, FIG. 9, 10 or 11 is manufactured with use of an cytochrome-c552-immobilized electrode with the fluorescent protein 34 immobilized thereon and a counter electrode (not illustrated).

Example 2

An example of this photoelectric transducer will be described below.
1. Formation of Sample A 0.1 mM ethanol solution was prepared by mixing 1-undecanethiol ($HS(CH_2)_{10}CH_3$) as a hydrophobic thiol and 1-hydroxy-11-undecanethiol ($HS(CH_2)_{10}CH_2OH$) as a hydrophilic thiol at a ratio of 25:75. A clean gold drop electrode or gold flat electrode was immersed in this solution, and was left standing at room temperature for one day. Thus, a self-assembled monolayer was formed on a surface of the gold drop electrode or the gold flat electrode.

After these electrodes were rinsed with ultrapure water, the electrodes were immersed in a 50 µM cytochrome c552 solution (containing 10 mM tris-hydrochloric acid buffer solution (pH 7.6) and 50 mM KCl), and were incubated at room temperature for 30 minutes or over. Thus, the cytochrome-c552-immobilized electrode in which cytochrome c552 was immobilized on the surface of the gold drop electrode or the gold flat electrode with the self-assembled monolayer in between was formed.

After that, the fluorescent protein 34 absorbing blue light is electrostatically bonded to the cytochrome c552 33 by the same method as the known method of electrostatically bonding a horse-heart cytochrome c to a green fluorescent protein in related art (refer to NPTL 5).

Figure 22:
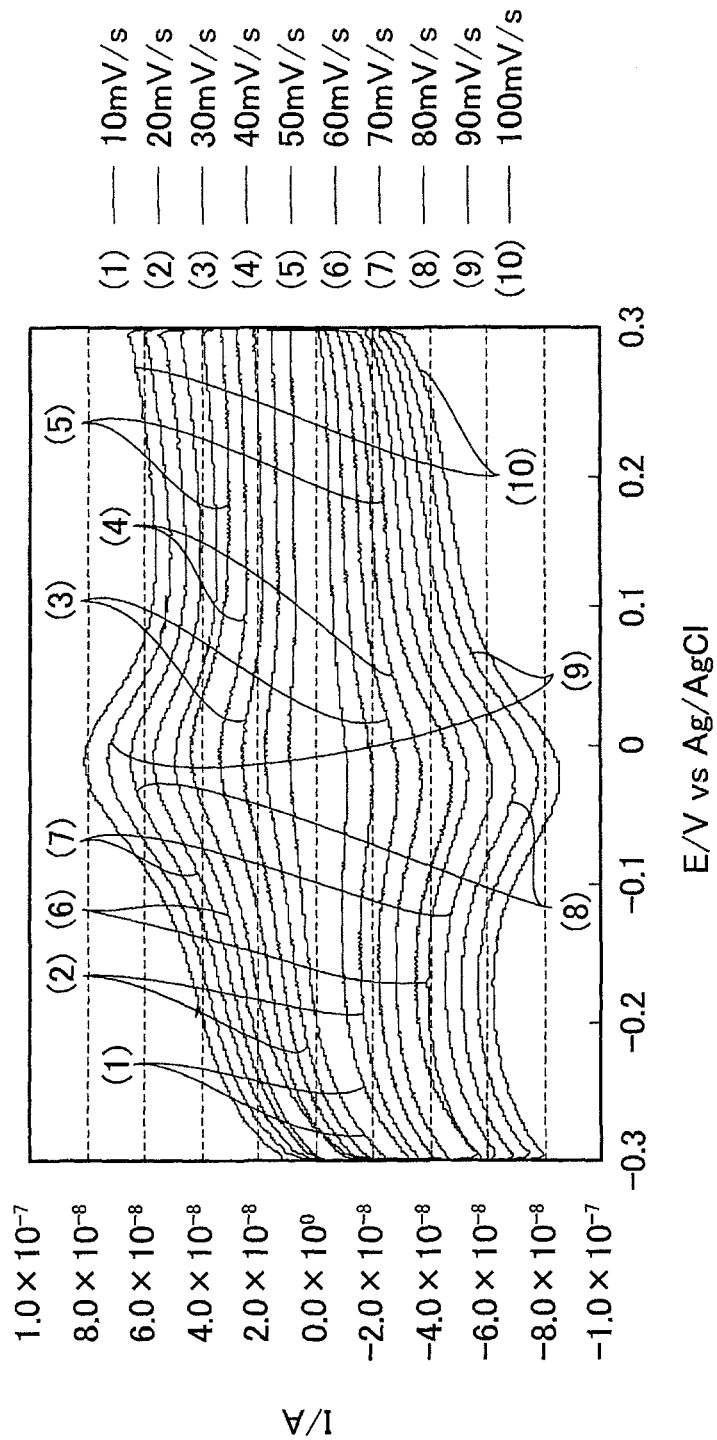
FIG. 22 is a schematic diagram illustrating results of cyclic voltammetry performed with use of a cytochrome-c552-immobilized electrode.
Figure 23:
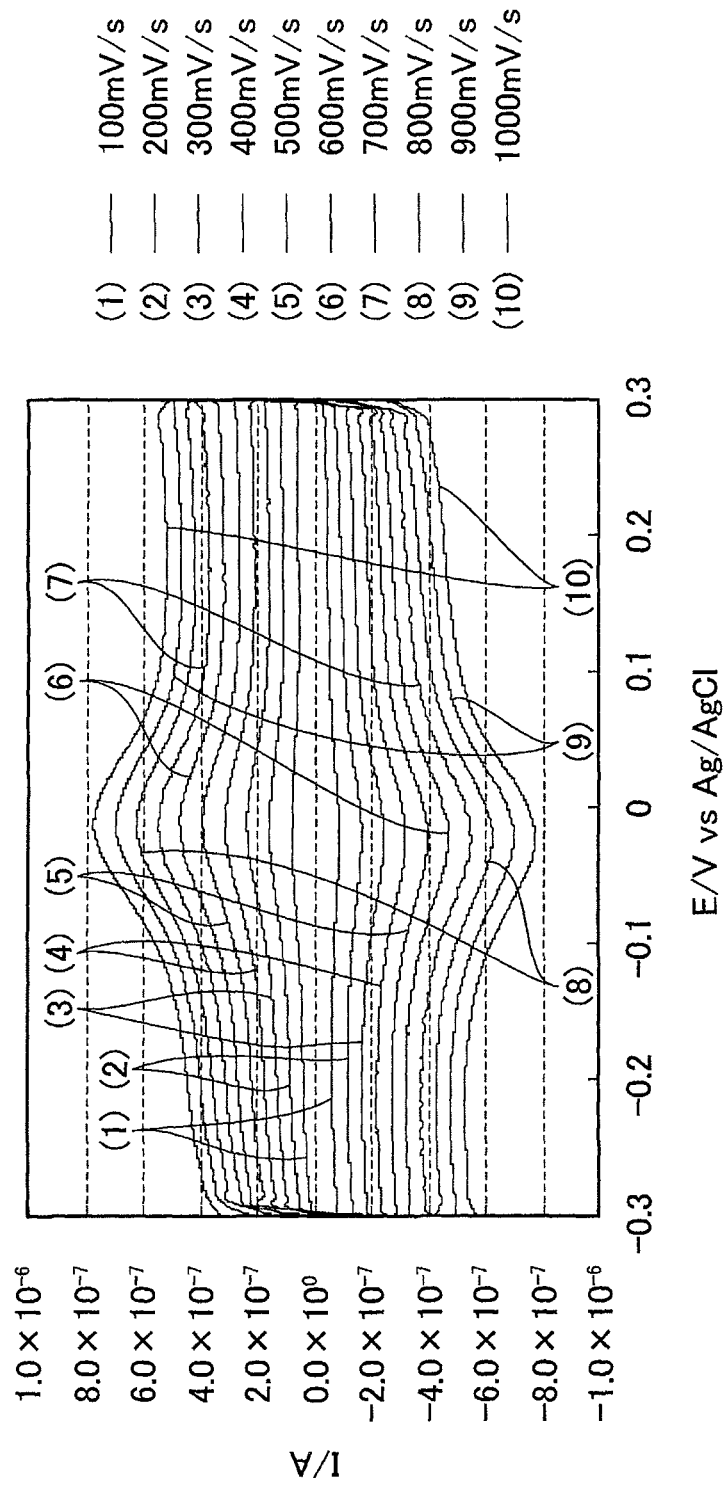
FIG. 23 is a schematic diagram illustrating results of cyclic voltammetry performed with use of the cytochrome-c552-immobilized electrode.

Cyclic voltammetry was performed with use of the cytochrome-c552-immobilized electrode in which the cytochrome c552 was immobilized on the surface of the gold drop electrode or the gold flat electrode with the self-assembled monolayer in between. FIGS. 22 and 23 illustrate results of the cyclic voltammetry. In FIGS. 22 and 23, I refers to current (A), E refers to potential (V) with respect to a reference electrode (Ag/AgCl) (hereinafter the same applies). FIGS. 22 and 23 illustrate typical adsorptive cyclic voltammograms without peak separation. The cyclic voltammograms illustrated in FIG. 22 are results measured at potential scan rates ranging from 10 to 100 mV/s in 10-mV/s increments. Moreover, the cyclic voltammograms shown in FIG. 23 are results measured at potential scan rates ranging from 100 to 1000 mV/s in 100-mV/s increments.

As is clear from FIGS. 22 and 23, this cytochrome-c552-immobilized electrode had no peak separation at potential scan rates ranging from 10 to 1000 mV/s. This means that a heme pocket of cytochrome c552 in this cytochrome-c552-immobilized electrode was optimally oriented to the gold electrode.

Figure 24:
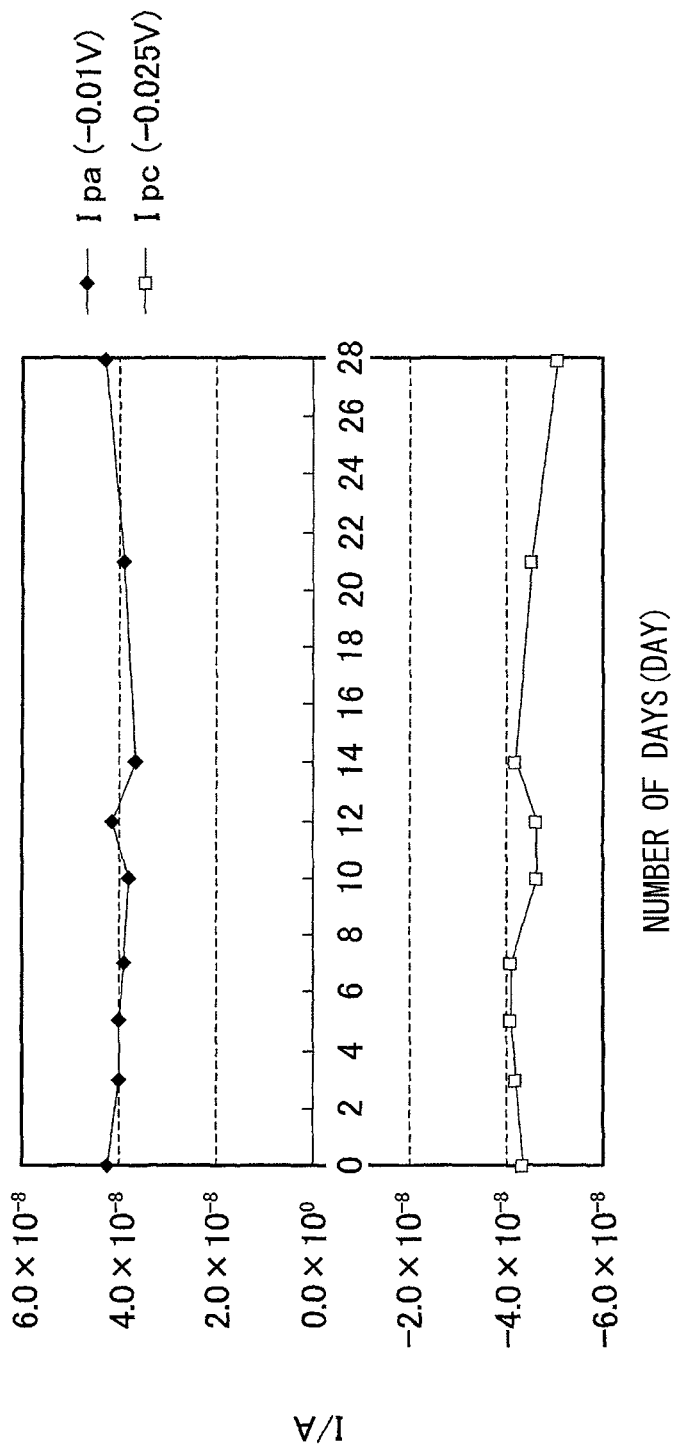
FIG. 24 is a schematic diagram illustrating daily changes in current value when the cytochrome-c552-immobilized electrode is stored in a protein solution at room temperature.

FIG. 24 illustrates daily changes in current value (anodic current Ipa and cathodic current Ica) when the cytochrome-c552-immobilized electrode was stored in a protein solution at room temperature. As illustrated in FIG. 24, this cytochrome-c552-immobilized electrode obtained the same oxidation-reduction current value after being stored in the protein solution at room temperature for one month. On the other hand, in the same experiment carried out with use of a horse-heart cytochrome c, the current value decreased with time, and peak separation appeared in the cyclic voltammogram of the horse-heart cytochrome c.

Next, comparison data in the case where the heme of the cytochrome c552 in the cytochrome-c552-immobilized electrode was oriented in a direction opposite to the direction of the heme of the cytochrome c552 in the cytochrome-c552-immobilized electrode in the example, that is, in the case where the heme faces away from the gold electrode will be described below. More specifically, data in the case where the cytochrome c552 was immobilized on the gold electrode with use of a self-assembled monolayer having a different end, that is, the case where the cytochrome c552 was immobilized in a wrong orientation will be described below.

Figure 25:
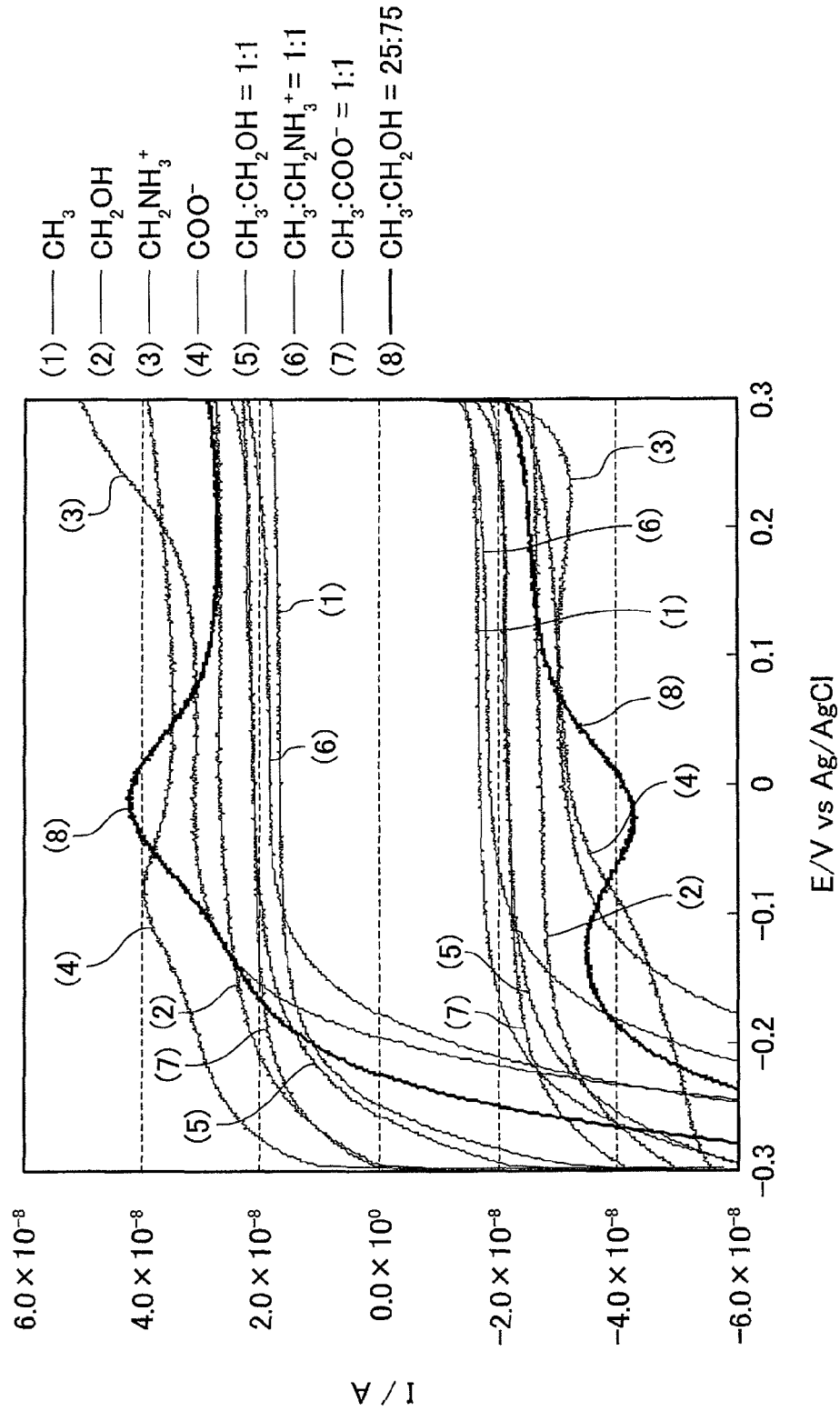
FIG. 25 is a schematic diagram illustrating results of cyclic voltammetry performed with use of cytochrome-c552-immobilized electrodes.

More specifically, cyclic voltammetry was performed with use of cytochrome-c552-immobilized electrodes in which a cytochrome c552 was immobilized on gold electrodes with use of thiols ($HS(CH_2)_{10}R$) having ten carbon atoms and different ends (—R). FIG. 25 illustrates obtained cyclic voltammograms. In this case, as a buffer solution, a 10 mM sodium phosphate solution (pH 7.0) was used, and the potential scan rate was 50 mV/s.

According to FIG. 25, although protein-like oxidation/reduction peaks appeared in the case where the terminal (—R) was —COO$^-$, such peaks disappeared eventually after repeated oxidation-reduction cycles. As a result, it is clear that in the case where the cytochrome c552 is immobilized on the gold electrode in a wrong orientation, functions of the cytochrome c552 are not allowed to be maintained.

Next, results of cyclic voltammetry performed with use of cytochrome c552 solutions with different KCl concentrations used for the formation of the above-described cytochrome-c552-immobilized electrode will be described below.

In the measurement, as a buffer solution, a 10 mM phosphoric acid-Na solution (pH 7.0) was used, and the potential scan rate was 50 mV/s. As the cytochrome-c552-immobilized electrode, as described above, cytochrome-c552-immobilized electrodes in which the cytochrome c552 was immobilized on gold drop electrodes with self-assembled monolayers formed using $HS(CH_2)_{10}CH_3$ and $HS(CH_3)_{10}CH_2OH$ in between were used. In addition, the diameter of the gold drop electrode was 2.5 mm.

Figure 26:
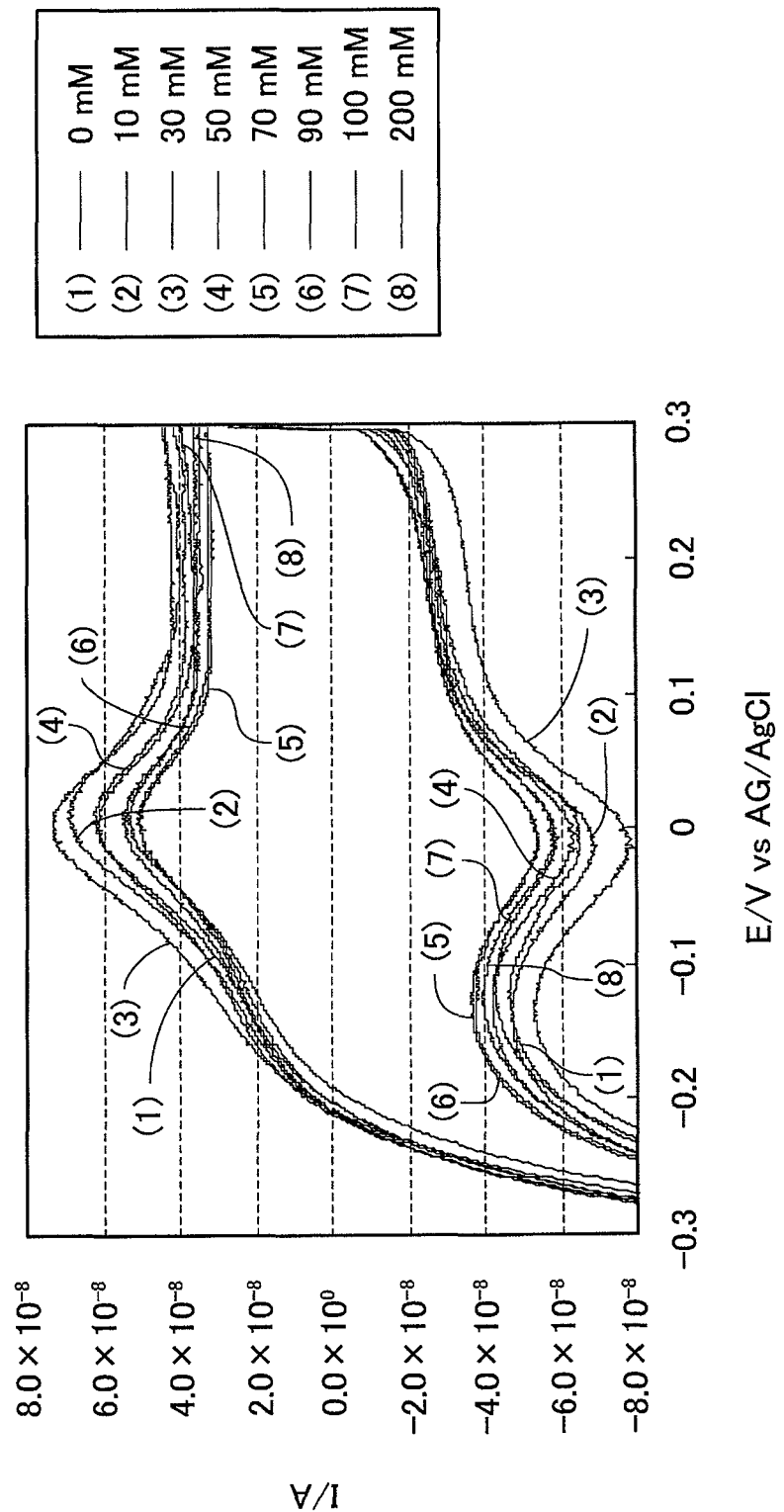
FIG. 26 is a schematic diagram illustrating results of cyclic voltammetry performed with use of cytochrome-c552-immobilized electrodes.

FIG. 26 illustrates obtained cyclic voltammograms. In this case, as the buffer solution in the cytochrome c552 solutions, a 10 mM tris-hydrochloric acid buffer solution (pH 7.6) was used. As the range of KCl concentration in the cytochrome c552 solutions in which the cytochrome c552 is allowed to be immobilized is 0 to 200 mM, cyclic voltammetry was performed by varying KCl concentrations within this range.

Figure 27:
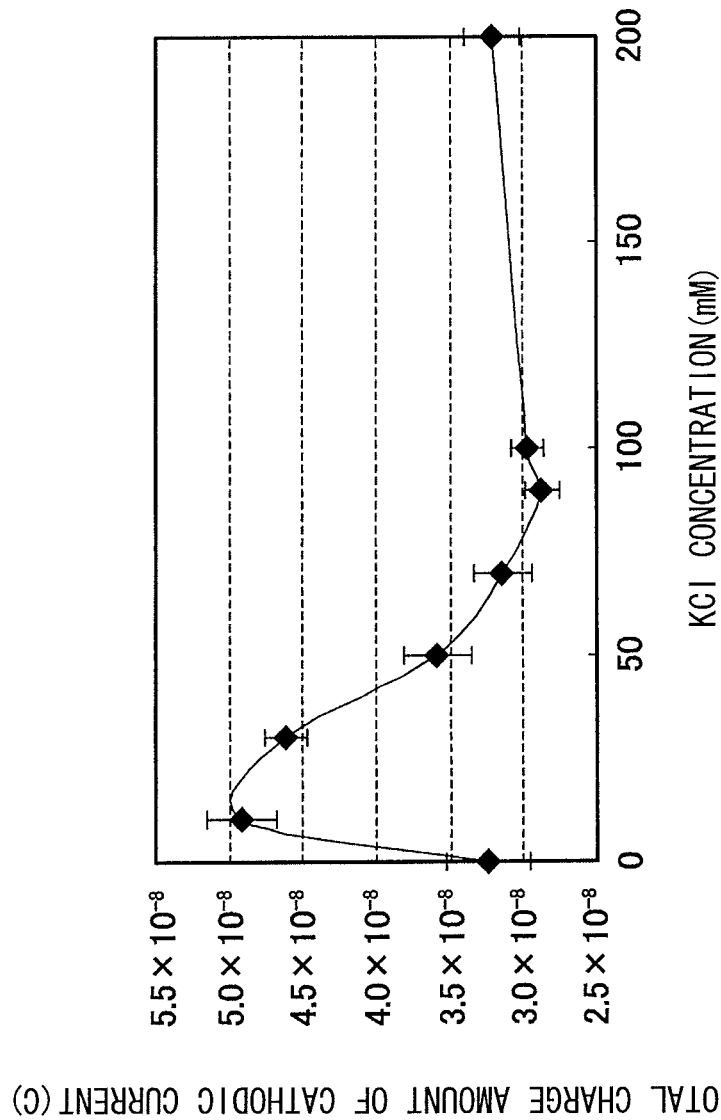
FIG. 27 is a schematic diagram illustrating results of cyclic voltammetry performed with use of cytochrome-c552-immobilized electrodes formed by using cytochrome-c552 solutions with different KCl concentrations.

FIG. 27 illustrates a graph obtained by plotting, with respect to KCl concentration, a total charge amount determined by integrating cathodic currents (downward peaks) of the cyclic voltammograms illustrated in FIG. 26. As is clear from FIG. 27, an optimum KCl concentration is 10 to 30 mM. In the optimum concentration, the amount of the cytochrome c552 immobilized is approximately 1.5 times as large as that in the case where the cytochrome c552 solution contains no KCl, that is, the KCl concentration is 0 mM, or in the case where the KCl concentration is 50 mM or more. In the case where the KCl concentration is higher than 100 mM, desorption of the cytochrome c552 and the self-assembled monolayer is observed.

Next, the self-assembled monolayers were formed with use of ethanol solutions of $HS(CH_2)_{10}CH_3$ and $HS(CH_2)_{10}CH_2OH$ in varying ratios of $HS(CH_2)_{10}CH_3$ and $HS(CH_2)_{10}CH_2OH$. Then, cyclic voltammetry was performed on cytochrome-c552-immobilized electrodes formed by immobilizing the cytochrome c552 on the gold electrodes with the self-assembled monolayers in between. In the measurement, as the buffer solution, a 10 mM phosphoric acid-Na solution (pH7.0) was used, and the potential scan rate was 50 mV/s.

Figure 28:
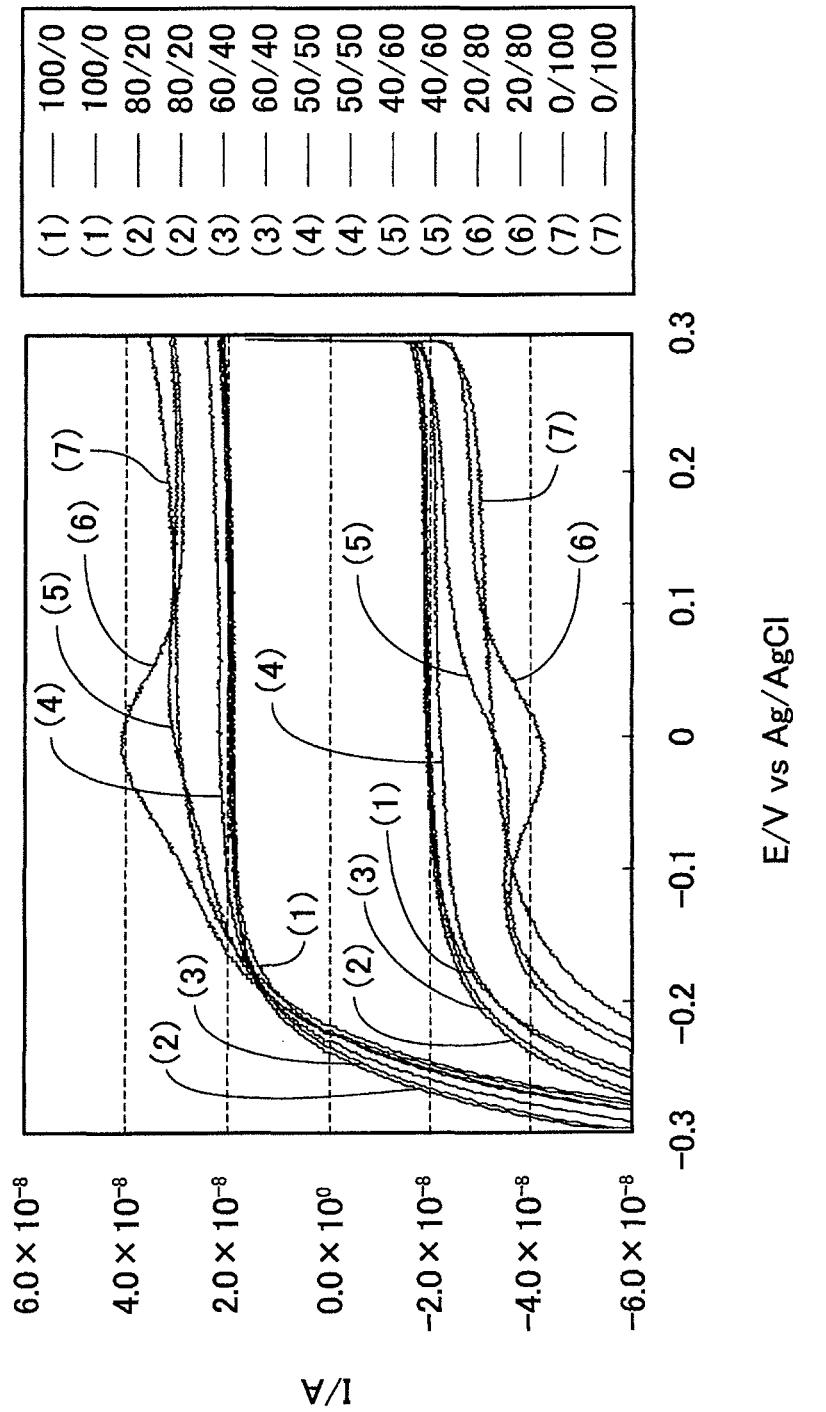
FIG. 28 is a schematic diagram illustrating results of cyclic voltammetry performed with use of cytochrome-c552-immobilized electrodes formed by using different contents of HS(CH$_3$)$_{10}$CH$_2$OH used for formation of self-assembled monolayers.

FIG. 28 illustrates obtained cyclic voltammograms. Values in a footnote indicate ($[HS(CH_2)_{10}CH_3]/[HS(CH_2)_{10}CH_2OH]$), and, for example, "(20/80)" means that the content of $HS(CH_2)_{10}CH_3$ is 20% and the content of $HS(CH_2)_{10}CH_2OH$ is 80%.

Based on the results illustrated in FIG. 28, further measurement was performed by finely varying the content of $HS(CH_2)_{10}CH_2OH$ within a range of 60 to 95% in 5% increments in the total amount of $HS(CH_2)_{10}CH_3$ and $HS(CH_2)_{10}CH_2OH$. Results thereof are illustrated in FIG. 29.

Figure 29:
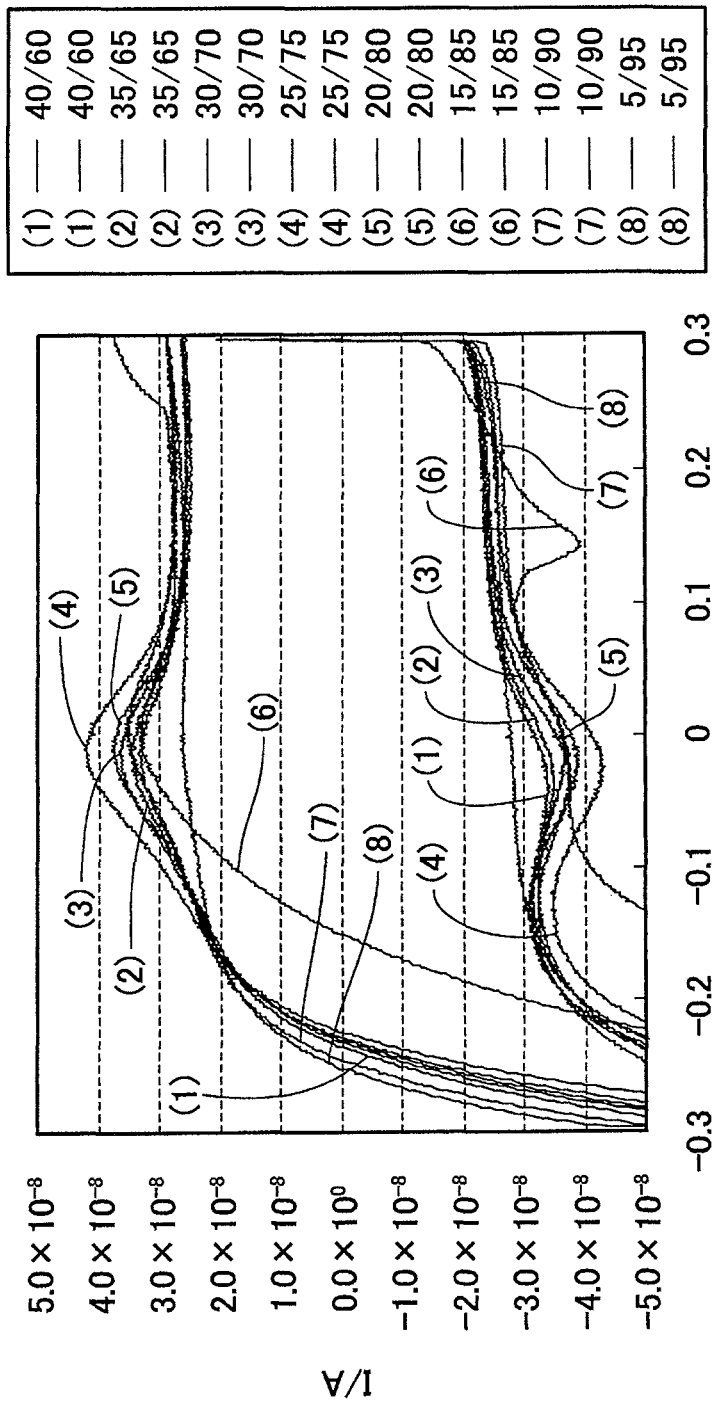
FIG. 29 is a schematic diagram illustrating results of cyclic voltammetry performed with use of cytochrome-c552-immobilized electrodes formed by using different contents of HS(CH$_3$)$_{10}$CH$_2$OH used for formation of self-assembled monolayers.
Figure 30:
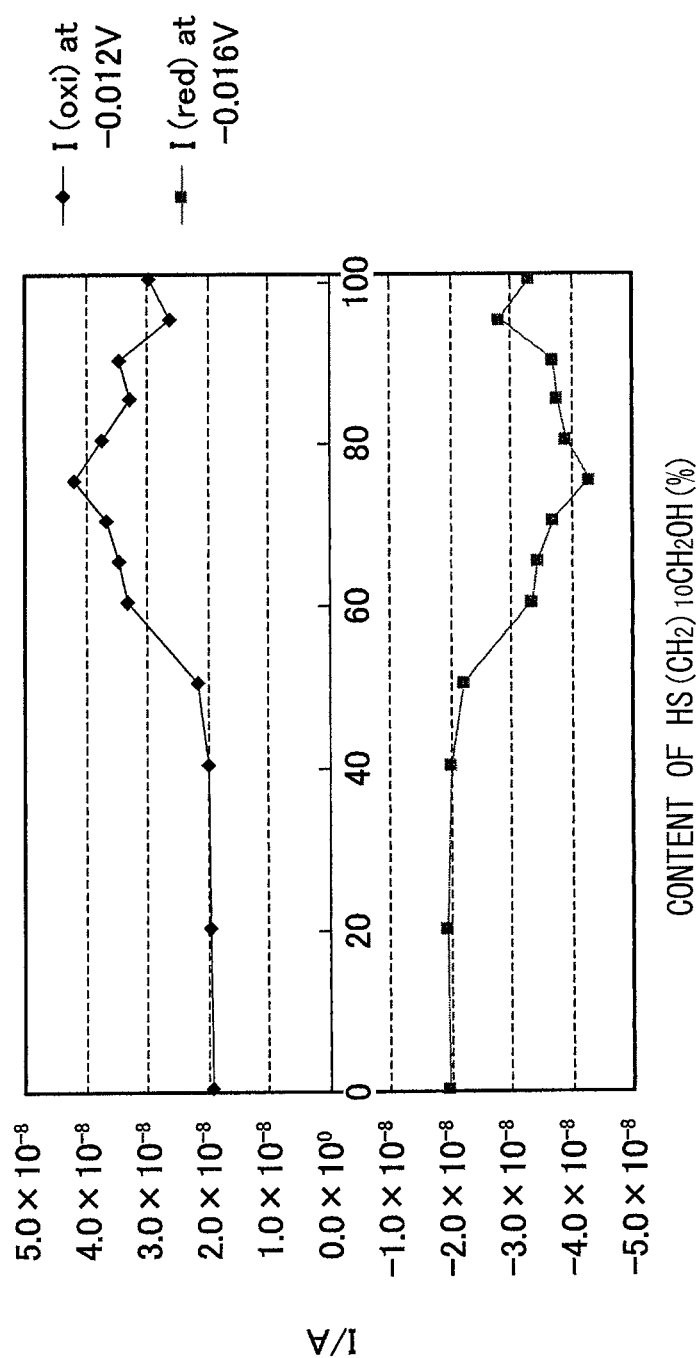
FIG. 30 is a diagram obtained by plotting, with respect to contents of HS(CH$_3$)$_{10}$CH$_2$OH in materials used for formation of self-assembled monolayers, current values at peaks in cyclic voltammograms obtained by cyclic voltammetry performed with use of cytochrome-c552-immobilized electrodes formed by using different contents of HS(CH$_3$)$_{10}$CH$_2$OH.

FIG. 30 illustrates a graph obtained by plotting current values at oxidation/reduction peaks in the results illustrated in FIGS. 28 and 29 with respect to the content of $HS(CH_2)_{10}CH_2OH$. As is clear from FIG. 30, the cytochrome c552 is allowed to be immobilized favorably when the content of $HS(CH_2)_{10}CH_2OH$ is within a range of 60 to 90%. Although the details are not given, another experiment confirmed that the cytochrome c552 was allowed to be immobilized favorably when the content of $HS(CH_2)_nCH_2OH$ was within a range of 60 to 90% in every case where the hydrophobic thiol was $HS(CH_2)_nCH_3$ (n=5, 8 or 10) and the hydrophilic thiol was $HS(CH_2)_nCH_2OH$ (n=5, 8 or 10).

Next, results of cyclic voltammetry performed by varying the lengths of the hydrophobic thiol and the hydrophilic thiol used for the formation of the self-assembled monolayer will be described below. More specifically, the self-assembled monolayers were formed with use of various combinations of $HS(CH_2)_5CH_3$ or $HS(CH_2)_{10}CH_3$ having a methyl group at an end and 5 or 10 carbon atoms as the hydrophobic thiol and $HS(CH_2)_{10}CH_2OH$ or $HS(CH_2)_5CH_2OH$ having a hydroxymethyl group at an end and 5 or 10 carbon atoms as the hydrophilic thiol. Then, the cytochrome c552 was immobilized on the gold electrodes with the self-assembled monolayers in between. Cyclic voltammetry was performed with use of the cytochrome c552-immobilized electrodes formed in such a manner. Obtained cyclic voltammograms are illustrated in FIG. 31.

Figure 31:
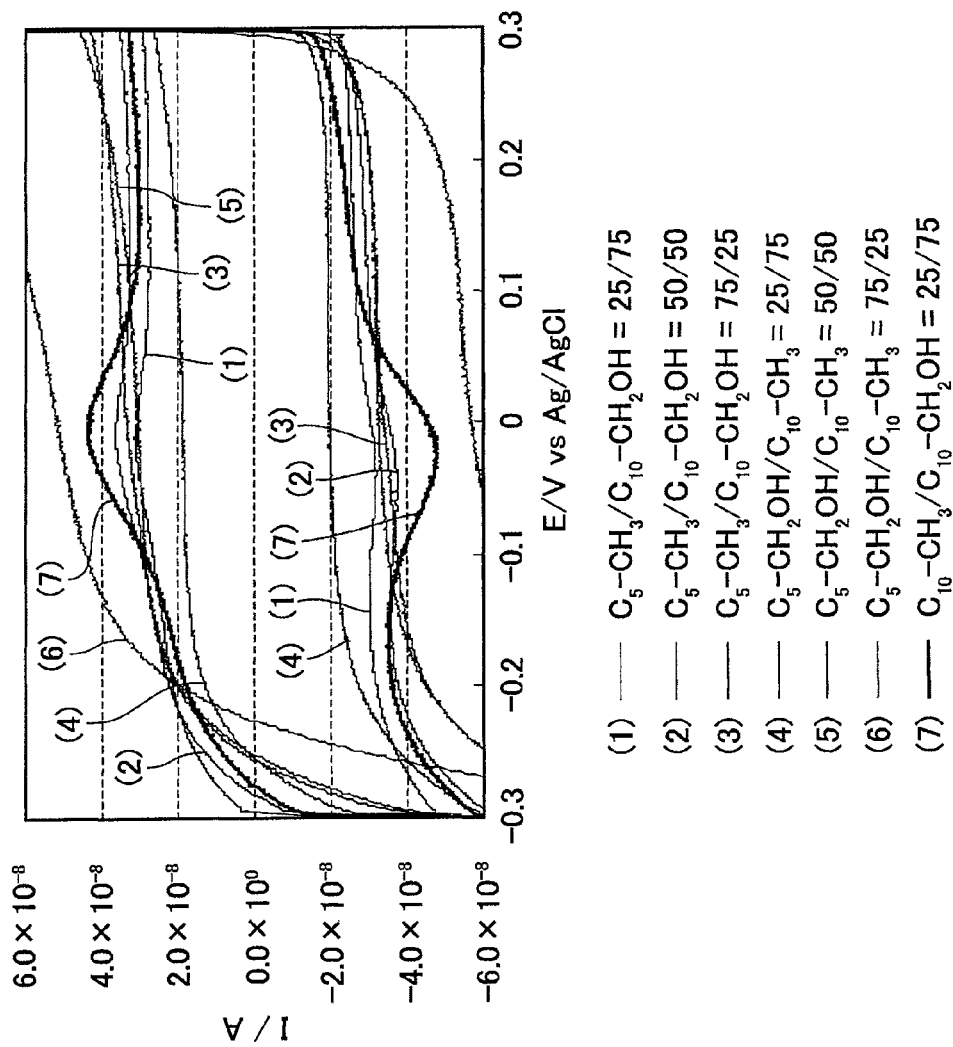
FIG. 31 is a schematic diagram illustrating results of cyclic voltammetry performed with use of cytochrome-c552-immobilized electrodes formed by using hydrophobic thiols and hydrophilic thiols with different lengths used for formation of self-assembled monolayers.

Curves (1), (2), (3), and (7) illustrated in FIG. 31 had a protein-derived peak around 0 V. This means that as long as a balance between the methyl group of the hydrophobic thiol and the hydroxyl group of the hydrophilic thiol used for the formation of the self-assembled monolayer, that is, a balance between the distributions of a hydrophobic group and a hydrophilic group on a surface of the self-assembled monolayer is maintained, even if the numbers of carbons of the hydrophobic thiol and the hydrophilic thiol are changed, the cytochrome c552 is allowed to be immobilized in a similar orientation. As for the hydrophilic thiol, a better result was obtained in the case where the hydrophilic group had 10 carbon atoms, compared to the case where the hydrophilic group had 5 carbon atoms.

As described above, according to the second embodiment, the cytochrome c552 33 having high stability is immobilized on the chemically stable gold electrode 31 with the self-assembled monolayer 32 in between to allow the hydrophobic portion 33a to face the gold electrode 31. Therefore, the cytochrome c552 33 is allowed to be immobilized on the gold electrode 31 while maintaining its electron transfer properties. Then, a blue-light photoelectric transducer capable of being stably used for a long time is achievable by bonding the fluorescent protein 34 absorbing blue light, specifically a fluorescent protein with good thermal stability to the cytochrome c552 33.

3. Third Embodiment

Green-Light or Red-Light Photoelectric Transducer

Figure 32:
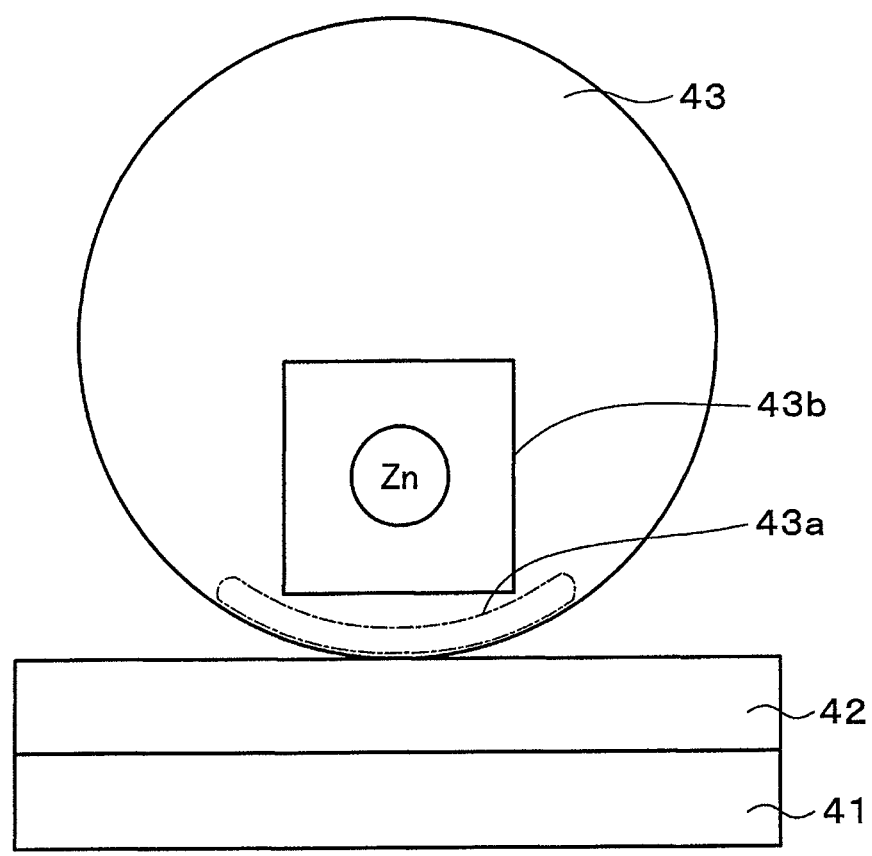
FIG. 32 is a schematic diagram illustrating a green-light or red-light photoelectric transducer according to a third embodiment of the invention.

FIG. 32 illustrates a green-light or red-light photoelectric transducer according to a third embodiment, more specifically a protein-immobilized electrode.

As illustrated in FIG. 32, in this photoelectric transducer, a cytochrome c552 modified zinc-porphyrin 43 absorbing green light or red light is immobilized on a gold electrode 41 with a self-assembled monolayer 42. In this case, the cytochrome c552 modified zinc-porphyrin 43 is immobilized with a hydrophobic portion 43a thereof facing the gold substrate 41. Zinc (Zn) as a central metal is coordinated to a porphyrin 43b inside the cytochrome c552 modified zinc-porphyrin 43.

Figure 33:
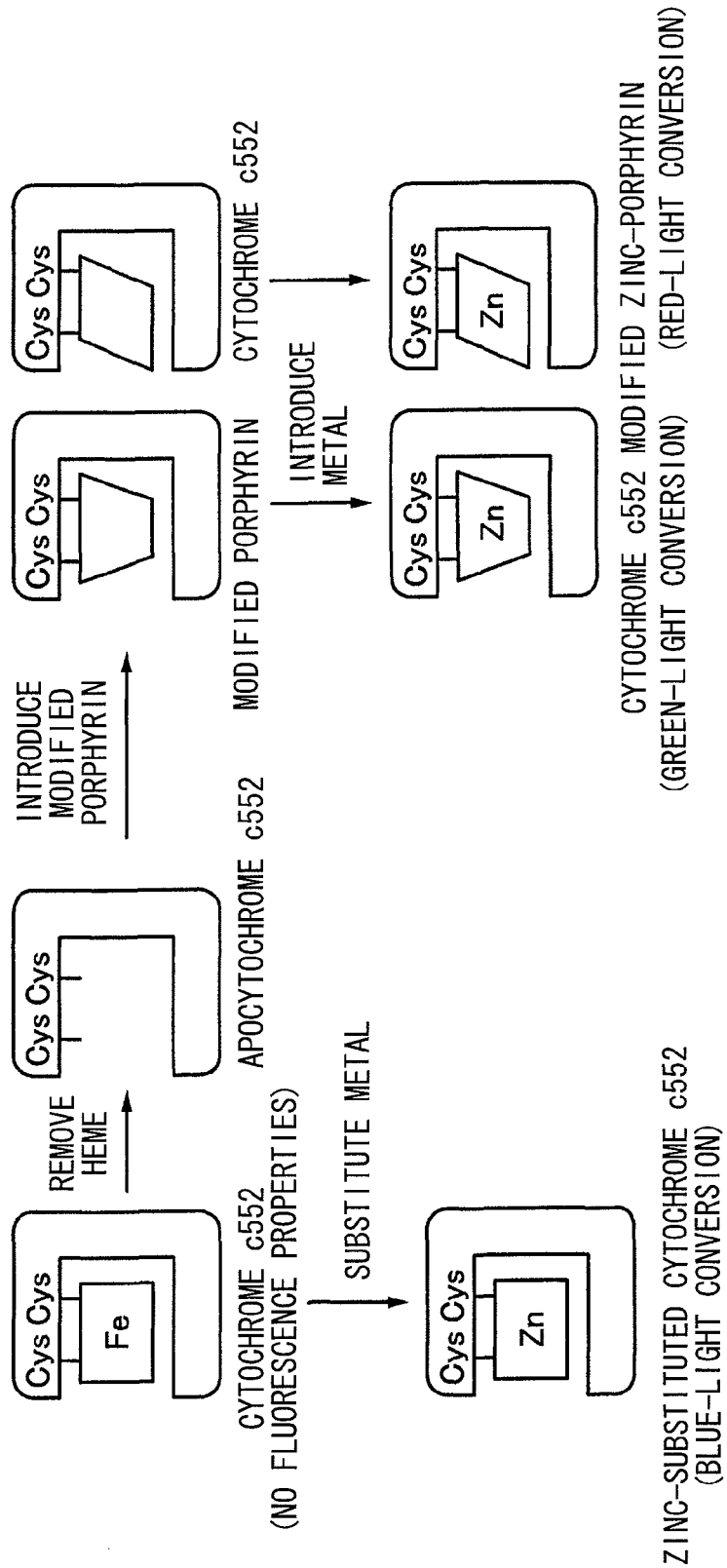
FIG. 33 is a schematic diagram illustrating a method of synthesizing a cytochrome c552 modified zinc-porphyrin.

The cytochrome c552 modified zinc-porphyrin 43 capable of absorbing green light or red light is allowed to be synthesized in the following manner. Namely, the absorption wavelength of a cytochrome c552 is allowed to be changed by modifying a porphyrin thereof. Therefore, first, the absorption wavelength of the cytochrome c552 is adjusted to a red or green wavelength range by modifying the porphyrin. Then, after a synthesized porphyrin modified in such a manner and the cytochrome c552 are reconstituted, zinc as a metal exhibiting fluorescence properties is introduced as a central metal of the porphyrin. A method of synthesizing the cytochrome c552 modified zinc-porphyrin 43 is summarized in FIG. 33.

The method of synthesizing the cytochrome c552 modified zinc-porphyrin 43 will be described in detail below.

[Absorption Wavelength Control by Modification of Porphyrin]

Typically, modification of a porphyrin skeleton allows an absorption wavelength thereof to be greatly changed. A method of controlling the absorption wavelength by modification of the porphyrin skeleton will be described below.

(1) Absorption Properties of Porphyrin

Absorption maximums (absorption maximum wavelengths λmax) of a protoporphyrin (refer to FIG. 34) obtained by removing a metal from a heme contained in the cytochrome c552 are as illustrated in Table 2 (refer to NPTL 7). A fluorescent porphyrin precursor for green-light or red-light conversion is prepared by shifting the absorption maximums, particularly the Soret band, toward a long wavelength side.

TABLE 2

Absorption properties of protoporphyrin

| Solvent | | Soret Band | | | Q Band | | |
|---|---|---|---|---|---|---|---|
| CHCl$_3$ | λmax (nm) | 407 | 505 | 541 | 575 | 603 | 630 |
| | ε (mM$^{-1}$cm$^{-1}$) | 171 | 14.15 | 11.6 | 7.44 | 2.03 | 5.38 |
| Pyridine | λmax (nm) | 409 | 506 | 541 | 576 | 605 | 631 |
| | ε (mM$^{-1}$cm$^{-1}$) | 163 | 14.89 | 11.87 | 7.48 | 2.0 | 5.54 |
| Pyridine Hemochrome*1 | λmax (nm) | 418.5 | 526 | | 557 | | |
| | ε (mM$^{-1}$cm$^{-1}$) | 191.4 | 17.5 | | 34.4 | | |

*1Porphyrin having divalent iron in its center and pyridine coordinated thereto

Figure 34:
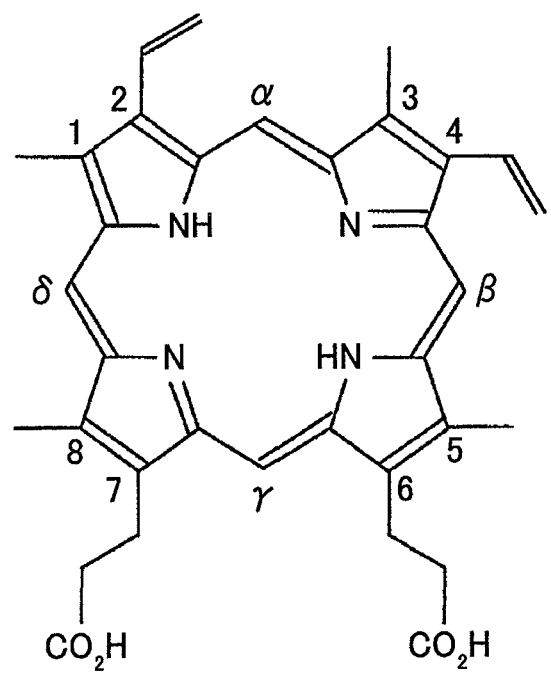
FIG. 34 is a schematic diagram illustrating a protoporphyrin.

In FIG. 34, vinyl groups at 2- and 4-positions of the protoporphyrin are necessary to form covalent bonds with the cytochrome c552, and propionic acid groups at 6- and 7-positions are necessary for the electron transfer function of the cytochrome c552. Therefore, methyl groups at 1-, 3-, 5- and 8-positions of the protoporphyrin or carbon atoms at α-, β-, γ- and δ-positions are modified or substituted.

The protoporphyrin may be used as a starting material or it may be necessary to totally synthesize the protoporphyrin.

(2) Porphyrin for Green-Light Photoelectric Transducer (a) Acetylporphyrin

Figure 35:
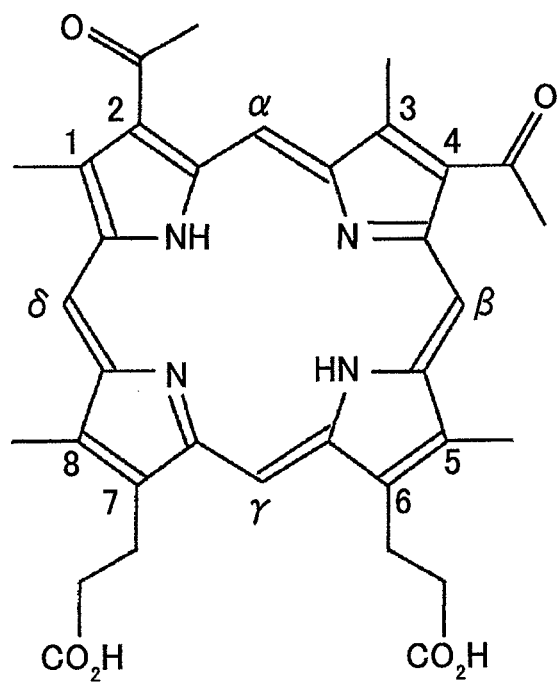
FIG. 35 is a schematic diagram illustrating 2,4-diacetyl-deuteroporphyrin.

The absorption wavelength of a protoporphyrin is allowed to be shifted toward a long wavelength side by adding acetyl groups with high electron-withdrawing properties to the 1-, 3-, 5- and 8-position thereof. As a practical example, the absorption properties of 2,4-diacetyldeuteroporphyrin (FIG. 35) are illustrated in Table 3 (refer to NPTL 7). As is clear from Table 3, the Soret band is shifted from that of the protoporphyrin by approximately 20 nm.

TABLE 3

Absorption properties of diacetylporphyrin

| Solvent | | Soret Band | | Q Band | | |
|---|---|---|---|---|---|---|
| CHCl$_3$ | λmax (nm) | 424.5 | 517 | 552 | 587 | 640 |
| | ε (mM$^{-1}$cm$^{-1}$) | 144 | 13.3 | 7.3 | 6.1 | 3.3 |
| Pyridine Hemochrome | λmax (nm) | 440 | 540 | | 574 | |
| | ε (mM$^{-1}$cm$^{-1}$) | 115.4 | 12.6 | | 13.8 | |

(b) Formylporphyrin

Figure 36:
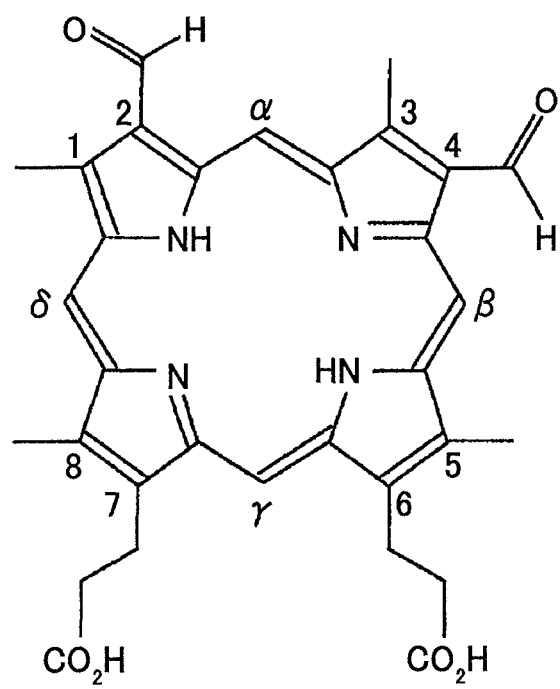
FIG. 36 is a schematic diagram illustrating a diformyldeuteroporphyrin.

The absorption wavelength of a protoporphyrin is allowed to be shifted by adding formyl groups with high electron-withdrawing properties to 1-, 3-, 5- and 8-position thereof. As a practical example, the absorption properties of a diformyl-deuteroporphyrin (FIG. 36) are illustrated in Table 4 (refer to NPTL 7). As is clear from Table 4, the Soret band is shifted from that of the protoporphyrin by approximately 30 nm.

TABLE 4

| Solvent | | Soret Band | | Q Band | | |
|---|---|---|---|---|---|---|
| CHCl$_3$ | λmax (nm) | 436 | 526 | 562 | 595 | 650.5 |
| | ε (mM$^{-1}$cm$^{-1}$) | 137.5 | 12.6 | 7.7 | 6.48 | 3.48 |
| Pyridine Hemochrome | λmax (nm) | 450 | 549.5 | | 586.5 | |
| | ε (mM$^{-1}$cm$^{-1}$) | 131 | 15.4 | | 19.9 | |

(c) Halogenated Porphyrin

Figure 37:
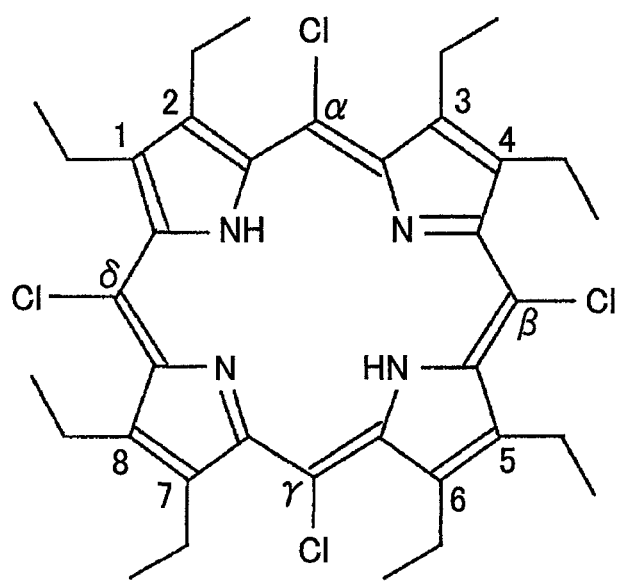
FIG. 37 is a schematic diagram illustrating a mesotetrachlorooctaethylporphyrin.
Figure 38:
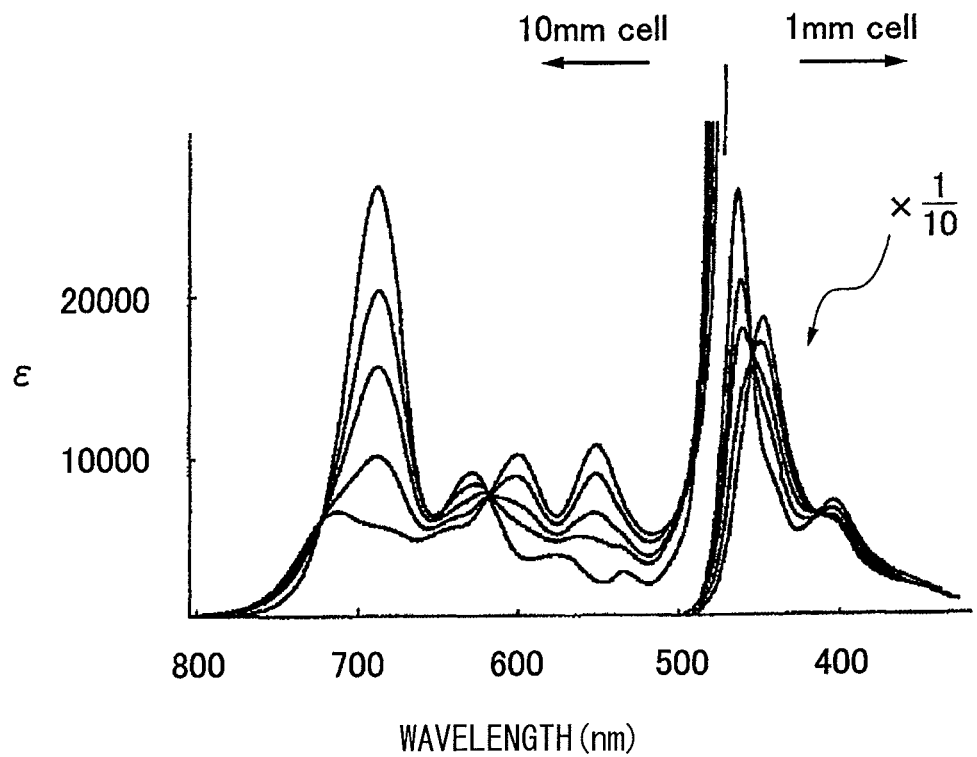
FIG. 38 is a schematic diagram illustrating a measurement result of an absorption spectrum of a mesotetrachlorooctaethylporphyrin.
Figure 39:
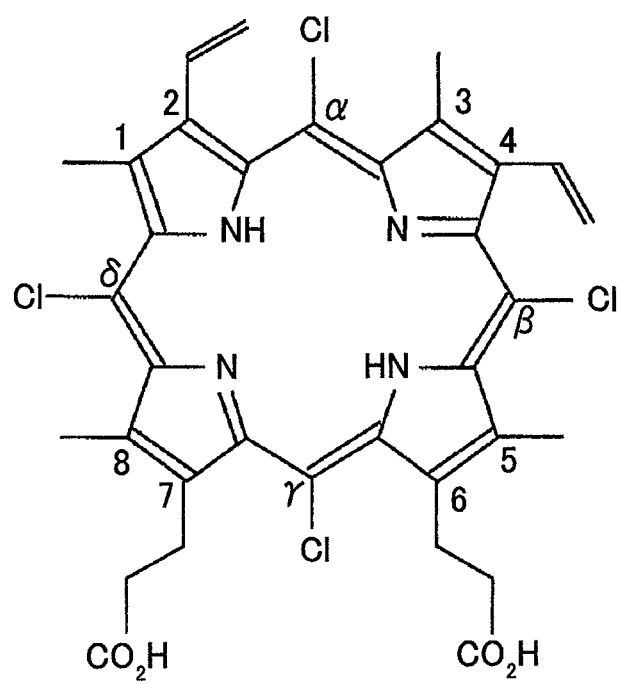
FIG. 39 is a schematic diagram illustrating a mesotetrachloroporphyrin.

The absorption wavelength of a protoporphyrin is allowed to be shifted by adding halogen atoms to carbon atoms at meso positions (α-, β-, γ- and δ-positions) thereof. As a practical example, the absorption spectrum of a mesotetrachlorooctaethylporphyrin (FIG. 37) is illustrated in FIG. 38 (refer to NPTL 8). As illustrated in FIG. 38, strong absorption is achievable around a wavelength of 480 nm. When a mesotetrachloroporphyrin having vinyl groups added to the 2- and 4-positions thereof and propionic acid groups added to the 6- and 7-positions thereof as illustrated in FIG. 39 is synthesized, the mesotetrachloroporphyrin is allowed to be bonded to the cytochrome c552.

(d) Bilirubin

Figure 40:
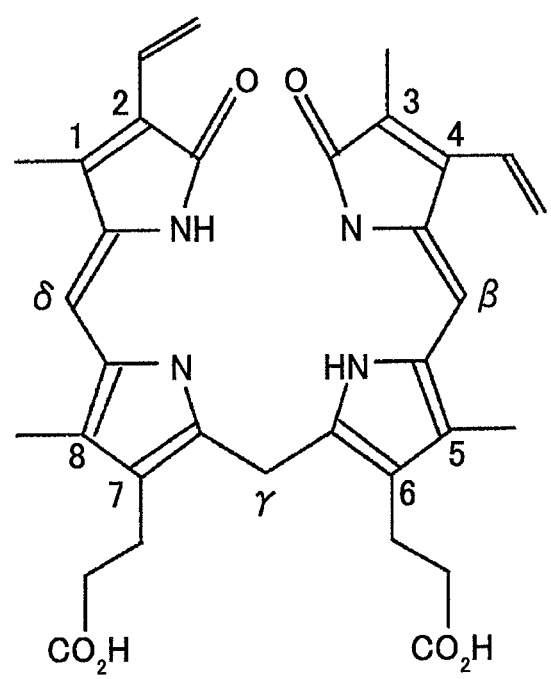
FIG. 40 is a schematic diagram illustrating bilirubin obtained by opening a protoporphyrin ring at the α-position thereof and adding oxygen atoms.
Figure 41:
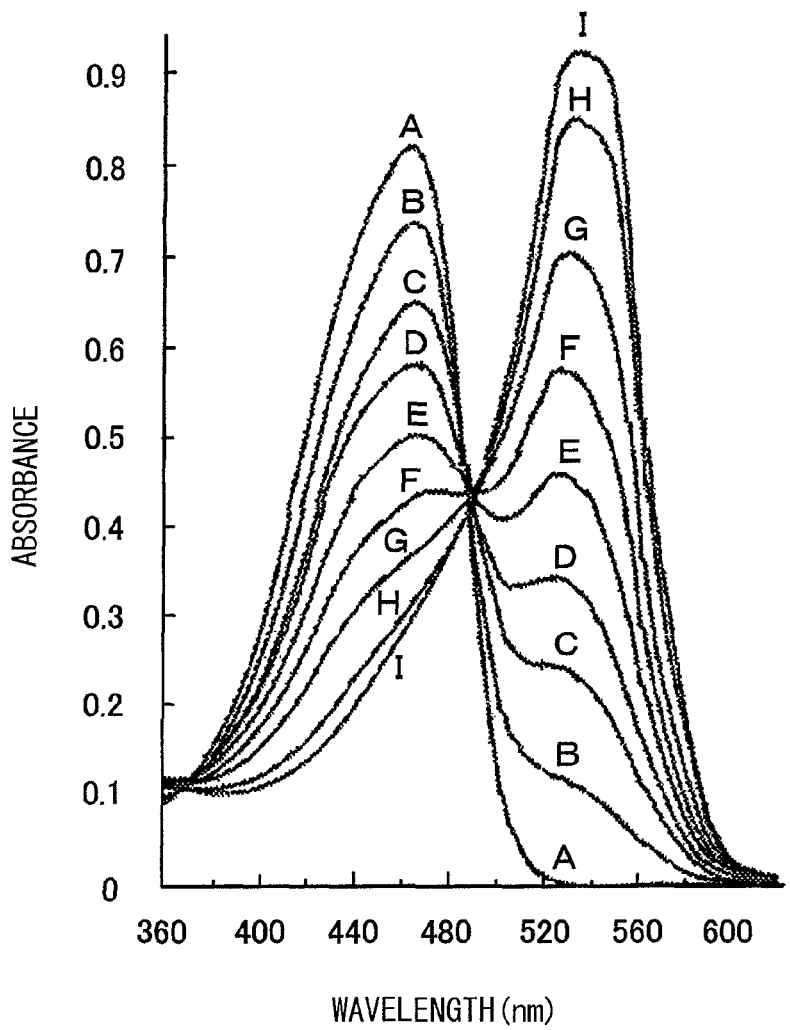
FIG. 41 is a schematic diagram illustrating measurement results of spectral changes of bilirubin in zinc titration.

Bilirubin obtained by opening a protoporphyrin ring at the α-position thereof and adding oxygen atoms is illustrated in FIG. 40. FIG. 41 illustrates spectral changes of bilirubin in zinc titration, where a curve A indicates the spectrum of bilirubin, and a curve I indicates a spectrum after adding two equivalents of zinc (refer to NPTL 9). As indicated by the curve A in FIG. 41, bilirubin has strong absorption at a wavelength of 450 nm. Moreover, as indicated by the curve I, when zinc is coordinated to bilirubin, the absorption maximum wavelength of bilirubin is shifted to 530 nm.

(3) Porphyrin for Red-Light Photoelectric Transducer

An azaporphyrin (refer to NPTL 10) may be used as a porphyrin for red-light photoelectric transducer.

Figure 42:
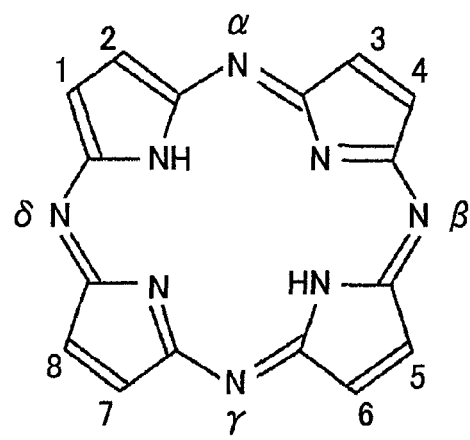
FIG. 42 is a schematic diagram illustrating a tetraazaporphyrin.
Figure 43:
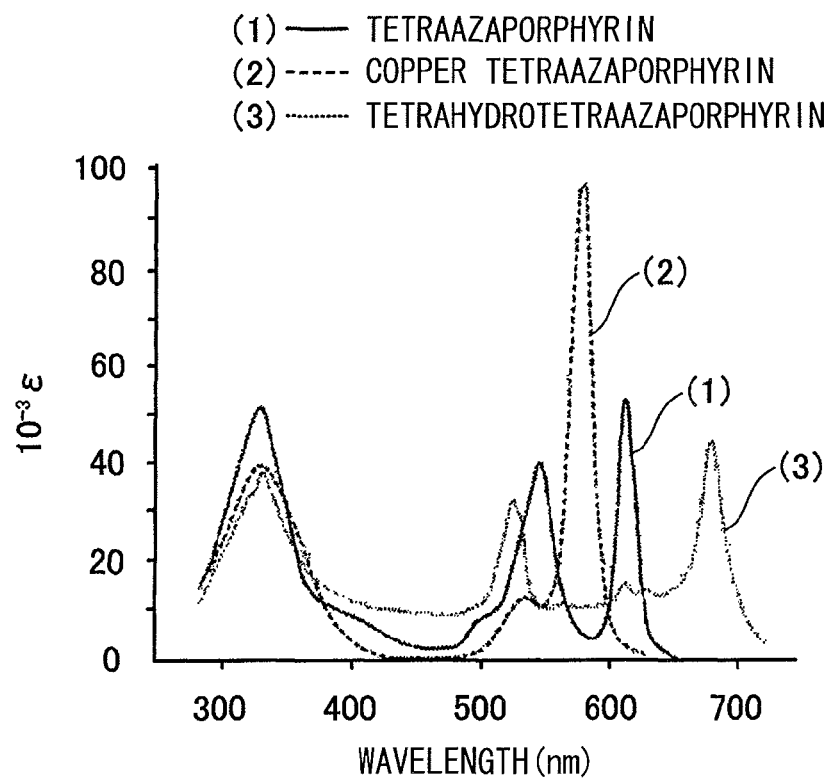
FIG. 43 is a schematic diagram illustrating measurement results of absorption spectra of tetraazaporphyrins.
Figure 44:
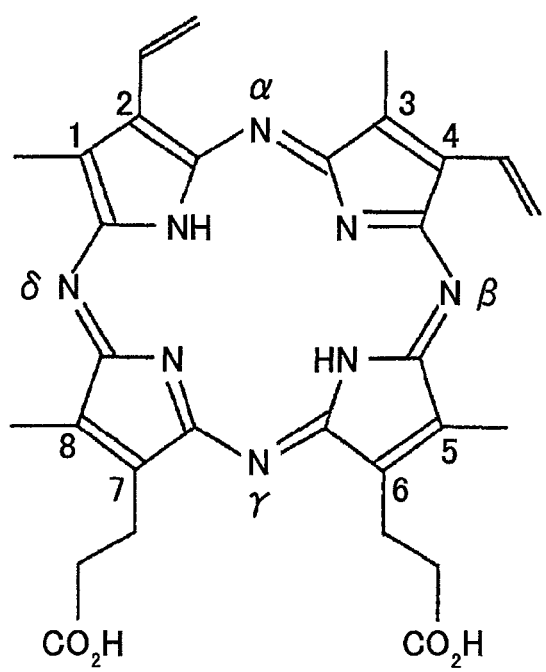
FIG. 44 is a schematic diagram illustrating a tetraazaporphyrin formed by adding vinyl groups to the 2- and 4-positions thereof and adding propionic acid groups to the 6- and 7-positions thereof.
Figure 46:
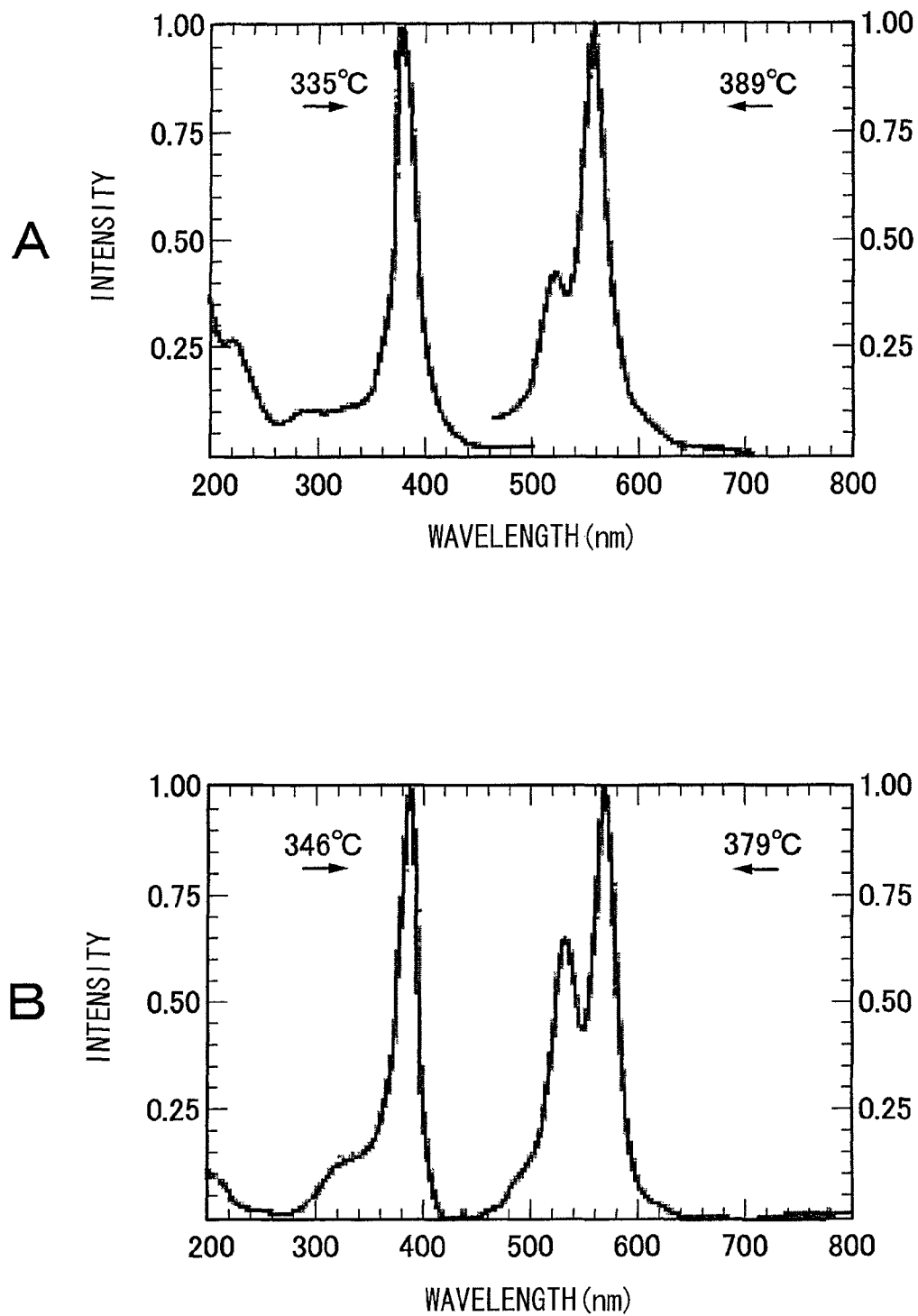
FIG. 46 is a schematic diagram illustrating absorption spectra of nickel octaethylporphyrin and zinc octaethylporphyrin.
Figure 47:
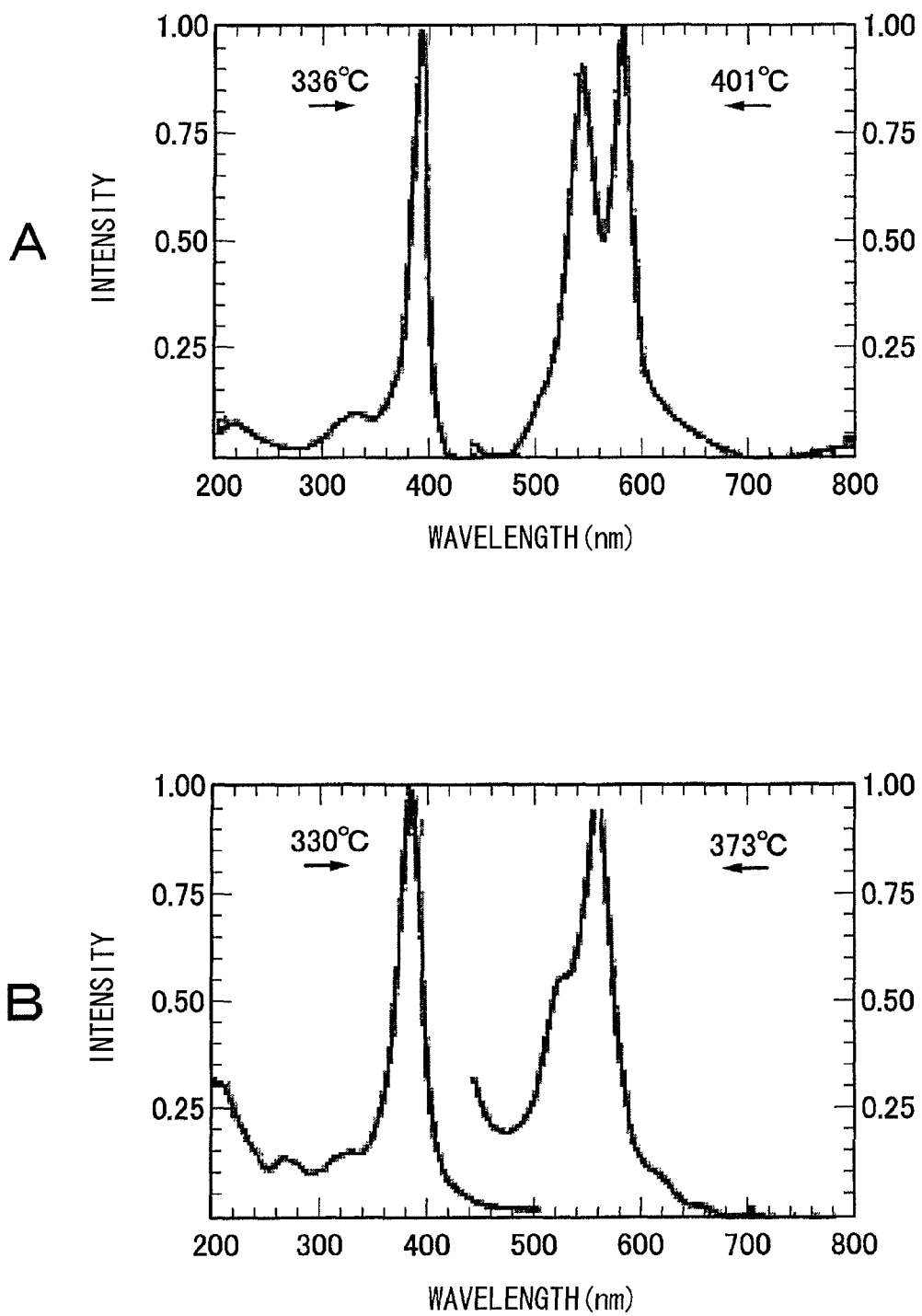
FIG. 47 is a schematic diagram illustrating absorption spectra of magnesium etioporphyrin-I and cobalt octaethylporphyrin.
Figure 48:
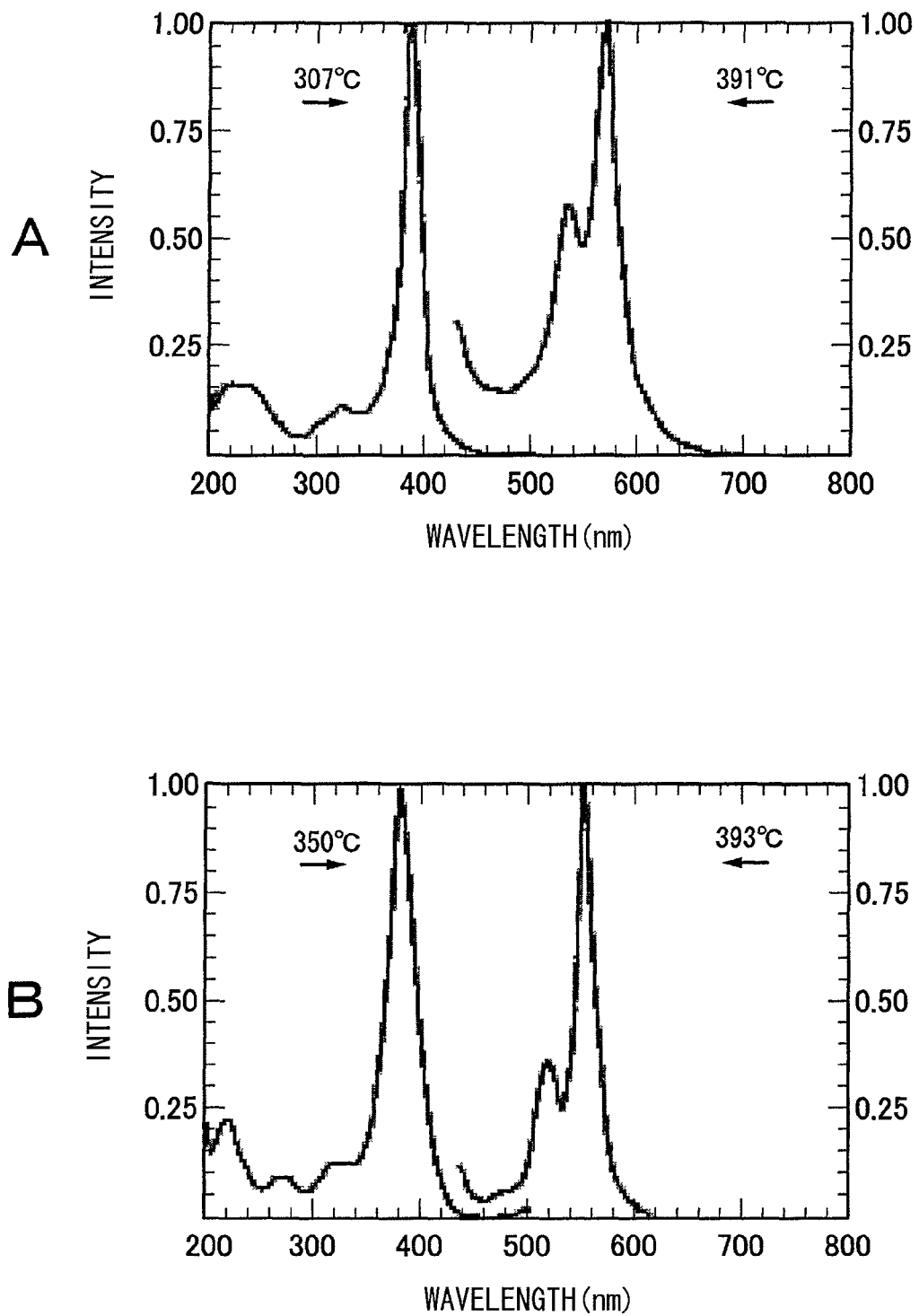
FIG. 48 is a schematic diagram illustrating absorption spectra of copper octaethylporphyrin and palladium octaethylporphyrin.

When nitrogen atoms are substituted for carbon atoms at meso positions (α-, β-, γ- and δ-positions) of a protoporphyrin, the Soret band around 400 nm disappears, and strong absorption is achievable around the Q band. As a practical example, the absorption spectrum of a tetraazaporphyrin (FIG. 42) is illustrated in FIG. 43 (refer to NPTL 11). As illustrated in FIG. 43, in the case where a metal is coordinated to a center of the tetraazaporphyrin, a strong absorption band is achievable around a wavelength of 580 nm. When a tetraazaporphyrin having vinyl groups added to the 2- and 4-positions thereof and propionic acid groups added to the 6- and 7-positions thereof as illustrated in FIG. 44 is synthesized, the tetraazaporphyrin is allowed to be bonded to the cytochrome c552.

[Fine Control of Absorption Wavelength of Porphyrin by Substitution of Central Metal]

In addition to the above-described zinc, other metals exhibiting fluorescence properties by being introduced into a porphyrin are known, and are illustrated in Tables 5 and 6 (refer to NPTL 12).

TABLE 5

| | | | | | Valence Electron |
|---|---|---|---|---|---|
| | Li(I) | Be(II) | | | 2s |
| | Na(I) | Mg(II) | | | 3s |
| | K(I) | Cu(II) | Sc(III) | Ti(IV)O | 4s3d |
| | Rb(I) | Sr(II) | Y(III) | Zr(IV) | Nb(V) | 5s4d |
| | C(I) | Ba(II) | Lu(II) | Hf(IV) | Ta(V) | 6s5d |
| | | | | Th(IV) | | 7s6d5f |

TABLE 6

| | | | | Valence Electron |
|---|---|---|---|---|
| | B(III) | CH$_3$ | | 2s |
| | Al(III) | Si(IV)Cl$_2$ | P(V) | 3s3p |
| Zn(II) | Ca(III) | Ga(VI)Cl$_2$ | As(V)(OH$_2$) | 4s4p |
| Cd(II) | In(III) | Sn(IV)Cl$_2$ | Sb(V)(OH$_2$) | 5s5p |
| Hg(II) | Tl(III) | Pb(IV)X$_2$ | Bi(V) | 6s6p |

Figure 49:
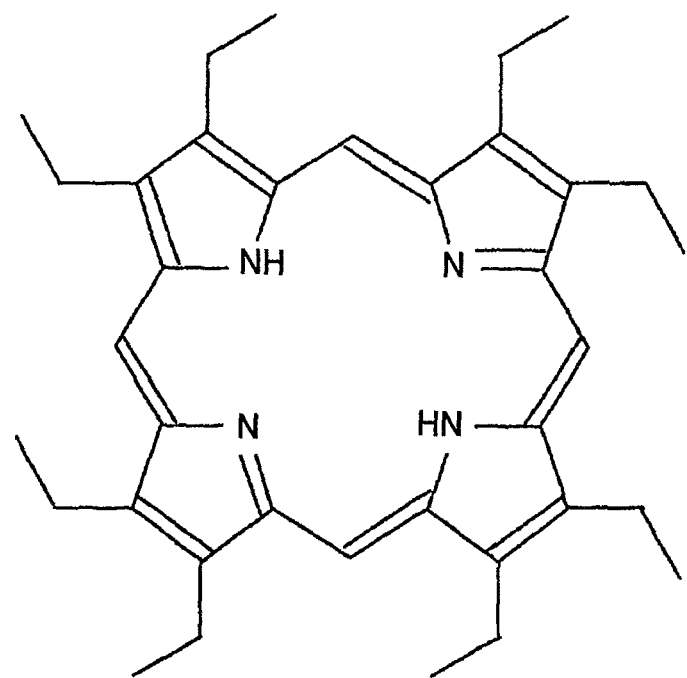
FIG. 49 is a schematic diagram illustrating an octaethylporphyrin.
Figure 50:
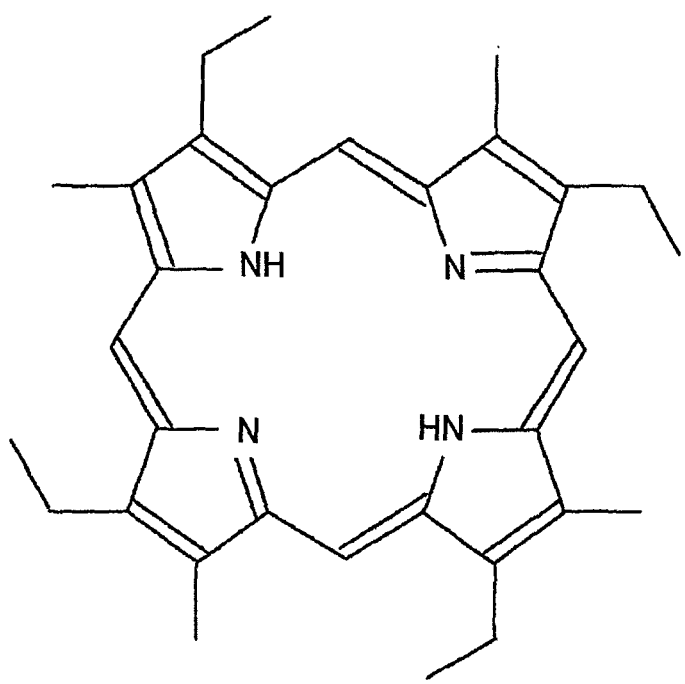
FIG. 50 is a schematic diagram illustrating an etioporphyrin.

FIGS. 45 to 48 illustrate vapor-phase absorption spectra of octaethylporphyrin-metal complexes and etioporphyrin-metal complexes of these metals. FIGS. 49 and 50 illustrate structures of an octaethylporphyrin and an etioporphyrin, respectively. Fluorescence porphyrins having finely adjusted absorption wavelengths as illustrated in FIGS. 45 to 48 are allowed to be prepared by introducing the metals illustrated in Tables 5 and 6 into a protoporphyrin and a modified porphyrin prepared as described above.

[Preparation of Apocytochrome c552]

To reconstitute a modified porphyrin into a cytochrome c552, it is necessary to remove a heme from the cytochrome c552 in advance. The synthesis of a cytochrome c552 having no heme (an apocytochrome c552) will be described herein.

A method of preparing an apocytochrome c with use of a bovine cytochrome c has been reported (refer to NPTL 13). Although a thermophile cytochrome c552 differs in amino acid sequence from the bovine cytochrome c, the reported method is applicable to the synthesis of the apocytochrome c552, because a specific amino acid sequence (-Cys-X—X-Cys-His-) for bonding to the heme is conserved. This method will be described in detail below.

First, 70 to 80 mg of cytochrome c552 powder is dissolved in ultrapure water, and 2 mL of glacial acetic acid and 15 mL of 0.8% silver sulfate are added to a resultant solution. After the solution is incubated under protection from light at 42° C. for 4 hours, the solution is cooled at 0° C. A ten-fold volume of acetone (containing 0.05 N sulfuric acid) is added to the solution at −20° C. to precipitate a protein. The solution is subjected to centrifugal separation to recover a precipitate. The recovered precipitate is dissolved in a small amount of 0.2 M acetic acid and is dialyzed with respect to 0.2 M acetic acid under protection from light at 2 to 4° C. in a nitrogen atmosphere. Although the apocytochrome c552 is a trimer at this time (pH 5.0), the apocytochrome c552 becomes a dimer by adding an 8% sodium cyanide solution to allow the apocytochrome c552 to have a pH of 8.7. Acetic acid is added to the solution to allow the solution to have a pH of 3.5, thereby obtaining a monomeric apocytochrome c552. Sodium cyanide has not only an effect of resolving protein aggregates, but also an effect of cleaving a bond formed between sulfur of cysteine and silver generated by the previous heme removal reaction. As a result, an apocytochrome c552 having a free cysteine SH group is allowed to be prepared. This apocytochrome c552 is stable at pH 3.5 for 1 hour.

[Reconstitution of Apocytochrome c552, Modified Porphyrin and Metal]

A cytochrome c552 modified zinc-porphyrin for green-light or red-light photoelectric transducer is synthesized by bonding the previously prepared modified porphyrin with the apocytochrome c552 prepared as described above and introducing the metals illustrated in Tables 5 and 6 by the following method.

A method of reconstituting a bovine cytochrome c, that is, a method of introducing protoporphyrinogen and iron into a bovine apocytochrome c has been reported. This method is used to synthesize a cytochrome c552 modified zinc-porphyrin.

First, 1 mL of an 8% sodium cyanide solution is added to the apocytochrome c552 prepared as described above (a solvent is 0.2 M acetic acid). This is immediately added to a modified porphyrin solution converted into a reduced form with sodium amalgam in advance. Acetic acid is added to a resultant solution to allow the solution to have a pH of 3.5, and ultrapure water deoxidized in advance is added to the solution to a volume of 45 mL, and the solution is stirred under protection from light for 30 minutes while supplying nitrogen. Formic acid is added to the stirred solution to allow the solution to have a pH of 2.9, and the solution is automatically oxidized at 3° C. for 45 to 60 minutes under irradiation with a daylight lamp. This solution is dialyzed with respect to 0.02 M acetic acid. Thus, a cytochrome c552 modified porphyrin is obtained.

The introduction of a fluorescent metal such as zinc and the following procedures are carried out in the same manner as in Example 1. Namely, a cytochrome c552 modified zinc-porphyrin is obtained by adding powder of an acetate or chloride of the metal to a solution of the above-described cytochrome c552 modified porphyrin to perform protein refolding and purification using a column.

Thus, the cytochrome c552 modified zinc-porphyrin for green-light or red-light photoelectric transducer is allowed to be obtained.

As described above, according to the third embodiment, the cytochrome c552 modified zinc-porphyrin 43 having high stability is immobilized on the chemically stable gold electrode 31 with the self-assembled monolayer 42 in between to allow the hydrophobic portion 43a to face the gold electrode 41. Therefore, the cytochrome c552 modified zinc-porphyrin 43 is allowed to be immobilized on the gold electrode 41 while maintaining its electron transfer properties; therefore, a green-light or red-light photoelectric transducer capable of being stably used for a long time is achievable.

4. Fourth Embodiment

Green-Light or Red-Light Photoelectric Transducer

Figure 51:
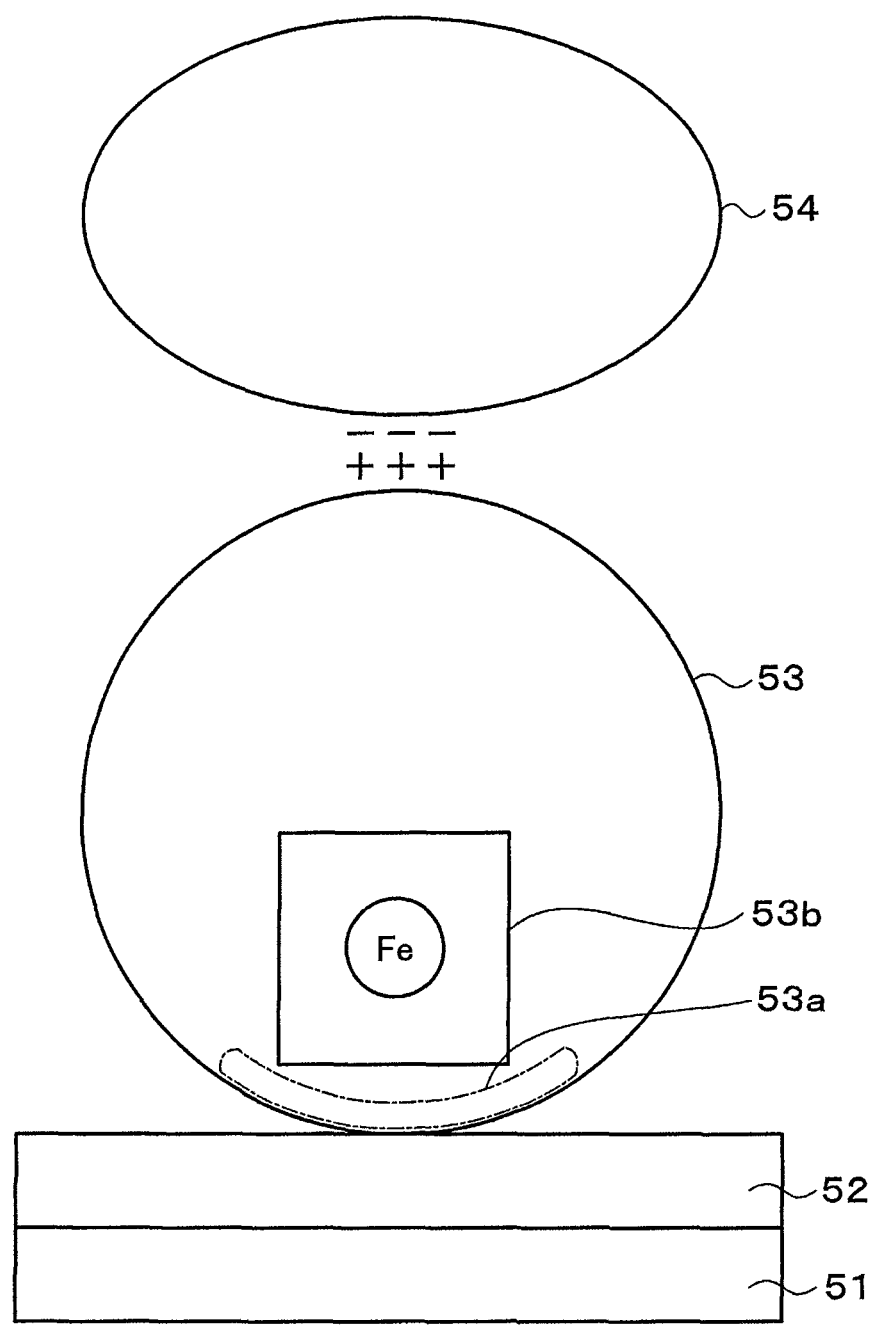
FIG. 51 is a schematic diagram illustrating a green-light or red-light photoelectric transducer according to a fourth embodiment of the invention.

FIG. 51 illustrates a green-light or red-light photoelectric transducer according to a fourth embodiment.

As illustrated in FIG. 51, in the photoelectric transducer, a cytochrome c552 53 is immobilized on a metal substrate 51 with a self-assembled monolayer 52 in between. In this case, the cytochrome c552 53 is immobilized with a hydrophobic portion 53a thereof facing the gold substrate 51. Iron (Fe) as a central metal is coordinated to a heme 53b inside the cytochrome c552 53. The structure, a surface charge distribution diagram and the like of the cytochrome c552 53 are similar to those in the zinc-substituted cytochrome c552 13 used in the first embodiment.

A fluorescent protein 54 absorbing green light or red light is electrostatically bonded to the cytochrome c552 53. In this case, a part on a side opposite to a side facing the gold substrate 51 of the cytochrome c552 53 is positively charged; therefore, this part is electrostatically bonded to a negatively charged part of the fluorescent protein 53. As the fluorescent protein 54, for example, various kinds of commercially available fluorescent proteins (for example, refer to NPTLs 3 to 5) are allowed to be used, and the fluorescent protein 54 is selected from them as necessary.

The self-assembled monolayer 52 is similar to that in the first embodiment.

When externally incident green or red light or light having a green-light component or a red-light component enters the fluorescent protein 54 in the photoelectric transducer, electrons of the fluorescent protein 54 are excited by the incident light. The excited electrons are transferred to the cytochrome c552 53 to be extracted as a photocurrent from the gold substrate 51 to outside. Thus, photoelectric conversion is carried out.

In other points, the fourth embodiment is similar to the first embodiment.

A method of manufacturing the green-light or red-light photoelectric transducer is similar to the method of manufacturing the blue-light photoelectric transducer according to the second embodiment.

According to the fourth embodiment, the cytochrome c552 53 with high stability is immobilized on the chemically stable gold electrode 51 with the self-assembled monolayer 52 in between to allow the hydrophobic portion 53a to face the gold electrode 51. Therefore, the cytochrome c552 53 is allowed to be immobilized on the gold electrode 51 while maintaining its electron transfer properties. Then, when the fluorescent protein 34 absorbing green light or red light, specifically a fluorescent protein with good thermal stability is bonded to the cytochrome c552 53, a green-light or red-light photoelectric transducer capable of being stably used for a long time is achievable.

5. Fifth Embodiment

Color Imaging Element

In a color imaging element according to a fifth embodiment, a red-light photoelectric transducer, a green-light photoelectric transducer and a blue-light photoelectric transducer are used. Any one of red-light, green-light and blue-light photoelectric transducers according to the first to fourth embodiments is used as at least one of these photoelectric transducers. These photoelectric transducer may be formed on one and the same substrate, or the red-light photoelectric transducer, the green-light photoelectric transducer and the blue-light photoelectric transducer may be formed on respective substrates and constitute a color imaging element by arranging these substrates.

Figure 52:
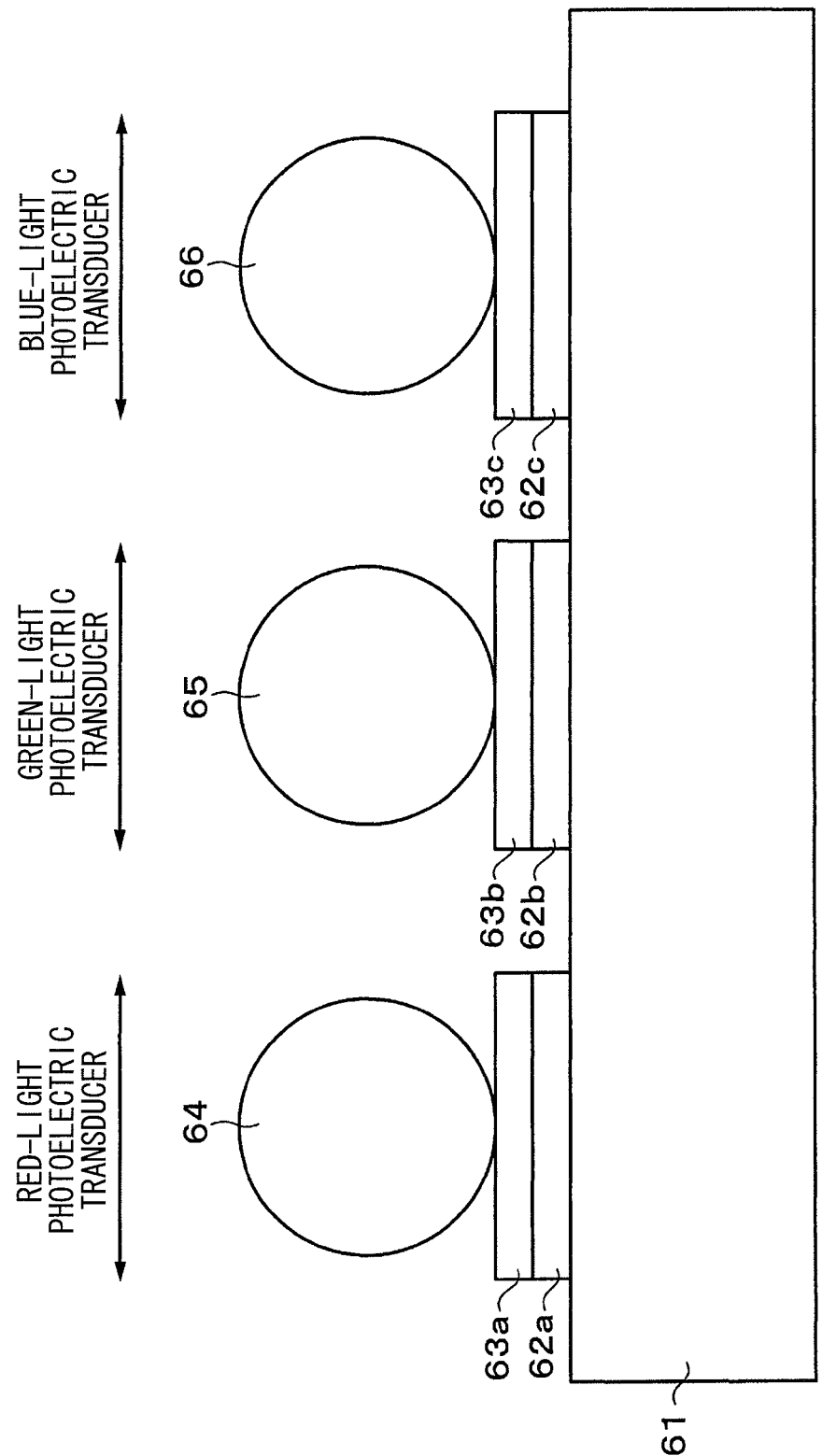
FIG. 52 is a schematic diagram illustrating a first example of a color imaging element according to a fifth embodiment of the invention.

FIG. 52 illustrates an example of the color imaging element, specifically, one pixel region.

As illustrated in FIG. 52, this color imaging element includes gold electrodes 62a, 62b and 62c arranged in regions where red-light, green-light and blue-light photoelectric transducers are formed in one pixel region on a substrate 61. These gold electrodes 62a, 62b and 62c are electrically insulated from one another. As the substrate 61, various substrates may be used, and the substrate 61 may be selected from them as necessary, and, for example, a semiconductor substrate such as a silicon substrate, a transparent substrate such as a glass substrate, or the like is allowed to be used. In particular, when a semiconductor substrate such as a silicon substrate is used as the substrate 61, a signal processing circuit, a drive circuit and the like of the color imaging element are easily formed on the semiconductor substrate by known semiconductor technology in related art. In the case where a conductive substrate is used as the substrate 61, for example, an insulating film such as a $SiO_2$ film may be formed on a surface of the substrate 61, and the gold electrodes 62a, 62b and 62c may be formed thereon.

In a section corresponding to the red-light photoelectric transducer, as in the case of the red-light photoelectric transducer according to the third embodiment, for example, a cytochrome c552 modified zinc-porphyrin 64 absorbing red light is immobilized on the gold electrode 62a with a self-assembled monolayer 63a in between. Moreover, in a section corresponding to the green-light photoelectric transducer, as in the case of the green-light photoelectric transducer according to the third embodiment, for example, a cytochrome c552 modified zinc-porphyrin 65 absorbing green light is immobilized on the gold electrode 62b with a self-assembled monolayer 63b in between. Further, in a section corresponding to the blue-light photoelectric transducer, as in the case of the blue-light photoelectric transducer according to the first embodiment, a zinc-substituted cytochrome c552 66 is immobilized on the gold electrode 62c with a self-assembled monolayer 63c in between.

Figure 53:
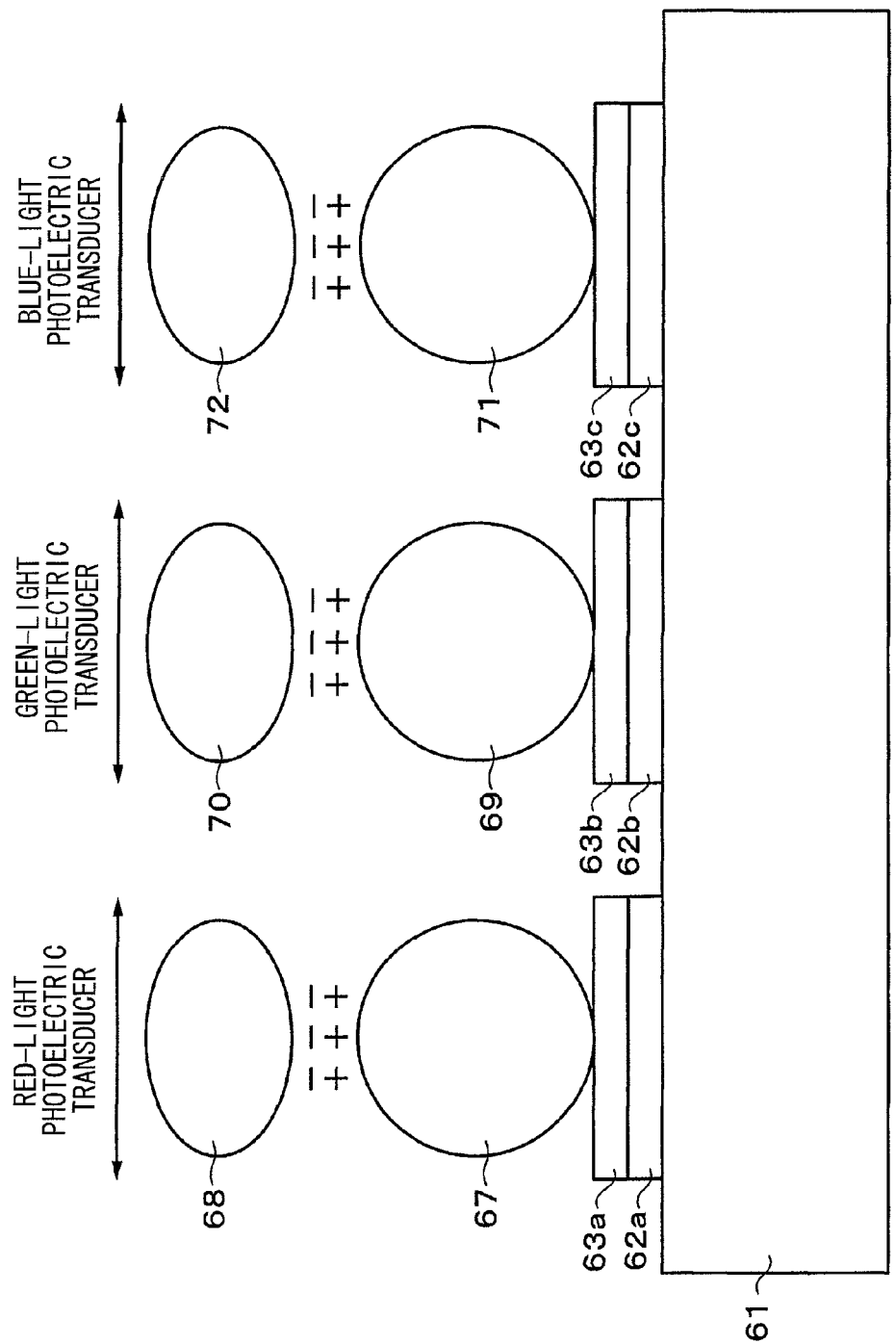
FIG. 53 is a schematic diagram illustrating a second example of the color imaging element according to the fifth embodiment of the invention.

As the red-light, green-light and blue-light photoelectric transducers, the same photoelectric transducers as those according to the second or fourth embodiment may be used. In other words, as illustrated in FIG. 53, in the section corresponding to the red-light photoelectric transducer, a cytochrome c552 67 is immobilized on the gold electrode 62a with the self-assembled monolayer 63a in between, and a fluorescent protein 68 absorbing red light is electrostatically bonded to the cytochrome c552 67. As this fluorescent protein 68, commercially available fluorescent proteins, a cytochrome c552 modified zinc-porphyrin and the like are allowed to be used. Moreover, in the section corresponding to the green-light photoelectric transducer, a cytochrome c552 69 is immobilized on the gold electrode 62b with the self-assembled monolayer 63b in between, and a fluorescent protein 70 absorbing green light is electrostatically bonded to the cytochrome c552 69. As this fluorescent protein 70, for example, commercially available fluorescent proteins, a cytochrome c552 modified zinc-porphyrin and the like are allowed to be used. Further, in the section corresponding to the blue-light photoelectric transducer, a cytochrome c552 71 is immobilized on the gold electrode 62c with the self-assembled monolayer 63c in between, and a fluorescent protein absorbing blue light, for example, a zinc-substituted cytochrome c552 or a commercially available fluorescent protein is electrostatically bonded to the cytochrome c552 71.

As the red-light, green-light and blue-light photoelectric transducers, photoelectric transducers similar to those according to the first to fourth embodiments may be used together.

The arrangement of red-light, green-light, and blue-light photoelectric transducers on the substrate 61 is similar to that in, for example, a known CCD color imaging element or a known MOS color imaging element in related art, and is determined as necessary In other points, the fifth embodiment is similar to the first embodiment.

According to the fifth embodiment, a novel color imaging element which uses a protein and is capable of being stably used for a long time is achievable.

6. Sixth Embodiment

Photosensor

In a photosensor according to a sixth embodiment, a photoelectric transducer which uses a fluorescent protein and has an absorption wavelength corresponding to the wavelength of light to be detected is used. In particular, in the case where this photosensor is a color photosensor, a red-light photoelectric transducer, a green-light photoelectric transducer and a blue-light photoelectric transducer are used. As these photoelectric transducer, in the case where red light, green light or blue light is to be detected, the red-light, green-light or blue-light photoelectric transducer according to the first to fourth embodiments is allowed to be used. Alternatively, in the case where light with a wavelength other than red light, green light or blue light is to be detected, a photoelectric transducer using a cytochrome c552 modified zinc-porphyrin whose absorption wavelength is adjusted to the wavelength is used. These photoelectric transducers may be formed on one and the same substrate, or the photoelectric transducers may be formed on a plurality of substrates, respectively, to constitute a photosensor by arranging these substrates. The arrangement of the photoelectric transducers on the substrate is determined as necessary; however, in the color photosensor, the photoelectric transducers are allowed to be arranged in the same manner as that in, for example, a known CCD color imaging element or a known MOS color imaging element in related art.

In other points, the sixth embodiment is similar to the first embodiment.

According to the sixth embodiment, a novel photosensor which uses a protein and is capable of being stably used for a long time is achievable.

7. Seventh Embodiment

Photosensor

Figure 54:
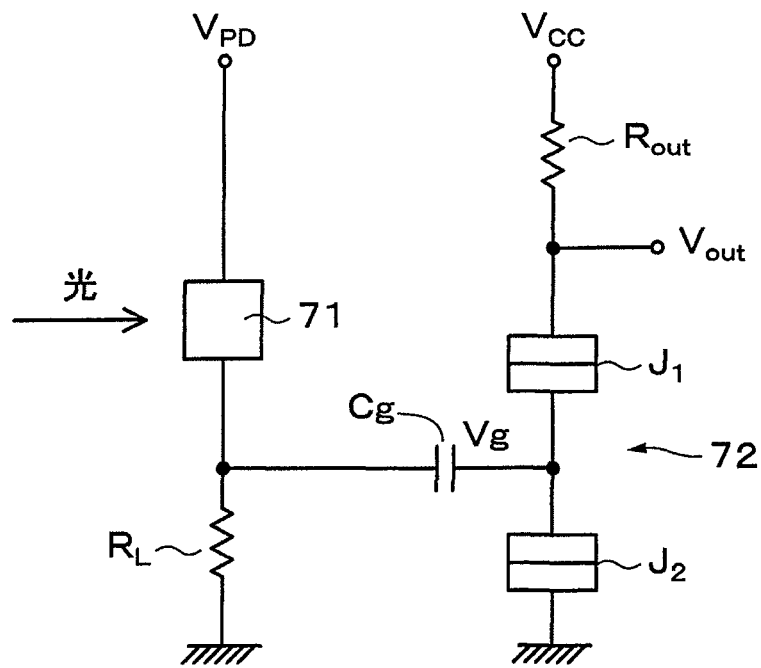
FIG. 54 is a circuit diagram illustrating a photosensor according to a seventh embodiment of the invention.

FIG. 54 is a circuit diagram illustrating a photosensor according to a seventh embodiment.

As illustrated in FIG. 54, this photosensor is configured of a photodiode 71 which is configured of the photoelectric transducer according to one of the first to fourth embodiments and a single-electron transistor 72 for amplifying an output of the photodiode 71. The single-electron transistor 72 is configured of a small tunnel junction $J_1$ on a drain side and a small tunnel junction $J_2$ on a source side. The capacitances of the small tunnel junctions $J_1$ and $J_2$ are represented by $C_1$ and $C_2$, respectively. For example, while one electrode of the photodiode 71 is grounded through a load resistor $R_L$, the other electrode thereof is connected to a positive power supply for supplying a positive voltage $V_{PD}$ for biasing the photodiode 72. On the other hand, while a source of the single-electron transistor 72 is grounded, a drain thereof is connected to a positive power supply for supplying a positive voltage $V_{cc}$ through an output resistor $R_{out}$. Then, the electrode on the load resistor $R_L$ side of the photodiode 71 and a gate of the single-electron transistor 72 are connected to each other through a capacitor $C_g$.

In the photosensor configured as described above, when the photodiode 71 is irradiated with light to allow a photocurrent to flow, a voltage generated across both ends of the load resistor $R_L$ charges the capacitor $C_g$, and a gate voltage $V_g$ is applied to the gate of the single-electron transistor 72 through the capacitor $C_g$. Then, a change $\Delta V_g$ in the gate voltage $V_g$ is measured by measuring a change $\Delta Q = C_g \Delta V_g$ in the amount of charge accumulated in the capacitor $C_g$. In this case, the single-electron transistor 72 used for amplifying the output of the photodiode 71 is allowed to measure the change $\Delta Q = C_g \Delta V_g$ in the amount of charge accumulated in the capacitor Cg with, for example, a million times as high sensitivity as that of a transistor in related art. In other words, as the single-electron transistor 72 is allowed to measure a slight change $\Delta V_g$ in the gate voltage $V_g$, the value of the load resistor $R_L$ is allowed to be reduced. Therefore, much higher sensitivity and much higher speed of the photosensor are achievable. Moreover, thermal noise is suppressed on the single-electron transistor 72 side by a charging effect; therefore, noise generated on an amplifier circuit side is allowed to be suppressed. In addition, the single-electron transistor 72 has extremely low power consumption, because the single-electron transistor 72 uses a single-electron tunneling effect in its basic operation.

In this photosensor, as described above, the photodiode 71 and the single-electron transistor 72 are capacitively coupled. As a voltage gain at this time is given by $C_g/C_1$, an output voltage $V_{out}$ high enough to drive an element connected to a subsequent stage of the photosensor is allowed to be easily obtained by reducing the capacitance $C_1$ of the small tunnel junction J1 to a sufficiently low value.

Next, a specific configuration example of the photosensor will be described below.

In this example, the single-electron transistor 72 is configured by a metal-insulator junction, and the photodiode 71 is configured of the photoelectric transducer according to one of the first to fourth embodiments.

Figure 55:
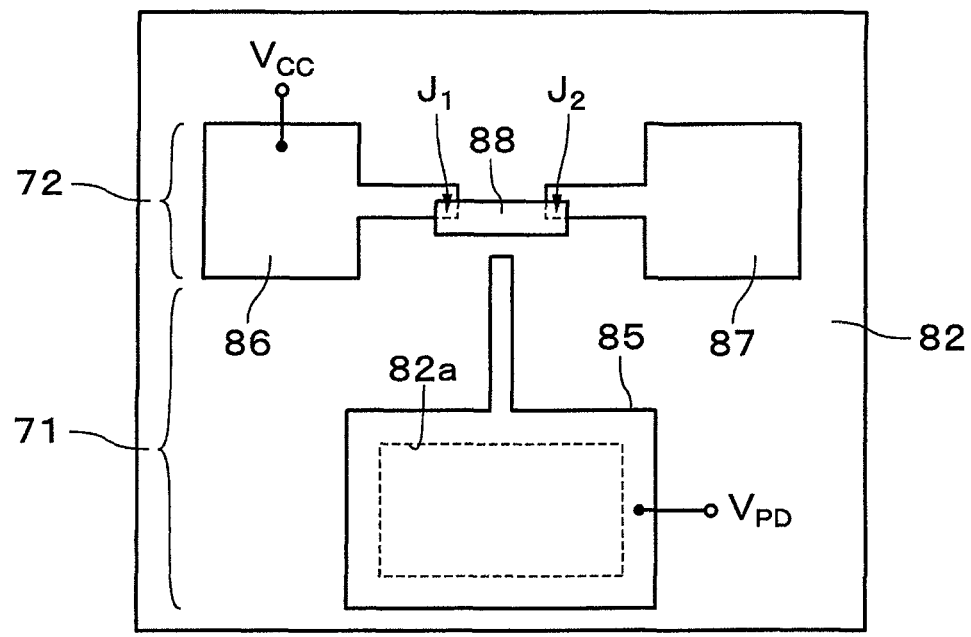
FIG. 55 is a plan view illustrating a configuration example of the photosensor according to the seventh embodiment of the invention.
Figure 56:
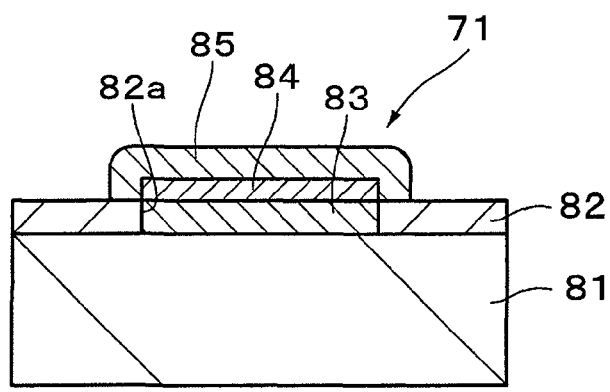
FIG. 56 is a sectional view illustrating a configuration example of the photosensor according to the seventh embodiment of the invention.

FIG. 55 is a plan view of the photosensor. FIG. 56 is a sectional view of the photodiode 71 in the photosensor, and FIG. 57 is a sectional view of the single-electron transistor 72 in the photosensor.

Figure 57:
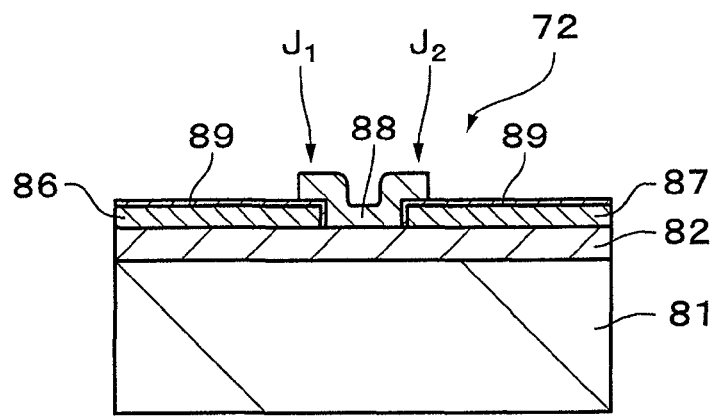
FIG. 57 is a sectional view illustrating a configuration example of the photosensor according to the seventh embodiment of the invention.

As illustrated in FIGS. 55, 56 and 57, in this photosensor, an insulating film 82 such as an $SiO_2$ film, an SiN film or a polyimide film is arranged on a substrate 81 such as a semiconductor substrate. In a portion corresponding to the photodiode 71 of the insulating film 82, an opening 82a is provided. Then, a gold electrode 83 is arranged on the substrate 81 in the opening 82a, and a fluorescent protein 84 having an absorption wavelength corresponding to the wavelength of light to be detected is immobilized on the gold electrode 83, and a counter electrode 85 is arranged thereon with a solid electrolyte (not illustrated) in between. In this case, light passes through the counter electrode 85 to be received; therefore, the counter electrode 85 is transparent to light used for photoexcitation of the fluorescent protein 84. As the fluorescent protein 84, for example, fluorescent proteins similar to those used in the photoelectric transducers according to the first to fourth embodiments are allowed to be used.

On the other hand, a source electrode 86 and a drain electrode 87 are arranged in a portion corresponding to the single-electron transistor 72 of the insulating film 82 to face each other. Then, a gate electrode 88 is formed to partially overlap an end of the source electrode 86 and an end of the drain electrode 87. In this case, insulating films 89 with a thickness of, for example, several tenths of a nanometer to several nanometers are formed on surfaces of at least portions overlapping the gate electrode 88 of the source electrode 86 and the drain electrode 87. Thus, the gate electrode 88 partially overlaps the ends of the source electrode 86 and the drain electrode 87 with the insulating films 89 in between. The overlapping portions typically have a size of several hundreds of nanometers by several hundreds of nanometers, or less. In this case, the portions where the gate electrode 88 overlaps the source electrode 86 with the insulating films 89 in between correspond to the small tunnel junction $J_1$ and $J_2$, respectively in FIGS. 54 and 55. The gate electrode 88, the source electrode 86, and the drain electrode 87 are formed of, for example, a metal such as Al, In, Nb, Au or Pt. A passivation film (not illustrated) is optionally arranged on an entire surface to cover the photodiode 71 and the single-electron transistor 72 therewith.

In this case, an end of the counter electrode 85 of the photodiode 71 is adjacent to the gate electrode 88 of the single-electron transistor 72. Then, in the case where no passivation film is provided, a capacitor is formed between the end of the counter electrode 85 and the gate electrode 88 with an air layer in between, thereby capacitively coupling the counter electrode 85 and the gate electrode 88. In the case where a passivation film is provided, a capacitor is formed between the end of the counter electrode 85 and the gate electrode 88 with the passivation film in between, thereby capacitively coupling the counter electrode 85 and the gate electrode 88.

Thus, according to the seventh embodiment, a novel photosensor which uses a protein and is capable of being stably used for a long time is achievable. Moreover, this photosensor is configured to amplify the output of the photodiode 71 by the single-electron transistor 72. Therefore, the photosensor is allowed to have much higher speed, higher sensitivity and lower power consumption than a typical photosensor in related art which amplifies the output of the photodiode by a typical transistor in related art.

8. Eighth Embodiment

Color CCD Imaging Element

Next, a color CCD imaging element according to an eighth embodiment will be described below. This color CCD imaging element is an interline-transfer type CCD imaging element including a light-sensitive section, a vertical register, and a horizontal register.

Figure 58:
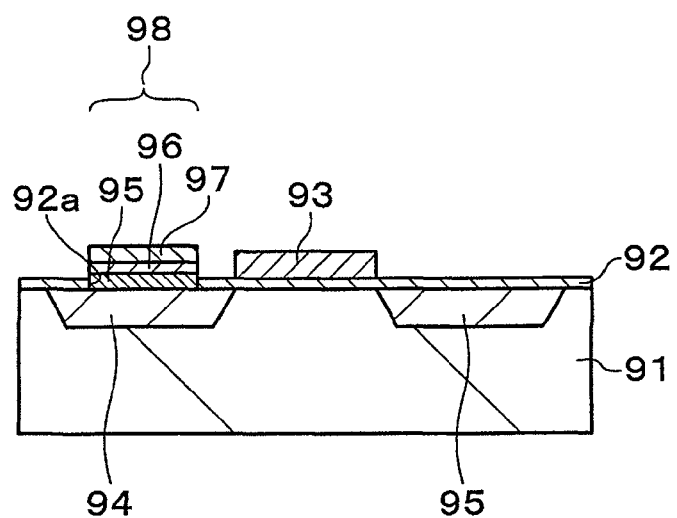
FIG. 58 is a sectional view illustrating a color CCD imaging element according to an eighth embodiment of the invention.

FIG. 58 illustrates a sectional structure of the light-sensitive section and the vertical register in proximity to the light-sensitive section of the color CCD imaging element. As illustrated in FIG. 58, a gate-insulating film 92 is formed on a p-type silicon substrate 91 (or on a p-well layer formed on an n-type silicon substrate), and a read-out gate electrode 93 is formed on the gate-insulating film 92. An n-type layer 94 and an n-type layer 95 constituting the vertical register are formed in the p-type silicon substrate 91 on both sides of the read-out gate electrode 93. An opening 92a is formed in the gate-insulating film 92 above the n-type layer 94. Then, a gold electrode 95 is arranged on the n-type layer 94 in the opening 92a, and a fluorescent protein 96 similar to that used in the photoelectric transducer according to any one of the first to fourth embodiments is immobilized on the gold electrode 95, and a counter electrode 97 is arranged thereon with a solid electrolyte (not illustrated) in between. The photoelectric transducer constitutes a light-sensitive section 98. In this case, as light passes through the counter electrode 97 to be received, the counter electrode 97 is transparent to light used for photoexcitation of the electron transfer protein 96. The other configuration of the color CCD imaging element (including the arrangement of red, green, and blue light-sensitive elements 98) is similar to that of a known interline-transfer type color CCD imaging element in related art.

In the color CCD imaging element, the gold electrode 95 of the photoelectric transducer constituting the light-sensitive element 98 is positively biased relative to the counter electrode 97. When light enters the fluorescent protein 96 in the light-sensitive element 98, electrons generated by photoexcitation flow into the n-type layer 94. Next, in a state where a voltage higher than that of the n-type layer 94 is applied to the n-type layer 95 constituting the vertical register, a positive voltage is applied to the read-out gate electrode 93 to form an n-type channel in the p-type silicon substrate 91 directly under the read-out gate electrode 93, and electrons of the n-type layer 94 are read to the n-type layer 95 through the n-type channel. After that, a charge read out in such a manner is transferred through the vertical register and then through the horizontal register, thereby extracting an electrical signal corresponding to an image picked up from an output terminal.

According to the eighth embodiment, a novel color CCD imaging element which uses the fluorescent protein 96 for the light-sensitive section 98 and is capable of being stably used for a long time is achievable.

9. Ninth Embodiment

Inverter Circuit

Next, an inverter circuit according to a ninth embodiment of the invention will be described below.

Figure 59:
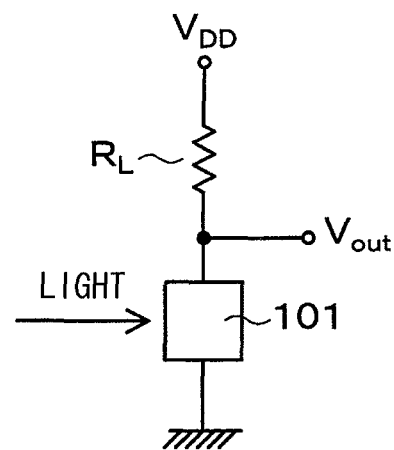
FIG. 59 is a circuit diagram illustrating an inverter circuit according to a ninth embodiment of the invention.

FIG. 59 illustrates the inverter circuit. As illustrated in FIG. 59, in this inverter circuit, a photoelectric transducer 101 with the same configuration as that of one of the first to fourth embodiments and a load resistor $R_L$ are connected to each other in series. In this case, the load resistor $R_L$ is connected to a counter electrode (not illustrated) of the photoelectric transducer 101. A predetermined positive power supply voltage VDD is applied to an end of the load resistor $R_L$, and a gold electrode of the photoelectric transducer 101 is grounded. When a fluorescent protein (not illustrated) of the photoelectric transducer 101 is irradiated with light having an absorption wavelength of the fluorescent protein as signal light, the photoelectric transducer 101 is turned on to allow a photocurrent to flow therethrough, thereby setting an output voltage $V_{out}$ from the gold electrode (not illustrated) to a low level, and when irradiation with the light stops, the photoelectric transducer 101 is turned off to allow the photocurrent not to flow therethrough, thereby setting the output voltage $V_{out}$ from the gold electrode to a high level.

Figure 60:
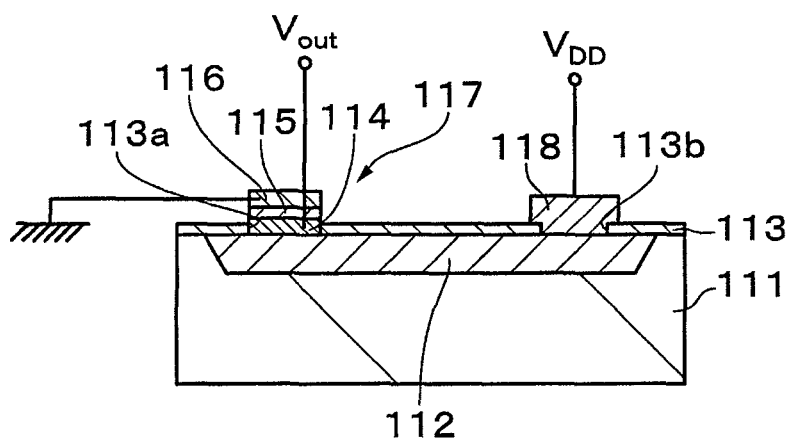
FIG. 60 is a circuit diagram illustrating a configuration example of the inverter circuit according to the ninth embodiment of the invention.

FIG. 60 illustrates a configuration example of the inverter circuit. As illustrated in FIG. 60, in this configuration example, an n-type layer 112 used as the load resistor $R_L$ is formed in a p-type silicon substrate 111 (or in a p-well layer formed in an n-type silicon substrate). An insulating film 113 such as a $SiO_2$ film is formed on a surface of the p-type silicon substrate 111. Openings 113a and 113b are formed in the insulating film 113 at one end and the other end of the n-type layer 112. A gold electrode 114 is arranged on the n-type layer 112 in the opening 113a, and a fluorescent protein 115 similar to that used in the photoelectric transducer according to any one of the first to fourth embodiments is immobilized on the gold electrode 114, and a counter electrode 115 is arranged thereon with a solid electrolyte (not illustrated) in between. The gold electrode 114, the fluorescent protein 115, the solid electrolyte and the counter electrode 116 constitute a photoelectric transducer 117. The electrode 118 is in ohmic contact with the n-type layer 112 through the opening 113b. In addition to the above-described inverter circuit, various electronic circuits (such as an amplifier circuit) driven by the output voltage $V_{out}$ are allowed to be optionally formed on the p-type silicon substrate 111.

According to the ninth embodiment, a novel inverter circuit which uses a protein and is capable of being stably used for a long time is allowed to be configured, and various circuits such as logic circuits are allowed to be configured with use of the inverter circuit.

10. Tenth Embodiment

Photosensor

Figure 61:
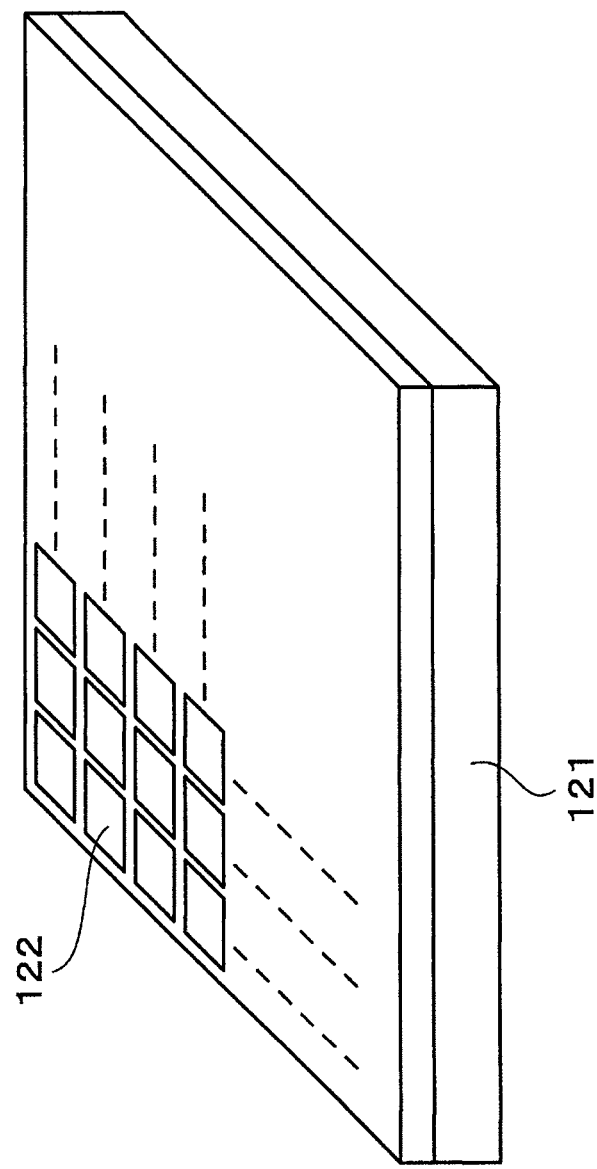
FIG. 61 is a schematic diagram illustrating a photosensor according to a tenth embodiment of the invention.

FIG. 61 illustrates a photosensor according to a tenth embodiment of the invention.

As illustrated in FIG. 61, this photosensor includes light-sensitive sections 122, which are configured of photoelectric transducers similar to those according to the first to fourth embodiments, arranged on a silicon substrate 121 in a two-dimensional matrix form. The silicon substrate 121 is an integrated circuit including circuits necessary for photosensor, such as a signal-processing circuit and a drive circuit.

Figure 62:
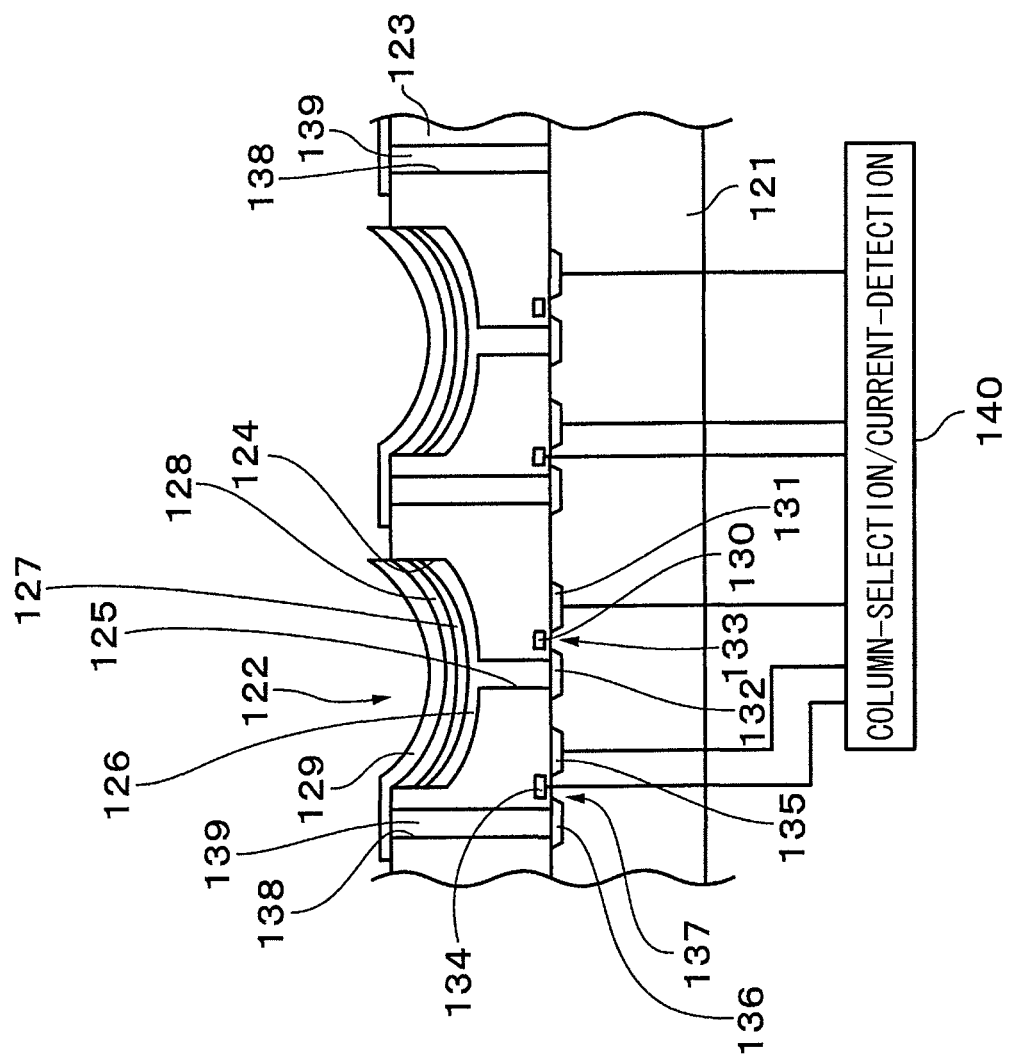
FIG. 62 FIG. 62 is a sectional view illustrating the photosensor according to the tenth embodiment of the invention.

FIG. 62 illustrates a specific configuration of each light-sensitive element 122. As illustrated in FIG. 62, an insulating film 123 such as a $SiO_2$ film is formed on, for example, a p-type silicon substrate 121. A recess 124 having a predetermined planar shape, for example, a square planar shape is formed on a top of the insulating film 123. A contact hole 125 having a predetermined planar shape, for example, a circular planar shape is formed in a center portion of the recess 124. A gold electrode 126 is formed on a bottom surface of the recess 124. The gold electrode 126 is also formed in the contact hole 125. A fluorescent protein 127 used in the photoelectric transducer according to any one of the first to fourth embodiments is immobilized on the gold electrode 126 with a self-assembled monolayer (not illustrated) in between. A solid electrolyte layer 128 is arranged on the fluorescent protein 127. Then, a counter electrode 129 is arranged on the solid electrolyte layer 128. The gold electrode 126, the fluorescent protein 127, the solid electrolyte layer 128 and the counter electrode 129 constitute a photoelectric transducer. The photoelectric transducer constitutes the light-sensitive section 122.

An n-channel MOSFET 133 configured of a gate electrode 130 formed with a gate-insulating film in between, an n-type source region 131, and an n-type drain region 132 is formed on the p-type silicon substrate 121. The gold electrode 126 is in contact with the drain region 132 of the n-channel MOSFET 133 through the contact hole 125. Moreover, an n-channel MOSFET 137 configured of a gate electrode 134 formed with the gate-insulating film therebetween, an n-type source region 135 and an n-type drain region 136 is formed on the p-type silicon substrate 121. An end of a counter electrode 129 extends to the top of the insulating film 123 outside the recess 124, and the extending portion of the counter electrode 129 is in contact with the drain region 136 of the n-channel MOSFET 137 through a metal 139 embedded in a contact hole 138 formed in the insulating film 123. The source region 131 of the n-channel MOSFET 133 and the gate electrode 134 and the source region 135 of the n-channel MOSFET 137 are connected to a column-selection/current-detection circuit 140.

Figure 63:
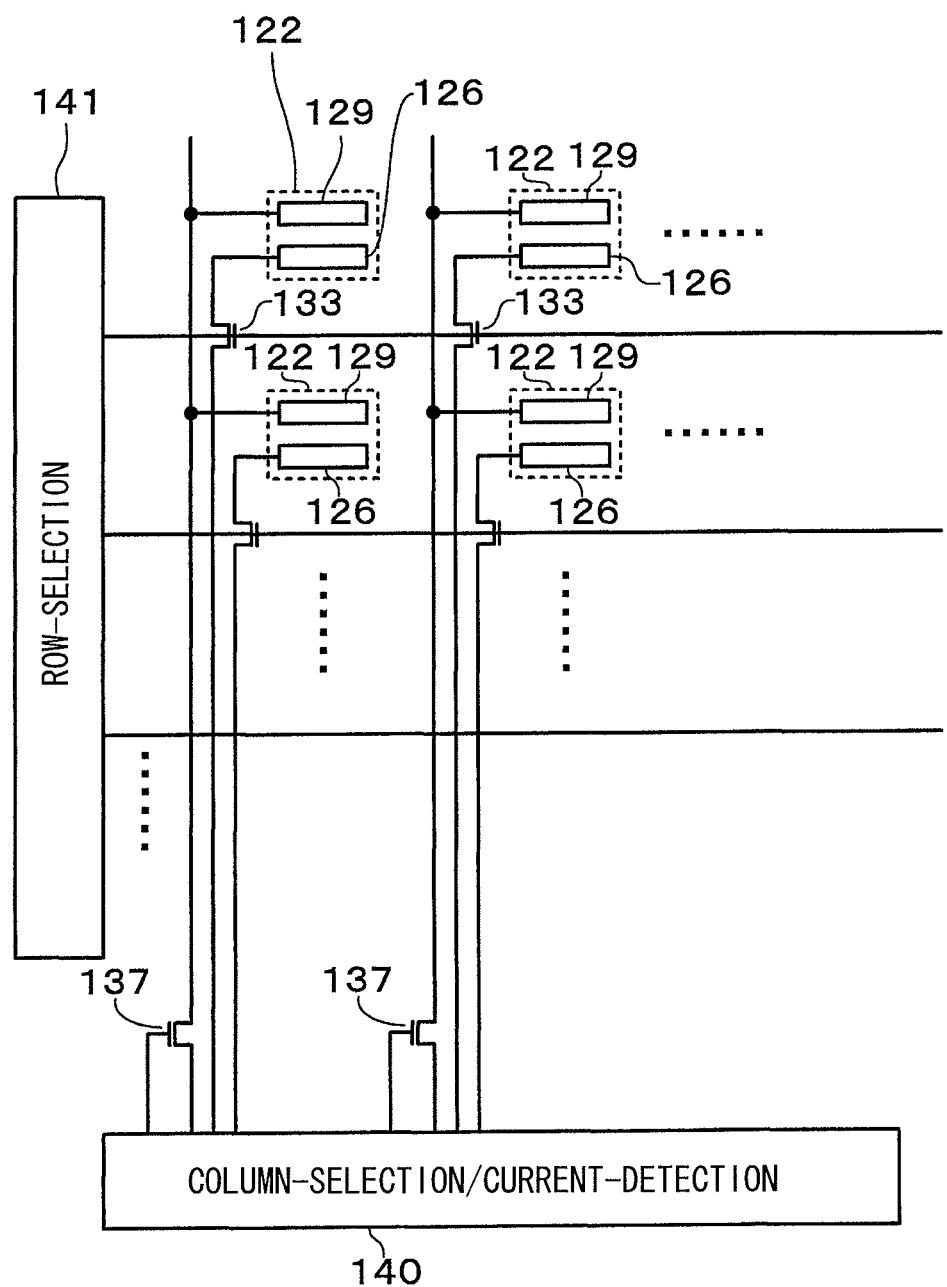
FIG. 63 is a circuit diagram illustrating the photosensor according to the tenth embodiment of the invention.

FIG. 63 illustrates an example of a circuit configuration of the photosensor. As illustrated in FIG. 63, a row-selection circuit 141 and the column-selection/current-detection circuit 140 select the light-sensitive elements 122 arranged on the silicon substrate 121 in a two-dimensional matrix form and detect a photocurrent obtained from the light-sensitive elements 122. The row-selection circuit 141 and the column-selection/current-detection circuit 140 are allowed to be configured in the same manner as that of a known semiconductor memory in related.

According to the tenth embodiment, a novel photosensor which uses a fluorescent protein for the light-sensitive section 122 and is capable of being stably used for a long time is achievable.

Although the embodiments of the present invention have been specifically described above, the invention is not limited thereto and may be variously modified based on the technical ideas of the invention.

For example, the values, structures, configurations, shapes, materials and the like used in the above-described embodiments are merely illustrative, and different values, structures, configurations, shapes, materials and the like may be used as necessary.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A color imaging element comprising:
   a blue-light photoelectric transducer using a zinc-substituted cytochrome c552, a derivative thereof or a variant thereof; and
   a red-light or green-light photoelectric transducer using a cytochrome c552 modified zinc-porphyrin which is immobilized on an electrode.

2. The color imaging element of claim 1, wherein the zinc-substituted cytochrome c552, the derivative thereof or the variant thereof is immobilized on an electrode.

3. The color imaging element of claim 2, wherein the electrode is a gold electrode.

4. The color imaging element of claim 3, wherein the zinc-substituted cytochrome c552, the derivative thereof or the variant thereof is immobilized with a hydrophobic portion thereof facing the gold electrode.

5. A method of manufacturing a color imaging element comprising:
   immobilizing a cytochrome c552 modified zinc-porphyrin on an electrode.

6. A red-light or green-light photoelectric transducer using a cytochrome c552 modified zinc-porphyrin which is immobilized on an electrode.

7. A method of manufacturing a red-light or green-light photoelectric transducer comprising:
   immobilizing a cytochrome c552 modified zinc-porphyrin on an electrode.

* * * * *